US012672317B2

(12) United States Patent
Lee et al.

(10) Patent No.: US 12,672,317 B2
(45) Date of Patent: Jun. 30, 2026

(54) MOSFET SEMICONDUCTOR DEVICE AND METHOD OF MANUFACTURING THE SAME

(71) Applicant: SAMSUNG ELECTRONICS CO., LTD., Suwon-si (KR)

(72) Inventors: Doohyun Lee, Suwon-si (KR); Heonjong Shin, Suwon-si (KR); Seon-Bae Kim, Suwon-si (KR); Jaeran Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 550 days.

(21) Appl. No.: 18/112,312

(22) Filed: Feb. 21, 2023

(65) Prior Publication Data

US 2024/0030345 A1 Jan. 25, 2024

(30) Foreign Application Priority Data

Jul. 20, 2022 (KR) ........................ 10-2022-0089277

(51) Int. Cl.
| | |
|---|---|
| *H10D 30/69* | (2025.01) |
| *H10D 62/13* | (2025.01) |
| *H10D 64/01* | (2025.01) |

(52) U.S. Cl.
CPC ......... *H10D 30/701* (2025.01); *H10D 62/151* (2025.01); *H10D 64/017* (2025.01); *H10D 64/021* (2025.01)

(58) Field of Classification Search
CPC .. H10D 30/701; H10D 64/017; H10D 64/021; H10D 62/151

USPC .......................................................... 257/288
See application file for complete search history.

(56) References Cited

U.S. PATENT DOCUMENTS

| | | | | |
|---|---|---|---|---|
| 9,673,210 | B1 * | 6/2017 | Thees .................. | H10D 64/017 |
| 10,423,078 | B1 | 9/2019 | Shen et al. | |
| 10,943,643 | B2 | 3/2021 | Sato et al. | |
| 11,121,036 | B2 | 9/2021 | Ching et al. | |
| 2014/0131786 | A1 * | 5/2014 | Ryu ..................... | H10B 12/053 257/316 |
| 2020/0035705 | A1 * | 1/2020 | Kim ..................... | H10D 64/017 |
| 2020/0227421 | A1 * | 7/2020 | Jeong .................... | H10B 10/12 |

(Continued)

FOREIGN PATENT DOCUMENTS

KR 10-1069436 B1 9/2011

*Primary Examiner* — Eliseo Ramos Feliciano
*Assistant Examiner* — Timothy Edward Duren
(74) *Attorney, Agent, or Firm* — Sughrue Mion, PLLC

(57) ABSTRACT

In some embodiments, the semiconductor device includes a substrate comprising a cell region, a dummy region spaced apart from the cell region in a first direction, and a border region between the cell region and the dummy region, an active pattern on the cell region, a device isolation layer on the substrate, source/drain patterns on the active pattern and channel patterns between the source/drain patterns, cell gate electrodes crossing the channel patterns in a second direction, active contacts disposed on the cell region and between the cell gate electrodes and coupled to the source/drain patterns, dummy gate electrodes on the dummy region and on the device isolation layer, dummy contacts on the dummy region and on a side surface of each of the dummy gate electrodes, an interlayer insulating layer on the side surface of each of the dummy gate electrodes, and a dam structure on the border region.

20 Claims, 54 Drawing Sheets

(56) References Cited

U.S. PATENT DOCUMENTS

| | | | |
|---|---|---|---|
| 2020/0350307 A1 | 11/2020 | Chen et al. | |
| 2020/0411507 A1* | 12/2020 | An | H10B 99/22 |
| 2021/0183859 A1* | 6/2021 | Jeong | H10D 30/6757 |
| 2021/0202527 A1 | 7/2021 | Kim et al. | |
| 2021/0242317 A1 | 8/2021 | Gu et al. | |
| 2021/0280571 A1 | 9/2021 | Lim et al. | |
| 2021/0384192 A1* | 12/2021 | Bae | H10D 30/6735 |

* cited by examiner

OLI

100

F

F'

NCPP

MOSFET SEMICONDUCTOR DEVICE AND METHOD OF MANUFACTURING THE SAME

CROSS-REFERENCE TO RELATED APPLICATIONS

This application claims benefit of priority under 35 U.S.C. § 119 to Korean Patent Application No. 10-2022-0089277, filed on Jul. 20, 2022, in the Korean Intellectual Property Office, the disclosure of which is incorporated by reference herein in its entirety.

BACKGROUND

1. Field

The present disclosure generally relates to a semiconductor device and a method of fabricating the same, and in particular, to a semiconductor device including a field effect transistor and a method of fabricating the same.

2. Description of Related Art

A related semiconductor device may include an integrated circuit consisting of metal-oxide-semiconductor field-effect transistors (MOSFETs). To meet an increasing demand for a semiconductor device with a small pattern size and a reduced design rule, the MOSFETs may be scaled down. The scale-down of the MOSFETs may lead to deterioration in operational properties of the semiconductor device. A variety of studies have been conducted to overcome technical limitations associated with the scale-down of the semiconductor device and to realize high performance semiconductor devices.

That is, there exists a need for further improvements in semiconductor devices, as the need for small pattern size and a reduced design rule, may be constrained by deterioration in operational properties of the semiconductor device.

SUMMARY

An embodiment of the present disclosure provides a semiconductor device with improved electric and reliability characteristics.

An embodiment of the present disclosure provides a method of fabricating a semiconductor device with improved electric and reliability characteristics.

According to an aspect of the present disclosure, a semiconductor device is provided. The semiconductor device includes a substrate including a cell region, a dummy region spaced apart from the cell region in a first direction, and a border region between the cell region and the dummy region. The semiconductor device further includes an active pattern on the cell region of the substrate, a device isolation layer on the substrate to define the active pattern. The device isolation layer extends in the first direction. The semiconductor device further includes source/drain patterns on the active pattern and channel patterns between the source/drain patterns. Each of the channel patterns includes semiconductor patterns. Each of the semiconductor patterns are stacked to be spaced apart from each other. The semiconductor device further includes cell gate electrodes crossing the channel patterns in a second direction. The second direction intersects the first direction. The semiconductor device further includes active contacts disposed on the cell region and between the cell gate electrodes and coupled to the source/drain patterns. The semiconductor device further includes dummy gate electrodes on the dummy region and on the device isolation layer. The semiconductor device further includes dummy contacts on the dummy region and on a side surface of each of the dummy gate electrodes. The semiconductor device further includes an interlayer insulating layer on the side surface of each of the dummy gate electrodes. The semiconductor device further includes a dam structure on the border region of the substrate. The dam structure is inserted in the interlayer insulating layer. The dam structure extends in the second direction.

According to an aspect of the present disclosure, a semiconductor device is provided. The semiconductor device includes a substrate including a cell region, a border region, and a dummy region, which are sequentially provided in a first direction. The semiconductor device further includes a device isolation layer on the substrate that extends in the first direction. The semiconductor device further includes a pair of cell gate electrodes on the cell region and on the device isolation layer that extends in a second direction. The second direction crosses the first direction. The semiconductor device further includes a pair of dummy gate electrodes on the dummy region and on the device isolation layer that extends in the second direction. The semiconductor device further includes an active contact between the pair of cell gate electrodes. The semiconductor device further includes a dummy contact between the pair of dummy gate electrodes. The semiconductor device further includes a first gate spacer on a side surface of each of the pair of cell gate electrodes. The semiconductor device further includes a second gate spacer on a side surface of each of the pair of dummy gate electrodes. The semiconductor device further includes an interlayer insulating layer on the side surface of each of the pair of cell gate electrodes and the side surface of each of the pair of dummy gate electrodes. The semiconductor device further includes a dam structure on the border region of the substrate. The dam structure is inserted in the interlayer insulating layer. The interlayer insulating layer includes silicon oxide. The dam structure includes a material having an etch selectivity with respect to the interlayer insulating layer.

According to an aspect of the present disclosure, a semiconductor device is provided. The semiconductor device includes a substrate including a cell region, a dummy region spaced apart from the cell region in a first direction, and a border region interposed between the cell region and the dummy region. The semiconductor device further includes an active pattern on the cell region of the substrate. The semiconductor device further includes a device isolation layer defining the active pattern and that extends in the first direction. The semiconductor device further includes a pair of source/drain patterns on the active pattern and spaced apart from each other in the first direction. The semiconductor device further includes a channel pattern between the pair of source/drain patterns. The semiconductor device further includes a cell gate electrode on a top surface and opposite side surfaces of the channel pattern that extends in a second direction crossing the first direction. The semiconductor device further includes a first gate spacer covering opposite side surfaces of the cell gate electrode. The semiconductor device further includes an active contact electrically coupled to at least one of the pair of source/drain patterns. The semiconductor device further includes a dummy gate electrode on the dummy region and on the device isolation layer. The semiconductor device further includes a second gate spacer covering opposite side surfaces of the dummy gate electrode. The semiconductor device further includes a dummy contact on a side surface of the dummy gate electrode. The semiconductor device further includes an interlayer insulating layer interposed between the second gate spacer and the dummy contact. The semiconductor device further includes a dam structure disposed on the border region and on the device isolation layer. An upper portion of the active pattern vertically protrudes above the device isolation layer. A level of a bottom surface of the dam structure is lower than a level of a bottom surface of the active contact.

Additional aspects will be set forth in part in the description that follows and, in part, will be apparent from the description, or may be learned by practice of the presented embodiments of the disclosure.

BRIEF DESCRIPTION OF DRAWINGS

The above and other aspects, features, and advantages of certain embodiments of the present disclosure will be more apparent from the following description taken in conjunction with the accompanying drawings, in which:

FIGS. 5A to 5G are sectional views, which are respectively taken along lines A-A', B-B', C-C', D-D', E-E', F-F', and G-G' of FIG. 4, according to an embodiment;

FIGS. 13A to 13C are sectional views, which are taken along the lines A-A', B-B', and C-C' of FIG. 4 to illustrate a semiconductor device, according to an embodiment.

DETAILED DESCRIPTION

Figure 1:
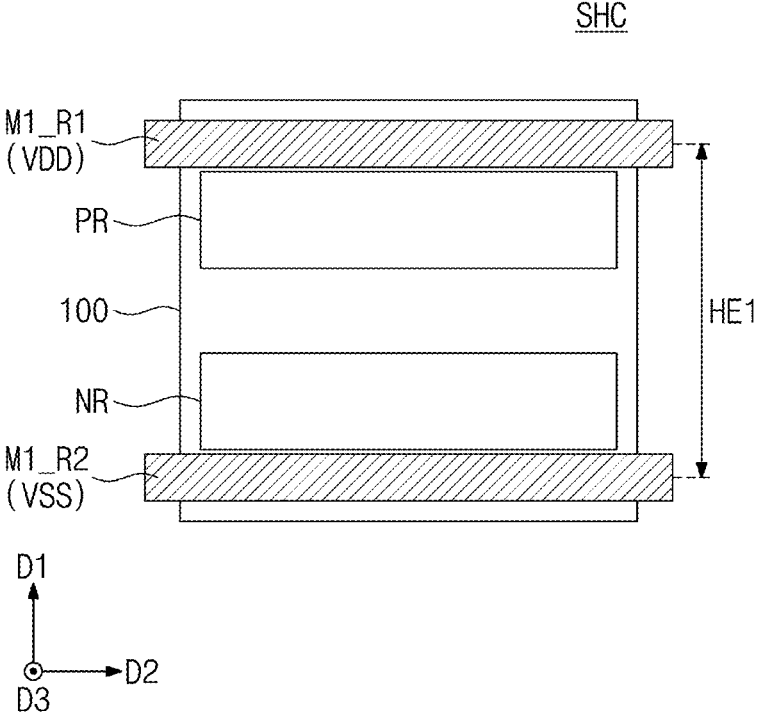
FIGS. 1 to 3 are conceptual diagrams illustrating logic cells of a semiconductor device, according to an embodiment.

The following description with reference to the accompanying drawings is provided to assist in a comprehensive understanding of embodiments of the present disclosure defined by the claims and their equivalents. Various specific details are included to assist in understanding, but these details are considered to be exemplary only. Therefore, those of ordinary skill in the art will recognize that various changes and modifications of the embodiments described herein can be made without departing from the scope and spirit of the disclosure. In addition, descriptions of well-known functions and structures are omitted for clarity and conciseness.

With regard to the description of the drawings, similar reference numerals may be used to refer to similar or related elements. It is to be understood that a singular form of a noun corresponding to an item may include one or more of the things, unless the relevant context clearly indicates otherwise. As used herein, expressions such as "at least one of" when preceding a list of elements, modify the entire list of elements and do not modify the individual elements of the list. For example, "at least one of a, b, and c" should be understood as including only a, only b, only c, both a and b, both a and c, both b and c, or all of a, b, and c. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wired), wirelessly, or via a third element.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

The terms "upper", "middle", "lower", etc. may be replaced with terms, such as "first," "second," third" to be used to describe relative positions of elements. The terms "first," "second," third" may be used to described various elements but the elements are not limited by the terms and a "first element" may be referred to as a "second element". Alternatively or additionally, the terms "first", "second", "third", etc. may be used to distinguish components from each other and do not limit the present disclosure. For example, the terms "first", "second", "third", etc. may not necessarily involve an order or a numerical meaning of any form.

Reference throughout the present disclosure to "one embodiment," "an embodiment," "an example embodiment," or similar language may indicate that a particular feature, structure, or characteristic described in connection with the indicated embodiment is included in at least one embodiment of the present solution. Thus, the phrases "in one embodiment", "in an embodiment," "in an example embodiment," and similar language throughout this disclosure may, but do not necessarily, all refer to the same embodiment.

Hereinafter, embodiments of the present disclosure are described in detail with reference to the accompanying drawings.

Figure 2:
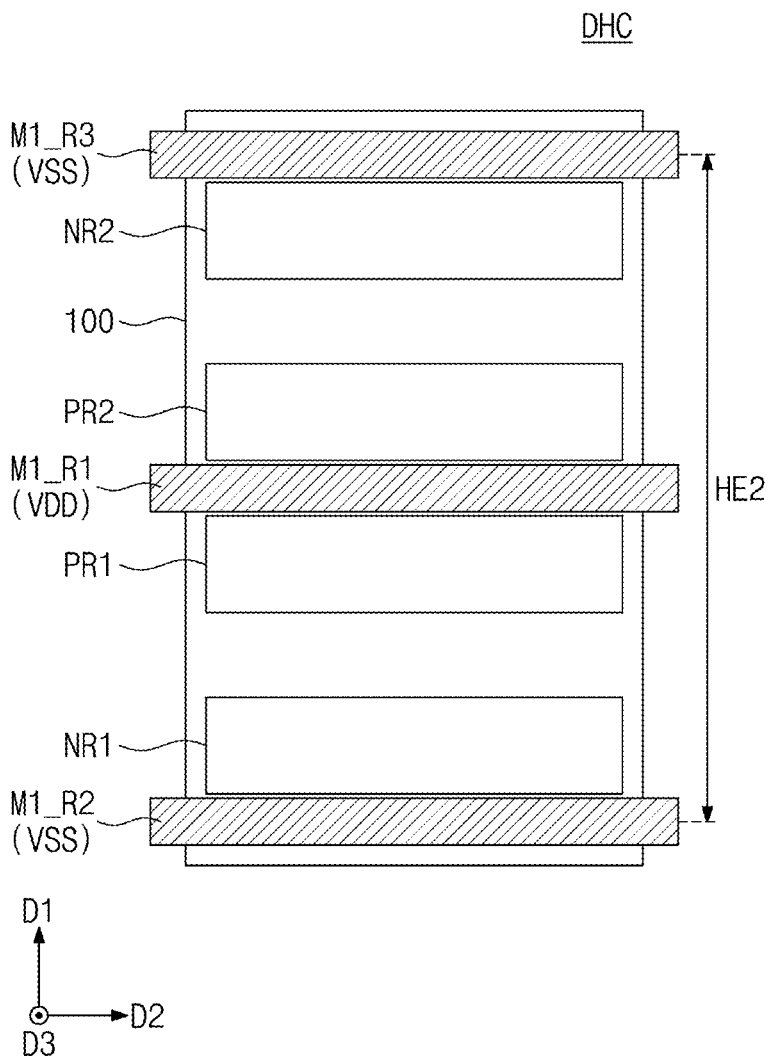
Figure 3:
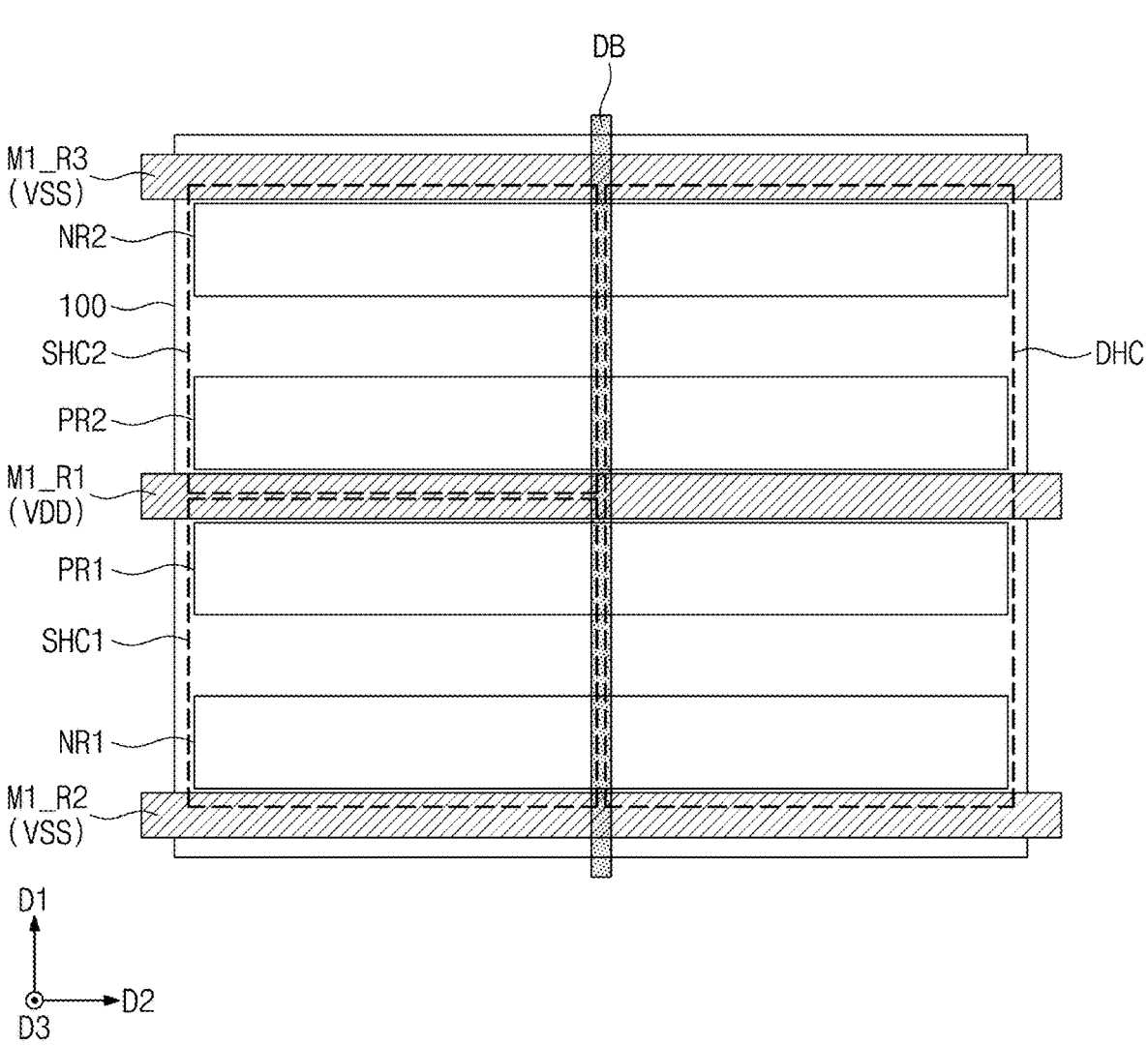

FIGS. 1 to 3 are conceptual diagrams illustrating logic cells of a semiconductor device, according to an embodiment.

Referring to FIG. 1, a single height cell SHC may be provided. That is, a first power line M1_R1 and a second power line M1_R2 may be provided on a substrate 100. The first power line M1_R1 may be a conduction path, to which a drain voltage VDD (e.g., a power voltage) may be provided. The second power line M1_R2 may be a conduction path, to which a source voltage VSS (e.g., a ground voltage) may be provided. Alternatively or additionally, the source voltage VSS first may be applied to the power line M1_R1, and the drain voltage VDD may be applied to the second power line M1_R2. The present disclosure is not limited in this regard.

The single height cell SHC may be defined between the first power line M1_R1 and the second power line M1_R2. The single height cell SHC may include one p-type metal-oxide-semiconductor field-effect transistor (PMOSFET)

region PR and one n-type metal-oxide-semiconductor field-effect transistor (NMOSFET) region NR. That is, the single height cell SHC may have a complementary metal oxide semiconductor (CMOS) structure provided between the first power line M1_R1 and the second power line M1_R2.

A length of the single height cell SHC in the first direction D1 may be defined as a first height HE1. The first height HE1 may be substantially equal to a distance (e.g., a pitch) between the first power line M1_R1 and the second power line M1_R2.

The single height cell SHC may constitute a single logic cell. In the present disclosure, the logic cell may refer to a logic device (e.g., AND, OR, XOR, XNOR, inverter, and the like) that is configured to execute a specific function. That is, the logic cell may include transistors constituting the logic device and interconnection lines connecting transistors to each other.

Referring to FIG. 2, a double height cell DHC may be provided. That is, the first power line M1_R1, the second power line M1_R2, and a third power line M1_R3 may be provided on the substrate 100. The first power line M1_R1 may be disposed between the second power line M1_R2 and the third power line M1_R3. The third power line M1_R3 may be a conduction path, to which the drain voltage VDD is provided. In another example embodiment, the source voltage VSS first may be applied to the power line M1_R1, and the drain voltage VDD may be applied to the second power line M1_R2 and the third power line M1_R3. The present disclosure is not limited in this regard.

The double height cell DHC may refer to an area between the second power line M1_R2 and the third power line M1_R3. The double height cell DHC may include a first PMOSFET region PR1, a second PMOSFET region PR2, a first NMOSFET region NR1, and a second NMOSFET region NR2.

The first NMOSFET region NR1 may be adjacent to the second power line M1_R2. The second NMOSFET region NR2 may be adjacent to the third power line M1_R3. The first PMOSFET region PR1 and the second PMOSFET region PR2 may be adjacent to the first power line M1_R1. When viewed in a plan view, the first power line M1_R1 may be disposed between the first PMOSFET region PR1 and the second PMOSFET region PR2.

A length of the double height cell DHC in the first direction D1 may refer to a second height HE2. The second height HE2 may be approximately two times the first height HE1 of FIG. 1 (e.g., HE2~2×HE1). The first PMOSFET region PR1 and the second PMOSFET region PR2 of the double height cell DHC may be combined to serve as a single PMOSFET region.

Thus, a channel size of a p-channel metal-oxide-semiconductor (PMOS) transistor of the double height cell DHC may be greater than a channel size of a PMOS transistor of the single height cell SHC described above with reference to FIG. 1. For example, the channel size of the PMOS transistor of the double height cell DHC may be about two times the channel size of the PMOS transistor of the single height cell SHC. For example, the double height cell DHC may be operated at a higher speed than the single height cell SHC. In an embodiment, the double height cell DHC, as shown in FIG. 2, may refer to a multi-height cell. Alternatively or additionally, the multi-height cell may include a triple height cell (not shown) whose cell height is about three times that of the single height cell SHC.

Referring to FIG. 3, a first single height cell SHC1, a second single height cell SHC2, and the double height cell DHC may be two-dimensionally disposed on the substrate 100. The first single height cell SHC1 may be disposed between the first power line M1_R1 and the second power line M1_R2. The second single height cell SHC2 may be disposed between the first power line M1_R1 and the third power line M1_R3. The second single height cell SHC2 may be adjacent to the first single height cell SHC1 in the first direction D1.

The double height cell DHC may be disposed between the second power line M1_R2 and the third power line M1_R3. The double height cell DHC may be adjacent to the first single height cell SHC1 and the second single height cell SHC2 in a second direction D2.

A division structure DB may be provided between the first single height cell SHC1 and the double height cell DHC and between the second single height cell SHC2 and the double height cell DHC. That is, the active region of the double height cell DHC may be electrically separated (e.g., decoupled) from the active region of each of the first single height cell SHC1 and the second single height cell dSHC2 by the division structure DB.

Figure 4:
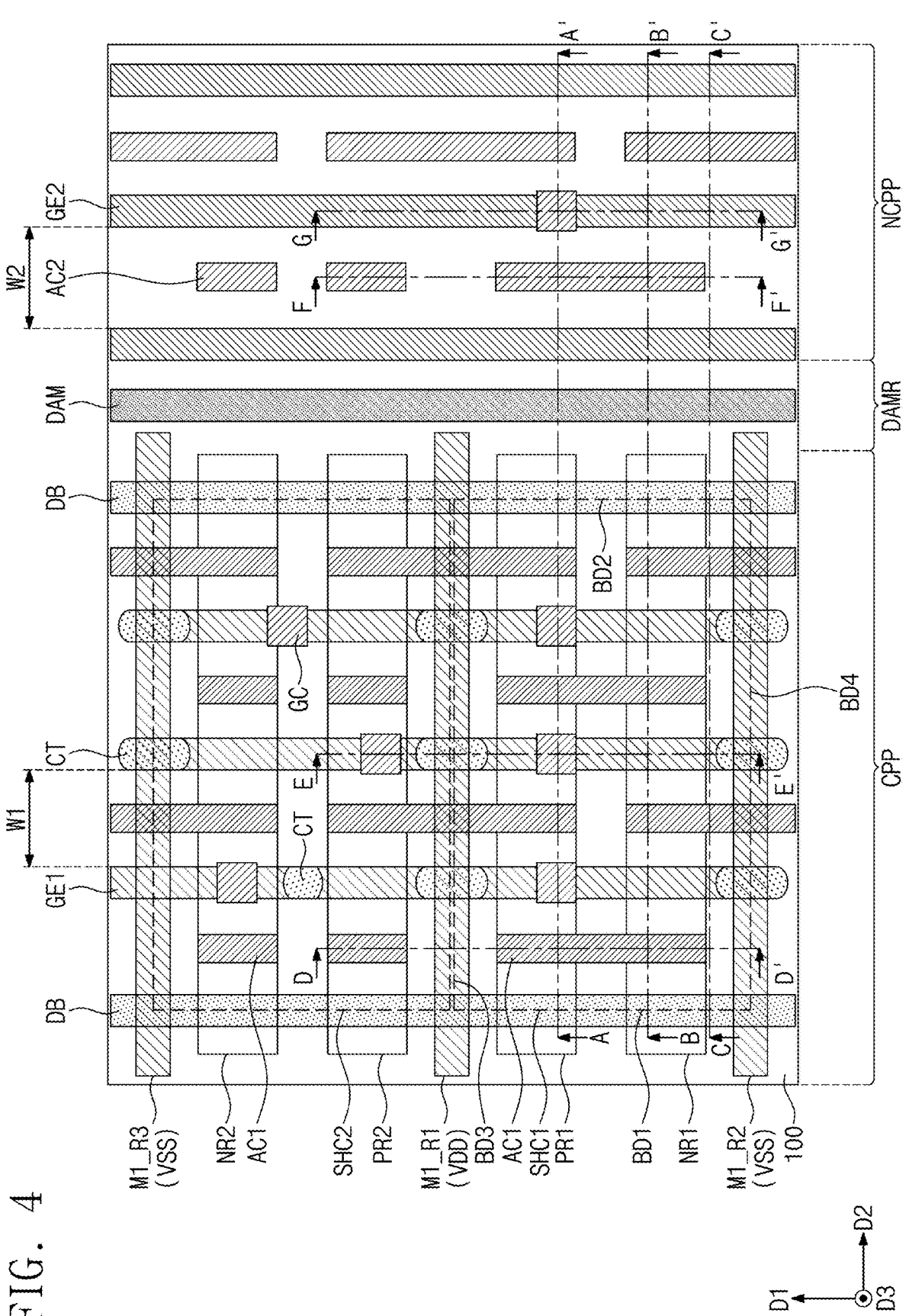
FIG. 4 is a plan view illustrating a semiconductor device, according to an embodiment.
Figure 5A:
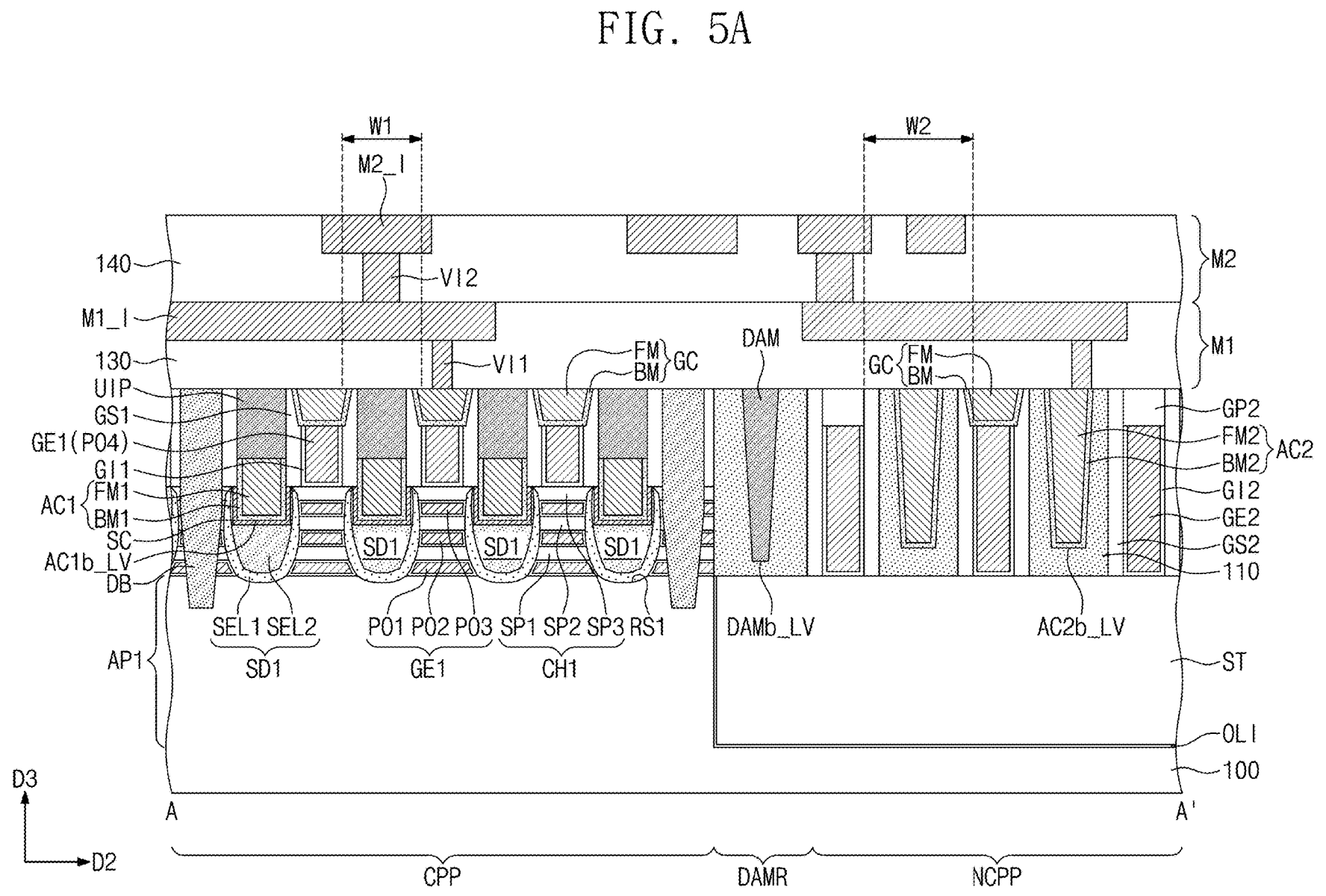
Figure 5B:
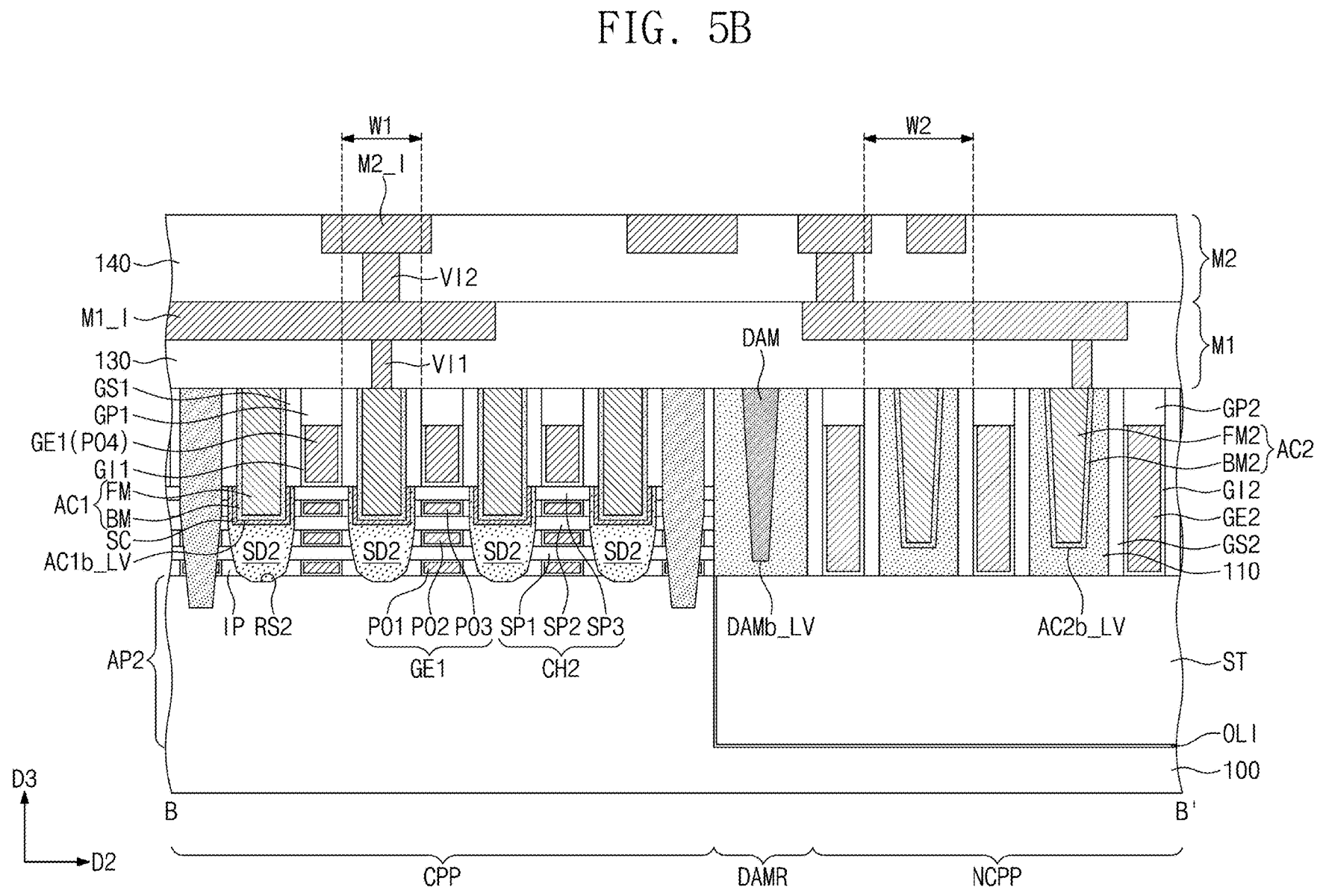
Figure 5C:
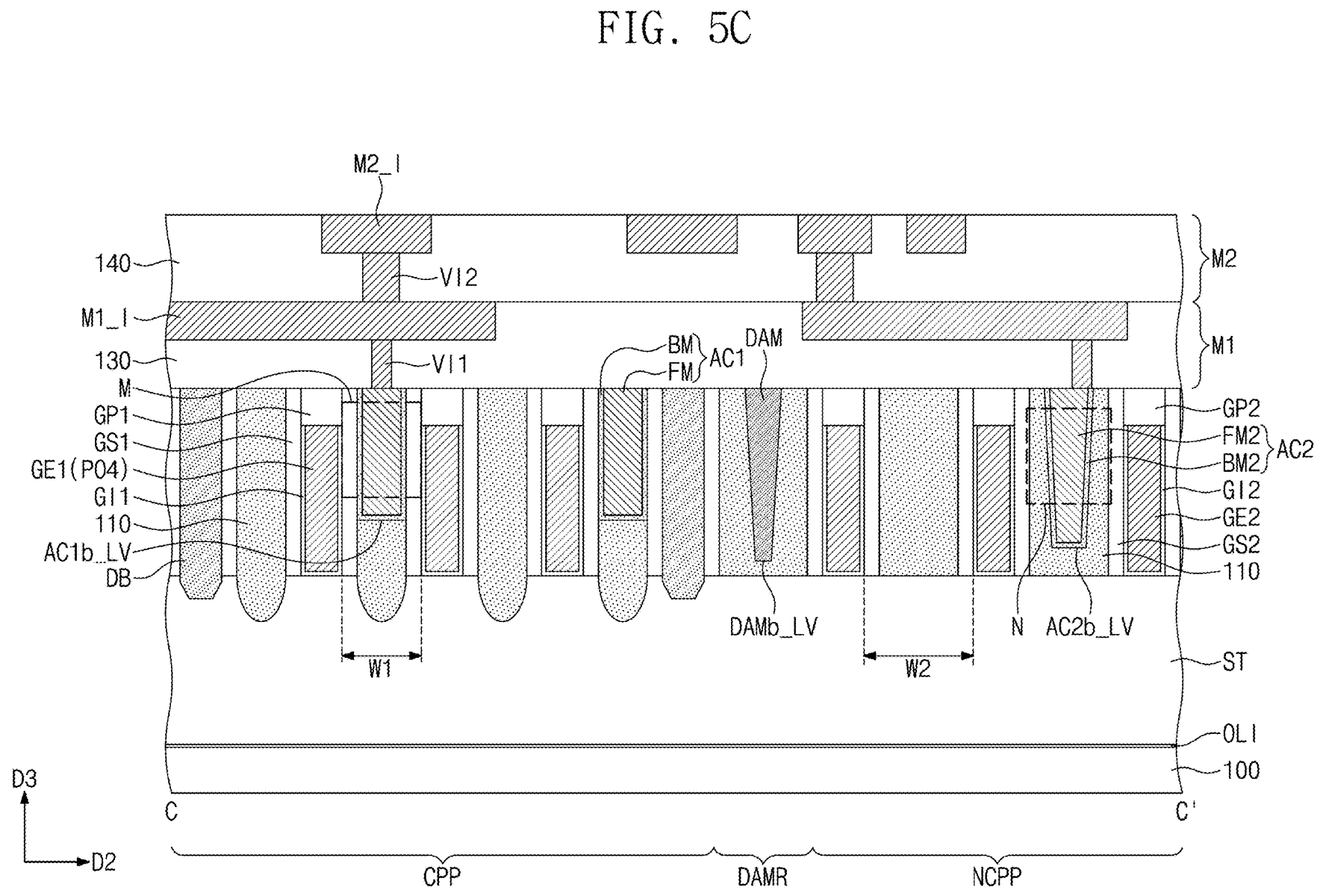
Figure 5D:
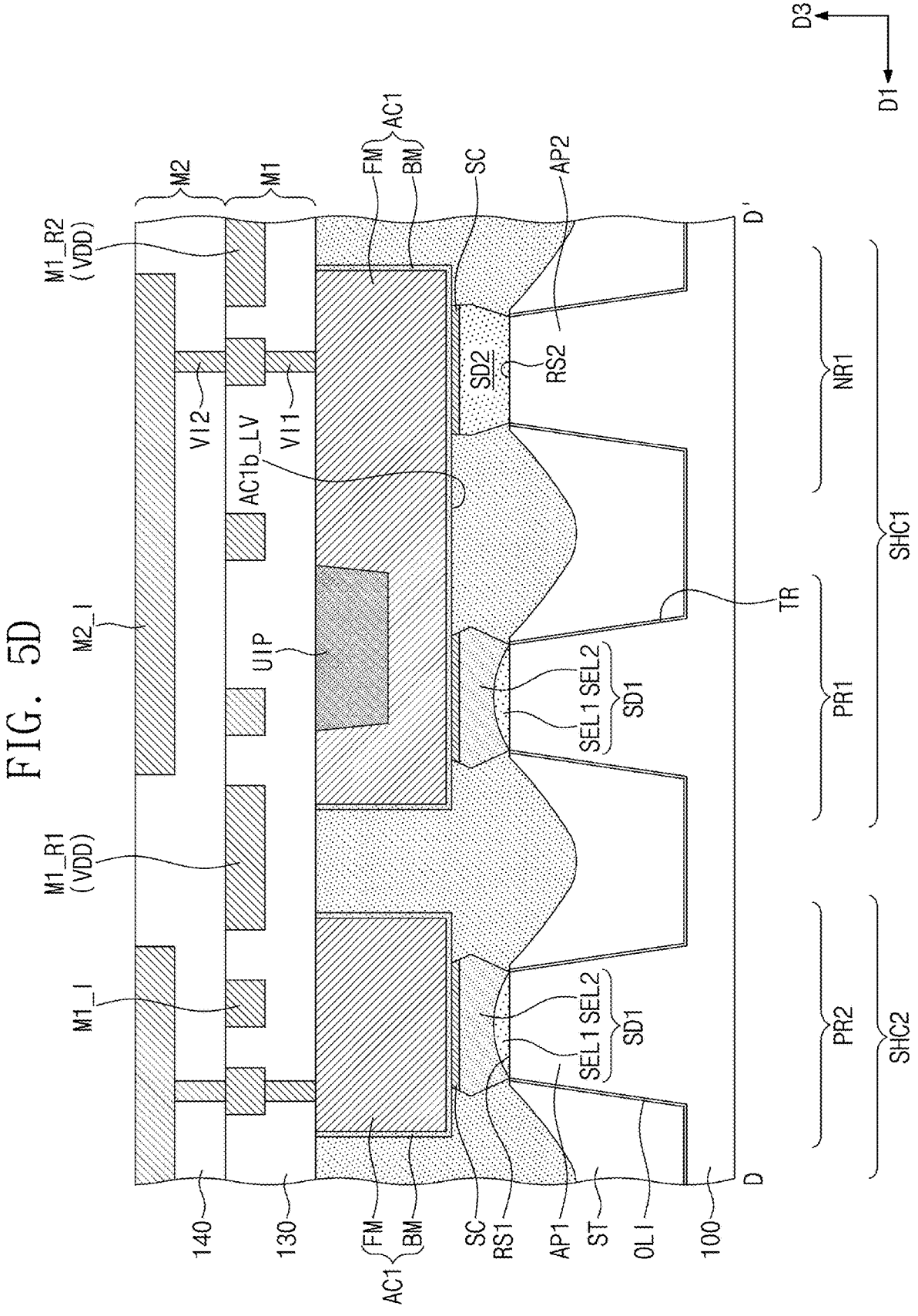
Figure 5E:
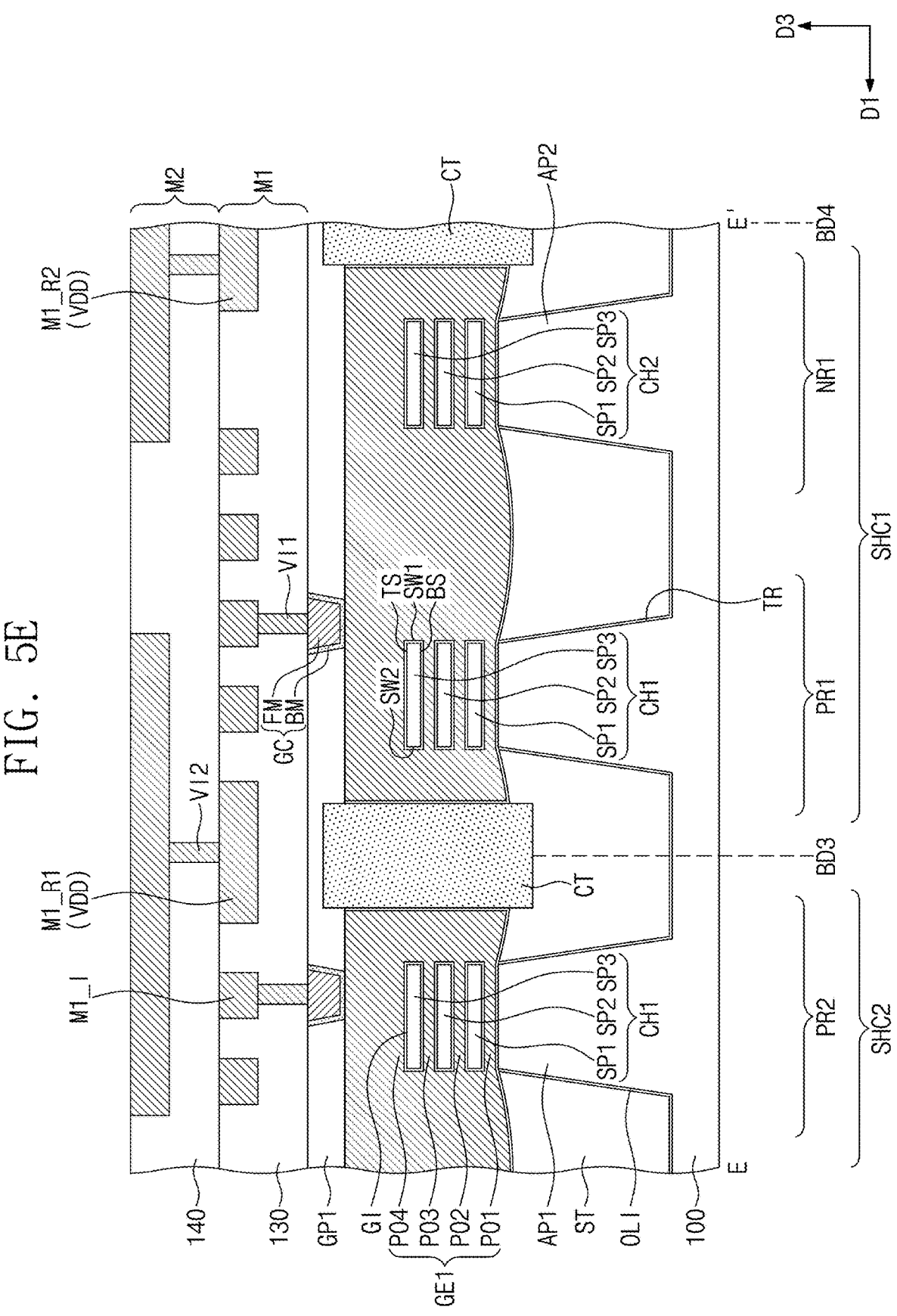

FIG. 4 is a plan view illustrating a semiconductor device, according to an embodiment. FIGS. 5A to 5G are sectional views, which are respectively taken along lines A-A', B-B', C-C', D-D', E-E', F-F', and G-G' of FIG. 4. FIG. 6A is an enlarged sectional view illustrating a portion 'M' of FIG. 5C. FIG. 6B is an enlarged sectional view illustrating a portion 'N' of FIG. 5C.

Referring to FIGS. 4 and 5A to 5G, the substrate 100 including a cell region CPP, a dummy region NCPP, and a border region DAMR may be provided. The substrate 100 may be a semiconductor substrate that is formed of and/or includes at least one of silicon (Si), germanium (Ge), silicon germanium (SiGe), a compound semiconductor material, and the like. In an embodiment, the substrate 100 may be a silicon wafer.

The cell region CPP may be a region, in which a first active pattern AP1 and a second active pattern AP2 are provided. The cell region CPP may be prepared for transistors having a short channel and/or a short gate pitch. The dummy region NCPP may be spaced apart from the cell region CPP in a second direction D2 and may be prepared for transistors having a long channel and/or a long gate pitch. The border region DAMR may be interposed between the cell region CPP and the dummy region NCPP and may be prepared for a dam structure DAM.

The first single height cell SHC1 and the second single height cell SHC2 may be provided on the cell region CPP of the substrate 100. Logic transistors constituting a logic circuit may be disposed on each of the first single height cell SHC1 and the second single height cells SHC2.

The substrate 100 may include the first PMOSFET region PR1, the second PMOSFET region PR2, the first NMOSFET region NR1, and the second NMOSFET region NR2, which may be provided on the cell region CPP. Each of the first PMOSFET region PR1, the second PMOSFET region PR2, the first NMOSFET region NR1, and the second NMOSFET region NR2 may be extended in the second direction D2. The first single height cell SHC1 may include the first NMOSFET region NR1 and the first PMOSFET region PR1. The second single height cell SHC2 may include the second PMOSFET region PR2 and the second NMOSFET region NR2.

A first active pattern AP1 and a second active pattern AP2 may be defined on the cell region CPP by a trench TR formed in an upper portion of the substrate 100. The first active pattern AP1 may be provided on each of the first PMOSFET region PR1 and the second PMOSFET region PR2. The second active pattern AP2 may be provided on each of the first NMOSFET region NR1 and the second NMOSFET region NR2. In an embodiment, the first active pattern AP1 and the second active pattern AP2 may be provided on only the cell region CPP of the substrate 100. For example, the first active pattern AP1 and the second active pattern AP2 may not be provided on the dummy region NCPP and the border region DAMR.

Each of the first active pattern AP1 and the second active pattern AP2 may be a vertically-protruding portion of the substrate 100. The substrate 100 may not have a vertically-protruding portion on the dummy region NCPP and the border region DAMR. A level of the top surface of the substrate 100 in the dummy region NCPP and the border region DAMR may be substantially equal to a level of a bottom surface of the trench TR in the cell region CPP.

A device isolation layer ST may be provided on the cell region CPP to fill the trench TR and to extend in the second direction D2. As shown in FIG. 5C, the device isolation layer ST may be partially recessed in regions that are overlapped with first source/drain patterns SD1 and second source/drain patterns SD2 in the first direction D1. The recessing of the device isolation layer ST may occur when the first source/drain patterns SD1 and the second source/drain patterns SD2 are formed. On the dummy region NCPP and the border region DAMR, the device isolation layer ST may be provided to cover the substrate 100. The device isolation layer ST may include, but not be limited to, a silicon oxide layer. The device isolation layer ST may not cover first channel pattern CH1 and second channel pattern CH2.

A liner layer OLI may be provided on the cell region CPP and may be interposed between the first active pattern AP1, the second active pattern AP2, and the device isolation layer ST. The liner layer OLI may directly cover side surfaces of the first active pattern AP1 and the second active pattern AP2. In some embodiments, the liner layer OLI may directly cover a side surface of the trench TR. Alternatively or additionally, the liner layer OLI may directly cover a bottom surface of the trench TR. The liner layer OLI may be extended from the cell region CPP to the border region DAMR and the dummy region NCPP. On the dummy region NCPP and the border region DAMR, the liner layer OLI may be interposed between the substrate 100 and the device isolation layer ST.

The liner layer OLI may include, but not be limited to, at least one of a silicon oxide layer and a silicon nitride layer. In an embodiment, the liner layer OLI may be formed of and/or include the same material as the device isolation layer ST. In such an embodiment, there may be no observable interface between the liner layer OLI and the device isolation layer ST.

A first channel pattern CH1 may be provided on the first active pattern AP1. A second channel pattern CH2 may be provided on the second active pattern AP2. Each of the first channel pattern CH1 and the second channel pattern CH2 may include a first semiconductor pattern SP1, a second semiconductor pattern SP2, and a third semiconductor pattern SP3, which may be sequentially stacked. The first semiconductor pattern SP1, the second semiconductor pattern SP2, and the third semiconductor pattern SP3 may be spaced apart from each other in a vertical direction (e.g., a third direction D3).

Each of the first semiconductor pattern SP1, the second semiconductor pattern SP2, and the third semiconductor pattern SP3 may be formed of and/or include at least one of Si, Ge, and SiGe. However, the present disclosure is not limited in this regard. For example, in an embodiment, each of the first semiconductor pattern SP1, the second semiconductor pattern SP2, and the third semiconductor pattern SP3 may be formed of and/or include crystalline silicon.

A plurality of first source/drain patterns SD1 may be provided on the first active pattern AP1. A plurality of first recesses RS1 may be formed in an upper portion of the first active pattern AP1. The first source/drain patterns SD1 may be provided in the first recesses RS1, respectively. The first source/drain patterns SD1 may be impurity regions of a first conductivity type (e.g., p-type). The first channel pattern CH1 may be interposed between each pair of the first source/drain patterns SD1. That is, each pair of the first source/drain patterns SD1 may be connected (e.g., coupled) to each other by the stacked first semiconductor pattern SP1, the second semiconductor pattern SP2, and the third semiconductor pattern SP3.

A plurality of second source/drain patterns SD2 may be provided on the second active pattern AP2. A plurality of second recesses RS2 may be formed in an upper portion of the second active pattern AP2. The second source/drain patterns SD2 may be provided in the second recesses RS2, respectively. The second source/drain patterns SD2 may be impurity regions of a second conductivity type (e.g., n-type). The second channel pattern CH2 may be interposed between each pair of the second source/drain patterns SD2. That is, each pair of the second source/drain patterns SD2 may be connected (e.g., coupled) to each other by the stacked first semiconductor pattern SP1, the second semiconductor pattern SP2, and the third semiconductor pattern SP3.

The first source/drain patterns SD1 and the second source/drain patterns SD2 may be epitaxial patterns, which may be formed by a selective epitaxial growth (SEG) process. For example, a top surface of each of the first source/drain patterns SD1 and the second source/drain patterns SD2 may be located at substantially the same level as a top surface of the third semiconductor pattern SP3. For another example, the top surface of each of the first source/drain patterns SD1 and the second source/drain patterns SD2 may be higher than the top surface of the third semiconductor pattern SP3.

The first source/drain patterns SD1 may be formed of and/or include a semiconductor material (e.g., SiGe) having a lattice constant greater than that of the substrate 100. In this case, the pair of the first source/drain patterns SD1 may exert a compressive stress on the first channel patterns CH1 therebetween. The second source/drain patterns SD2 may be formed of and/or include the same semiconductor element (e.g., Si) as the substrate 100.

Each of the first source/drain patterns SD1 may include a first semiconductor layer SEL1 and a second semiconductor layer SEL2, which may be sequentially stacked. A sectional shape of the first source/drain pattern SD1 in the second direction D2 is described with reference to FIG. 5A.

The first semiconductor layer SEL1 may cover an inner surface of a first recess RS1. The first semiconductor layer SEL1 may have a decreasing thickness in an upward direction. For example, the thickness of the first semiconductor layer SEL1, which is measured in the third direction D3 at the bottom level of the first recess RS1, may be larger than the thickness of the first semiconductor layer SEL1, which is measured in the second direction D2 at the top level of the first recess RS1. The first semiconductor layer SEL1 may have a 'U'-shaped section, due to a sectional profile of the first recess RS1.

The second semiconductor layer SEL2 may fill a remaining space of the first recess RS1 excluding the first semiconductor layer SEL1. A volume of the second semiconductor layer SEL2 may be larger than a volume of the first semiconductor layer SEL1. That is, a ratio of the volume of the second semiconductor layer SEL2 to a total volume of the first source/drain patterns SD1 may be greater than a ratio of the volume of the first semiconductor layer SEL1 to the total volume of the first source/drain patterns SD1.

Each of the first semiconductor layer SEL1 and the second semiconductor layer SEL2 may be formed of and/or include silicon-germanium (SiGe). In detail, the first semiconductor layer SEL1 may be provided to have a relatively low germanium concentration. In another embodiment, the first semiconductor layer SEL1 may be provided to contain only silicon (Si) and not germanium (Ge). The germanium concentration of the first semiconductor layer SEL1 may range from approximately 0 at % (atomic percentage) to approximately 10 at %.

The second semiconductor layer SEL2 may be provided to have a relatively high germanium concentration. For example, the germanium concentration of the second semiconductor layer SEL2 may range from approximately 30 at % to approximately 70 at %. The germanium concentration of the second semiconductor layer SEL2 may increase in the third direction D3. For example, the germanium concentration of the second semiconductor layer SEL2 may be approximately 40 at % near the first semiconductor layer SEL1 and may be approximately 60 at % at its top level.

The first and second semiconductor layers SEL1 and SEL2 may include impurities (e.g., boron), allowing the first source/drain patterns SD1 to have the p-type conductivity. In an embodiment, a concentration of impurities in the second semiconductor layer SEL2 (in at %) may be greater than that in the first semiconductor layer SEL1.

The first semiconductor layer SEL1 may prevent a stacking fault from occurring between the substrate 100 and the second semiconductor layer SEL2 and between the first to third semiconductor patterns SP1, SP2, and SP3 and the second semiconductor layer SEL2. The stacking fault may lead to an increase of a channel resistance. The stacking fault may occur on the bottom of the first recess RS1. Thus, to prevent the stacking fault, the first semiconductor layer SEL1 may be provided to have a relatively large thickness near the bottom of the first recess RS1.

The first semiconductor layer SEL1 may protect the second semiconductor layer SEL2, in a process of replacing sacrificial layers SAL with first portion PO1, second portion PO2, and third portion PO3 of a cell gate electrode GE1. For example, the first semiconductor layer SEL1 may prevent the second semiconductor layer SEL2 from being undesirably etched by an etching material, which may be used to remove the sacrificial layers SAL.

The cell gate electrodes GE1 may be provided to cross the first channel pattern CH1 and the second channel pattern CH2 and to extend in the first direction D1. The cell gate electrodes GE1 may be arranged at a first pitch W1 in the second direction D2. Each of the cell gate electrodes GE1 may be vertically overlapped with the first channel pattern CH1 and the second channel pattern CH2.

The cell gate electrode GE1 may include a first portion PO1 interposed between the first active pattern AP1 or the second active pattern AP2 and the first semiconductor pattern SP1. The cell gate electrode GE1 may include a second portion PO2 interposed between the first semiconductor pattern SP1 and the second semiconductor pattern SP2. The cell gate electrode GE1 may include a third portion PO3 interposed between the second semiconductor pattern SP2 and the third semiconductor pattern SP3. The cell gate electrode GE1 may include a fourth portion PO4 on the third semiconductor pattern SP3.

Referring back to FIG. 5A, the first to third portions PO1, PO2, and PO3 of the cell gate electrode GE1 on the PMOSFET region PR may have different widths from each other. For example, the largest width of the third portion PO3 in the second direction D2 may be larger than the largest width of the second portion PO2 in the second direction D2. The largest width of the first portion PO1 in the second direction D2 may be larger than the largest width of the third portion PO3 in the second direction D2.

Referring back to FIG. 5E, the cell gate electrode GE1 may be provided on a top surface TS, a bottom surface BS, and opposite side surfaces SW1 and SW2 of each of the first to third semiconductor patterns SP1, SP2, and SP3. That is, the transistor according to the present embodiment may be a three-dimensional field effect transistor (e.g., multi-bridge-channel field-effect-transistor (MBCFET) and/or gate-all-around field-effect-transistor (GAAFET)) in which the cell gate electrode GE1 may be provided to three-dimensionally surround the channel pattern.

For example, the first single height cell SHC1 may have a first border BD1 and a second border BD2, which may be opposite to each other in the second direction D2. The first border BD1 and the second border BD2 may be extended in the first direction D1. The first single height cell SHC1 may have a third border BD3 and a fourth border BD4, which may be opposite to each other in the first direction D1. The third border BD3 and the fourth border BD4 may be extended in the second direction D2.

Gate cutting patterns CT may be disposed on a border of each of the first single height cell SHC1 and the second single height cells SHC2. That is, the gate cutting patterns CT may be parallel to the second direction D2. For example, the gate cutting patterns CT may be disposed on the third border BD3 and the fourth border BD4 of the first single height cell SHC1. The gate cutting patterns CT may be arranged at the first pitch along the third border BD3. Alternatively or additionally, the gate cutting patterns CT may be arranged at the first pitch along the fourth border BD4. When viewed in a plan view, the gate cutting patterns CT on the third border BD3 and the fourth border BD4 may be disposed to be overlapped with the cell gate electrodes GE1, respectively. In some embodiments, the gate cutting patterns CT may be formed of and/or include at least one of insulating materials (e.g., silicon oxide, silicon nitride, or combinations thereof).

The cell gate electrode GE1 on the first single height cell SHC1 may be separated from the cell gate electrode GE1 on the second single height cell SHC2 by the gate cutting pattern CT. The gate cutting pattern CT may be interposed between the cell gate electrodes GE1 on the first height cell SHC1 and the second single height cell SHC2, which may be aligned to each other in the first direction D1. That is, the cell gate electrode GE1 extending in the first direction D1 may be divided into a plurality of cell gate electrodes GE1 by the gate cutting patterns CT.

Referring back to FIG. 4, at least one of the gate cutting patterns CT may be located in a cell, not on a border of the cell. For example, the gate cutting pattern CT may be disposed between the second PMOSFET region PR2 and the second NMOSFET region NR2 of the second single height cell SHC2.

Referring back to FIGS. 4 and 5A to 5E, a first gate spacer GS1 may be disposed on each of opposite side surfaces of the fourth portion PO4 of the cell gate electrode GE1. The first gate spacer GS1 may be extended along the cell gate electrode GE1 and in the first direction D1. A top surface of the first gate spacer GS1 may be higher than the top surface of the cell gate electrode GE1. Alternatively or additionally, the top surface of the first gate spacer GS1 may be coplanar with a top surface of a first interlayer insulating layer 110. The first gate spacer GS1 may be formed of and/or include at least one of silicon oxynitride (SiON), silicon carbon nitride (SiCN), silicon carbon oxynitride (SiCON), and silicon nitride (SiN). In an embodiment, the first gate spacer GS1 may be a multi-layered structure, which may be formed of and/or include at least two different materials selected at least from SiON, SiCN, SiCON, and SiN. However, the present disclosure is not limited in this regard.

A first gate capping pattern GP1 may be provided on the cell gate electrode GE1. The first gate capping pattern GP1 may be extended along the cell gate electrode GE1 or in the first direction D1. In some embodiments, the first gate capping pattern GP1 may be formed of and/or include a material having an etch selectivity with respect to first interlayer insulating layer 110. That is, the first gate capping pattern GP1 may be formed of and/or include at least one of SiON, SiCN, SiCON, and SiN.

A first gate insulating layer GI1 may be interposed between the cell gate electrode GE1 and the first channel pattern CH1 and between the cell gate electrode GE1 and the second channel pattern CH2. On the cell region CPP, the first gate insulating layer GI1 may cover the top surface TS, the bottom surface BS, and opposite side surfaces SW1 and SW2 of each of the first to third semiconductor patterns SP1, SP2, and SP3. On the cell region CPP, the first gate insulating layer GI1 may cover the top surface of the device isolation layer ST below the cell gate electrode GE1. Alternatively or additionally, the first gate insulating layer GI1 may cover a side surface of the gate cutting pattern CT, as shown in FIG. 5E.

In an embodiment, the first gate insulating layer GI1 may include a silicon oxide layer, a silicon oxynitride layer, and/or a high-k dielectric layer. The high-k dielectric layer may be formed of and/or include at least one of high-k dielectric materials whose dielectric constants are higher than that of silicon oxide. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

In other optional or additional embodiments, the semiconductor device may include a negative capacitance (NC) field-effect transistor (FET) using a negative capacitor. For example, the first gate insulating layer GI1 may include a ferroelectric layer exhibiting a ferroelectric property and a paraelectric layer exhibiting a paraelectric property.

The ferroelectric layer may have a negative capacitance, and the paraelectric layer may have a positive capacitance. In the case where two or more capacitors are connected in series and each capacitor has a positive capacitance, a total capacitance may be reduced to a value that is less than a capacitance of each of the capacitors. Alternatively or additionally, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS), which is less than 60 mV/decade, at room temperature.

The ferroelectric layer may have the ferroelectric property. The ferroelectric layer may be formed of and/or include at least one of hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). Alternatively or additionally, the hafnium zirconium oxide may be a compound composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer may vary depending on a ferroelectric material included in the ferroelectric layer.

In the case where the ferroelectric layer includes hafnium oxide, the dopants in the ferroelectric layer may include at least one of gadolinium (Gd), silicon (Si), zirconium (Zr), aluminum (Al), and/or yttrium (Y).

In the case where the dopants are aluminum (Al), a content of aluminum in the ferroelectric layer may range from approximately 3 at % to approximately 8 at %. That is, the content of the dopants (e.g., aluminum atoms) may be a ratio of the number of aluminum atoms to the number of hafnium and aluminum atoms.

In the case where the dopants are silicon (Si), a content of silicon in the ferroelectric layer may range from approximately 2 at % to approximately 10 at %. In the case where the dopants are yttrium (Y), a content of yttrium in the ferroelectric layer may range from approximately 2 at % to approximately 10 at %. In the case where the dopants are gadolinium (Gd), a content of gadolinium in the ferroelectric layer may range from approximately 1 at % to approximately 7 at %. In the case where the dopants are zirconium (Zr), a content of zirconium in the ferroelectric layer may range from approximately 50 at % to approximately 80 at %.

The paraelectric layer may have the paraelectric property. The paraelectric layer may be formed of and/or include at least one of silicon oxide and/or high-k metal oxides. The metal oxides, which may be used as the paraelectric layer, may include at least one of hafnium oxide, zirconium oxide, and/or aluminum oxide, but the present disclosure is not limited to these examples.

The ferroelectric layer and the paraelectric layer may be formed of and/or include the same material. The ferroelectric layer may have the ferroelectric property, but the paraelectric layer may not have the ferroelectric property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric property, only when its thickness is in a specific range. In an embodiment, the ferroelectric layer may have a thickness ranging from approximately 0.5 nanometers (nm) to approximately 10 nm, but the present disclosure is not limited to this example. Since a critical thickness associated with the occurrence of the ferroelectric property varies depending on the kind of the ferroelectric material, the thickness of the ferroelectric layer may be changed depending on the kind of the ferroelectric material.

For example, the first gate insulating layer GI1 may include a single ferroelectric layer. For another example, the first gate insulating layer GI1 may include a plurality of ferroelectric layers spaced apart from each other. The first gate insulating layer GI1 may have a multi-layered structure, in which a plurality of ferroelectric layers and a plurality of paraelectric layers are alternately stacked.

The cell gate electrode GE1 may include a first metal pattern and a second metal pattern on the first metal pattern. The first metal pattern may be provided on the first gate insulating layer GI1 and may be adjacent to the first to third semiconductor patterns SP1, SP2, and SP3. The first metal pattern may include a work-function metal, which may be used to adjust a threshold voltage of the transistor. By adjusting a thickness and composition of the first metal pattern, it may be possible to realize a transistor having a desired threshold voltage. For example, the first portion PO1, the second PO2, and the third portion PO3 of the cell gate electrode GE1 may be composed of the first metal pattern and/or the work-function metal.

The first metal pattern may include a metal nitride layer. For example, the first metal pattern may include a layer that is composed of at least one metallic material, which may be selected from at least one of titanium (Ti), tantalum (Ta), aluminum (Al), tungsten (W) and molybdenum (Mo), and nitrogen (N). In an embodiment, the first metal pattern may further include carbon (C). Alternatively or additionally, the first metal pattern may include a plurality of stacked work-function metal layers.

The second metal pattern may be formed of and/or include a metallic material whose resistance is lower than the first metal pattern. For example, the second metal pattern may include at least one metallic material, which may be selected from at least one of tungsten (W), aluminum (Al), titanium (Ti), and tantalum (Ta). The fourth portion PO4 of the cell gate electrode GE1 may include the first metal pattern and the second metal pattern on the first metal pattern.

Referring back to FIG. 5B, inner spacers IP may be provided on the first NMOSFET region NR1 and the second NMOSFET region NR2 and on the cell region CPP. The inner spacers IP may be respectively interposed between the first to third portions PO1, PO2, and PO3 of the cell gate electrode GE1 and the second source/drain patterns SD2. The inner spacers IP may be in direct contact with the second source/drain patterns SD2. Each of the first to third portions PO1, PO2, and PO3 of the cell gate electrode GE1 may be spaced apart from the second source/drain patterns SD2 by the inner spacer IP.

Referring back to FIGS. 4 and 5A to 5G, the first interlayer insulating layer 110 may be provided on the substrate 100 and the device isolation layer ST. As shown in FIGS. 5C and 5D, the first interlayer insulating layer 110 may cover the first gate spacer GS1 and the first source/drain patterns SD1 and the second source/drain patterns SD2. An active contact AC1 and a dummy contact AC2 may be inserted in a portion of the first interlayer insulating layer 110. In an embodiment, the first interlayer insulating layer 110 may not be interposed between the first gate spacer GS1 and the active contact AC1. That is, as shown in FIG. 5C, the first interlayer insulating layer 110 may not cover a side surface of the active contact AC1. A top surface of the first interlayer insulating layer 110 may be substantially coplanar with a top surface of the first gate capping pattern GP1 and a top surface of the first gate spacer GS1. For example, the first interlayer insulating layer 110 may include a silicon oxide layer.

On the cell region CPP, a pair of division structures DB may be provided at both sides of each of the first and second single height cells SHC1 and SHC2 to be opposite to each other in the second direction D2. For example, the pair of the division structures DB may be provided on the first border BD1 and the second border BD2, respectively, of the first single height cell SHC1. The division structure DB may be extended in the first direction D1 to be parallel to the cell gate electrodes GE1. A pitch between the division structure DB and the cell gate electrode GE1 adjacent thereto may be equal to the first pitch W1.

The division structure DB may be provided to penetrate the first interlayer insulating layer 110 and may be extended into the first active pattern AP1 and the second active pattern AP2. The division structure DB may be provided to penetrate an upper portion of each of the first active pattern AP1 and the second active pattern AP2. The division structure DB may electrically separate an active region of each of the first single height cell SHC1 and the second single height cell SHC2 from an active region of a neighboring cell.

Active contacts AC1 may be provided to penetrate the first interlayer insulating layer 110 and to be electrically connected to the first source/drain patterns SD1 and the second source/drain patterns SD2, respectively. A pair of the active contacts AC1 may be respectively provided at both sides of the cell gate electrode GE1. When viewed in a plan view, the active contact AC1 may be a bar-shaped pattern extending in the first direction D1.

Referring back to FIGS. 5C and 6A, the active contact AC1 may be in contact with a side surface of the first gate spacer GS1. In the second direction D2, the first interlayer insulating layer 110 may not be interposed between the side surface of the active contact AC1 and the side surface of the first gate spacer GS1. As shown in FIG. 5D, the side surface of the active contact AC1 may be in contact with the first interlayer insulating layer 110, along a bottom surface of the active contact AC1 and in the first direction D1. The active contact AC1 may cover a portion of the top surface of the first gate capping pattern GP1 (not shown).

In an embodiment, a thickness of the active contact AC1 in the second direction D2 may be uniform. For example, the thickness of the active contact AC1 in the second direction D2 may be uniform, between the bottom and top surfaces of the active contact AC1. In an embodiment, the thickness of the active contact AC1 in the second direction D2 may not uniform. For example, the side surface of the active contact AC1 may have an angle, which may be equal to or smaller than 90°, to the top surface of the substrate 100.

Continuing to refer to FIGS. 4 and 5A to 5G, silicide patterns SC may be respectively interposed between the active contact AC1 and the first source/drain patterns SD1 and between the active contact AC1 and the second source/drain patterns SD2. The active contact AC1 may be electrically connected to the first source/drain patterns SD1 or the second source/drain patterns SD2 through the silicide patterns SC. The silicide patterns SC may be formed of and/or include at least one of metal silicide materials, such as, but not limited to, titanium silicide, tantalum silicide, tungsten silicide, nickel silicide, and cobalt silicide.

Referring back to FIG. 5D, at least one of the active contacts AC1 on the first single height cell SHC1 may electrically connect the first source/drain patterns SD1 of the first PMOSFET region PR1 to the second source/drain patterns SD2 of the first NMOSFET region NR1. The active contact AC1 may be extended from the second source/drain patterns SD2 of the first NMOSFET region NR1 to the first source/drain patterns SD1 of the first PMOSFET region PR1 in the first direction D1.

Gate contacts GC may be provided to penetrate the first gate capping pattern GP1 and may be electrically connected to the cell gate electrodes GE1, respectively. When viewed in a plan view, the gate contacts GC on the first single height cell SHC1 may be disposed to be overlapped with the first PMOSFET region PR1. That is, the gate contacts GC on the first single height cell SHC1 may be provided on the first active pattern AP1, as shown in FIG. 5A.

The gate contact GC may be freely disposed on the cell gate electrode GE1, without any limitation in its position. For example, the gate contacts GC on the second single height cell SHC2 may be respectively disposed on the second PMOSFET region PR2, the second NMOSFET region NR2, and the device isolation layer ST filling the trench TR, as shown in FIG. 4. In an embodiment, the gate contact GC may be freely disposed on a dummy gate electrode GE2, without any limitation in its position.

In an embodiment, referring to FIGS. 5A and 5D, an upper portion of the active contact AC1 adjacent to the gate contact GC may be filled with an upper insulating pattern UIP. A bottom surface of the upper insulating pattern UIP may be lower than a bottom surface of the gate contact GC. That is, a top surface of the active contact AC1 adjacent to the gate contact GC may be formed at a level, which may be lower than the bottom surface of the gate contact GC, by the upper insulating pattern UIP. Accordingly, it may be possible to prevent the gate contact GC and the active contact AC1, which are adjacent to each other, from being in contact with each other and thereby to prevent a short circuit issue from occurring therebetween.

Each of the active and gate contacts AC1 and GC may include a conductive pattern FM and a barrier pattern BM enclosing the conductive pattern FM. For example, the conductive pattern FM may be formed of and/or include at least one of metallic materials, such as, but not limited to aluminum, copper, tungsten, molybdenum, and cobalt. The barrier pattern BM may be provided to cover side and bottom surfaces of the conductive pattern FM. In an embodiment, the barrier pattern BM may include a metal layer and a metal nitride layer. The metal layer may be formed of and/or include at least one of titanium, tantalum, tungsten, nickel, cobalt, and platinum. The metal nitride layer may be formed of and/or include at least one of titanium nitride (TiN), tantalum nitride (TaN), tungsten nitride (WN), nickel nitride (NiN), cobalt nitride (CoN), and platinum nitride (PtN).

Referring back to FIGS. 4 and 5A to 5G, the dummy gate electrodes GE2 may be disposed on the dummy region NCPP and on the device isolation layer ST. The dummy gate electrodes GE2 may be extended in the first direction D1. The dummy gate electrodes GE2 may be arranged at a second pitch W2 in the second direction D2. The second pitch W2 may be larger than the first pitch W1. In an embodiment, a width of each of the dummy gate electrodes GE2 in the second direction D2 may be substantially uniform, regardless of a position in the third direction D3.

In an embodiment, the logic cells of the semiconductor device may be provided in the cell region CPP, and the cell gate electrodes GE1 in the cell region CPP may be provided to have a short pitch. Alternatively or additionally, the logic cells may not be provided in the dummy region NCPP, and the dummy gate electrodes GE2 in the dummy region NCPP may be provided to have a long pitch. The terms 'long' and 'short', which may be used to represent the pitch of the gate electrodes, may be valid in a relative context. That is, the pitch between the cell gate electrodes GE1 on the cell region CPP may be smaller than (e.g., short when compared with) the pitch between the dummy gate electrodes GE2 on the dummy region NCPP.

The dummy gate electrodes GE2 on the dummy region NCPP may be used to transmit and/or receive electrical signals to and/or from the logic cells in the cell region CPP. The dummy region NCPP may be a region in which dummy patterns are provided to reduce a spatial variation in pattern density of the semiconductor device. In the case where the variation in pattern density of the semiconductor device is reduced, it may be possible to uniformly form semiconductor patterns on the cell region CPP, when the semiconductor patterns are formed using a photolithography process. However, the present disclosure is not limited to this example, and the logic cells of the semiconductor device may also be provided in the dummy region NCPP. For example, whether the logic cells of the semiconductor device are to be provided in the dummy region NCPP may depend on the desired features of the semiconductor device.

A second gate spacer GS2 may be provided on the dummy region NCPP to be placed on each of opposite side surfaces of the dummy gate electrode GE2. The second gate spacer GS2 may be extended along the dummy gate electrode GE2 and/or in the first direction D1. A top surface of the second gate spacer GS2 may be higher than the top surface of the dummy gate electrode GE2. In some embodiments, the top surface of the second gate spacer GS2 may be coplanar with the top surface of the first interlayer insulating layer 110. The second gate spacer GS2 may be formed of and/or include at least one of SiON, SiCN, SiCON, and SiN. In an embodiment, the second gate spacer GS2 may be a multi-layered structure, which may be formed of and/or include at least two different materials selected from SiON, SiCN, SiCON, and SiN.

A second gate capping pattern GP2 may be provided on the dummy gate electrode GE2. The second gate capping pattern GP2 may be extended along the dummy gate electrode GE2 and/or in the first direction D1. The second gate capping pattern GP2 may be formed of and/or include a material having an etch selectivity with respect to the first interlayer insulating layer 110. For example, the second gate capping pattern GP2 may be formed of and/or include at least one of SiON, SiCN, SiCON, and SiN.

Figure 5G:
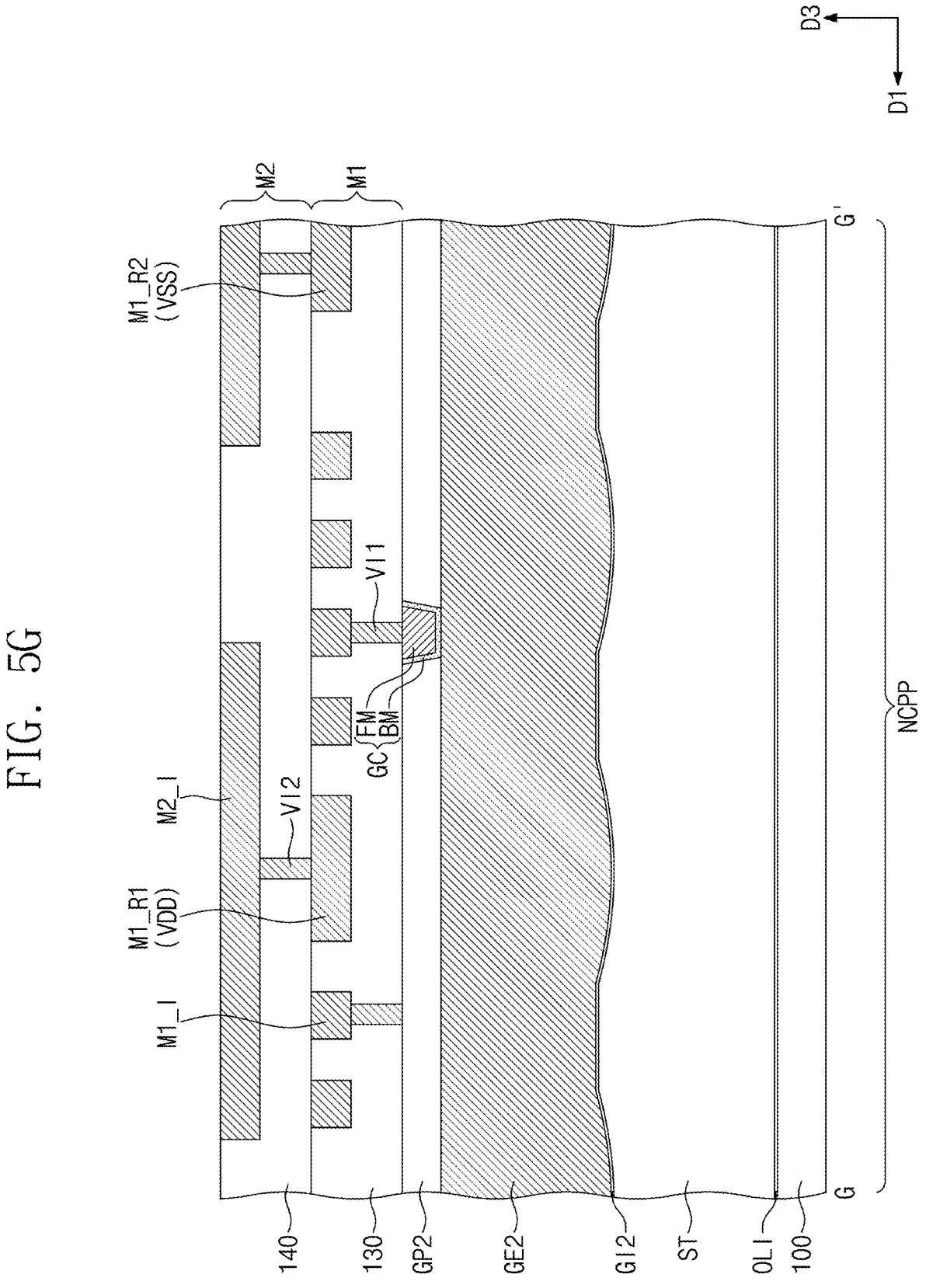
Figure 6A:
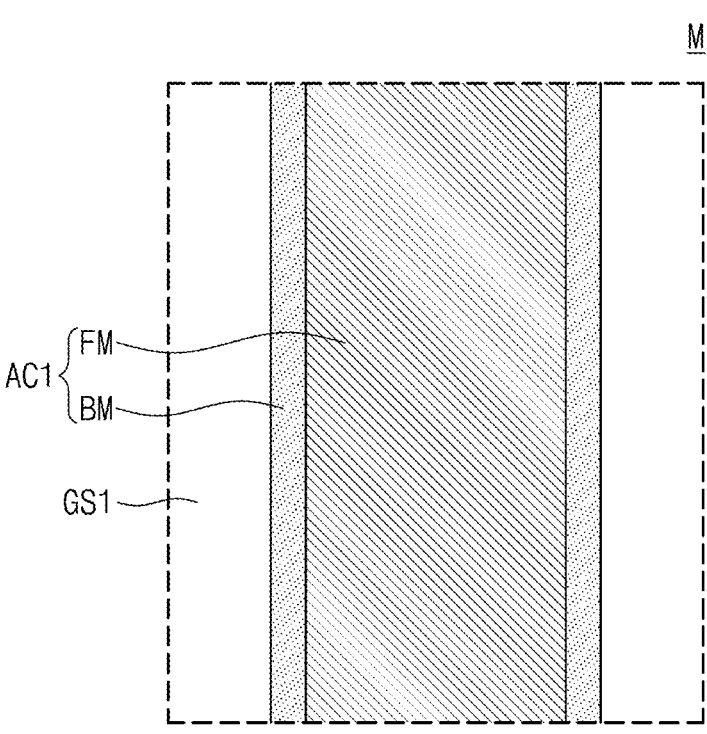
FIG. 6A is an enlarged sectional view illustrating a portion 'M' of FIG. 5C, according to an embodiment.
Figure 6B:
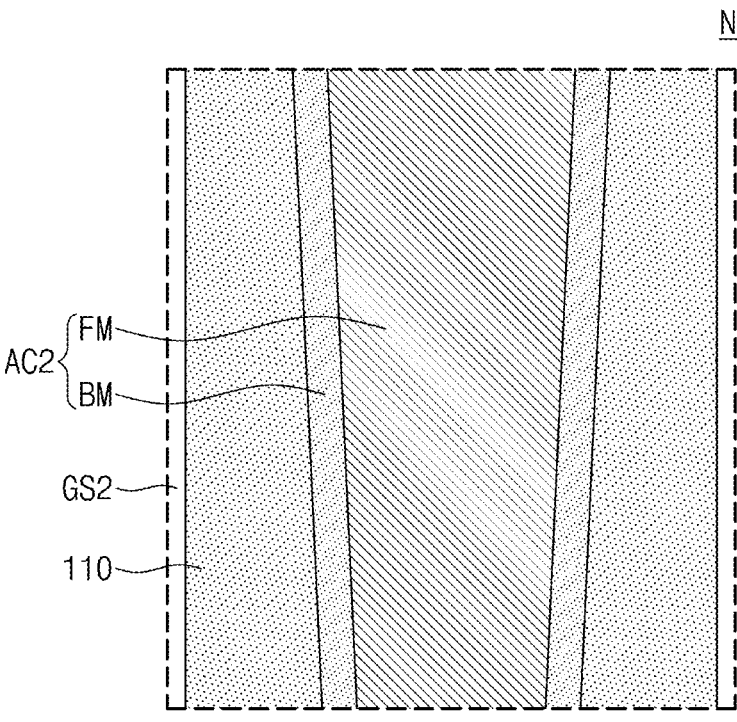
FIG. 6B is an enlarged sectional view illustrating a portion 'N' of FIG. 5C, according to an embodiment.
Figure 5F:
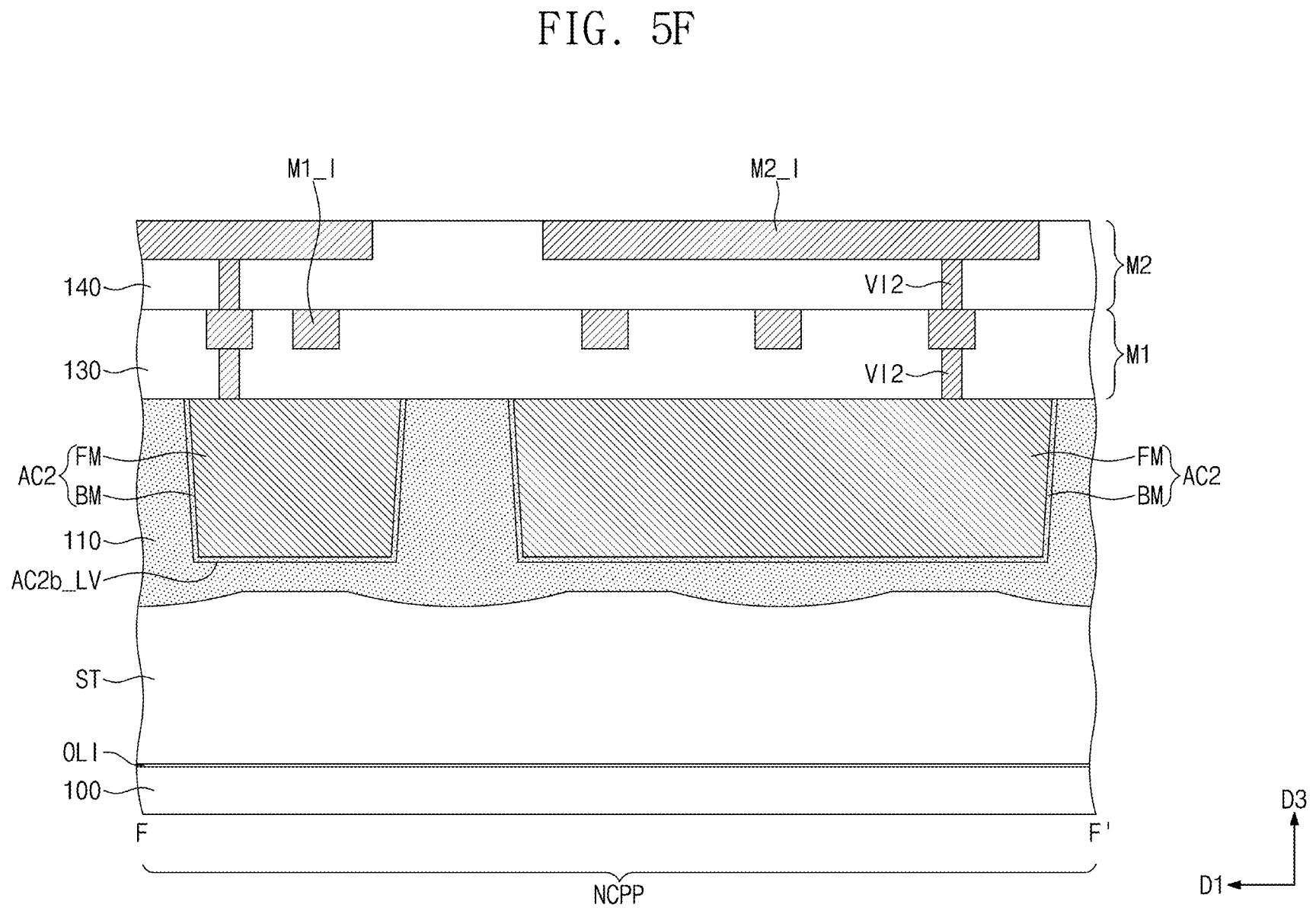

As shown in FIG. 5G, a second gate insulating layer GI2 may be interposed between the dummy gate electrode GE2 and the device isolation layer ST. As shown in FIGS. 5A to 5C, the second gate insulating layer GI2 may be extended into a region between the dummy gate electrode GE2 and the second gate spacer GS2. In some embodiments, the second gate insulating layer GI2 may be provided on the dummy region NCPP to cover a top surface of the device isolation layer ST placed below the dummy gate electrode GE2.

The second gate insulating layer GI2 may be formed of and/or include at least one of the afore-described materials for the first gate insulating layer GI1. For example, the second gate insulating layer GI2 may be formed of and/or include at least one of silicon oxide, silicon oxynitride, and/or high-k dielectric materials. The high-k dielectric layer may be formed of and/or include at least one of high-k dielectric materials whose dielectric constants are higher than that of silicon oxide. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

In an embodiment, the second gate insulating layer GI2 may include a ferroelectric layer having a ferroelectric property and a paraelectric layer having a paraelectric property. The ferroelectric and paraelectric layers may be provided to have substantially the same features as the ferroelectric and paraelectric layers described in reference to the first gate insulating layer GI1.

The dummy gate electrode GE2 may include a third metal pattern and a fourth metal pattern on the third metal pattern. The third metal pattern may be provided on the second gate insulating layer GI2 and may be adjacent to the device isolation layer ST and the second gate spacer GS2. The third metal pattern may be formed of and/or include at one of the afore-described metallic materials for the first metal pattern. That is, the third metal pattern may be formed of and/or include a same metallic material and/or a different metallic material that the first metal pattern. The fourth metal pattern may be formed of and/or include at one of the afore-described metallic materials for the second metal pattern. That is, the fourth metal pattern may be formed of and/or include a same metallic material and/or a different metallic material that the second metal pattern.

Referring to FIGS. 5C and 5F, the first interlayer insulating layer 110 may be provided to cover a side surface of the second gate spacer GS2 on the dummy region NCPP. Alternatively or additionally, the first interlayer insulating layer 110 may cover the top surface of the device isolation layer ST.

Referring back to FIGS. 4 and 5A to 5G, the dummy contact AC2 may be provided on the dummy region NCPP to be partially inserted into the first interlayer insulating layer 110. A pair of dummy contacts AC2 may be respectively provided at both sides of the dummy gate electrode GE2. In some embodiments, the dummy contact AC2 may not be provided on a side surface of the outermost dummy gate electrode GE2 in the second direction D2. As shown in FIG. 6B, the first interlayer insulating layer 110 may be interposed between the dummy contact AC2 and the second gate spacer GS2. The first interlayer insulating layer 110 may cover a side surface of the dummy contact AC2. When viewed in a plan view, the dummy contact AC2 may be a bar-shaped pattern that is extended in the first direction D1. In an embodiment, a thickness of the dummy contact AC2 in the second direction D2 may increase as a height in the third direction D3 increases. That is, the thickness of the dummy contact AC2 in the second direction D2 may increases as a distance from a bottom surface of the dummy contact AC2 increases in a direction toward a top surface thereof. The side surface of the dummy contact AC2 may have an angle, which may be equal to or smaller than 90°, to the top surface of the substrate 100.

An angle of the side surface of the active contact AC1 to the top surface of the substrate 100 may be larger than an angle of the side surface of the dummy contact AC2 to the top surface of the substrate 100. This may be because the active contact AC1 may be formed by a wet etching process and the dummy contact AC2 may be formed by a dry etching process.

The dummy contact AC2 may include the conductive pattern FM and the barrier pattern BM enclosing the conductive pattern FM. For example, the conductive pattern FM may be formed of and/or include at least one of metallic materials (e.g., aluminum, copper, tungsten, molybdenum, and cobalt). The barrier pattern BM may be provided to cover side and bottom surfaces of the conductive pattern FM. In an embodiment, the barrier pattern BM may include a metal layer and a metal nitride layer. The metal layer may be formed of and/or include at least one of titanium, tantalum, tungsten, nickel, cobalt, and platinum. The metal nitride layer may be formed of and/or include at least one of titanium nitride (TiN), tantalum nitride (TaN), tungsten nitride (WN), nickel nitride (NiN), cobalt nitride (CoN), and platinum nitride (PtN).

A dam structure DAM may be provided on the border region DAMR of the substrate 100 to be partially inserted into the first interlayer insulating layer 110. A level DAMb_LV of a bottom surface of the dam structure DAM may be higher than the level of the top surface of the device isolation layer ST. In an embodiment, a thickness of the dam structure DAM in the second direction D2 may increase as a distance in the third direction D3 increases. That is, the thickness of the dam structure DAM in the second direction D2 may increase in an upward direction from the bottom surface of the dam structure DAM toward the top surface.

The dam structure DAM may be formed of and/or include a material having an etch selectivity with respect to the first interlayer insulating layer 110. For example, the dam structure DAM may be formed of and/or include at least one of SiON, SiCN, SiCON, and SiN.

The dam structure DAM, the active and dummy contacts AC1 and AC2, the division structure DB, the first interlayer insulating layer 110, the first and second gate capping patterns GP1 and GP2, and the first gate spacer GS1 and the second gate spacer GS2 may have top surfaces that are coplanar to each other.

The level DAMb_LV of the bottom surface of the dam structure DAM may be lower than a level AC1b_LV of a bottom surface of the active contact AC1 and a level AC2b_LV of the bottom surface of the dummy contact AC2. The level AC2b_LV of the bottom surface of the dummy contact AC2 may be lower than or equal to the level AC1b_LV of the bottom surface of the active contact AC1.

According to an embodiment, the dam structure DAM may be provided in the border region DAMR between the cell and dummy regions CPP and NCPP of the substrate 100. The level DAMb_LV of the bottom surface of the dam structure DAM may be lower than the level AC1b_LV of the bottom surface of the active contact AC1 and the level AC2b_LV of the bottom surface of the dummy contact AC2. Accordingly, it may be possible to form the active contact AC1 in the cell region CPP, in which a pitch between gate electrodes is small, through a wet etching process, and thereby to reduce a process difficulty in the fabrication process. That is, it may be possible to form fine patterns of the semiconductor device and thereby to improve reliability and electric characteristics of the semiconductor device.

A second interlayer insulating layer 130 may be provided on the first interlayer insulating layer 110 to cover the first and second gate capping patterns GP1 and GP2, the active and dummy contacts AC1 and AC2, the first gate spacer GS1 and the second gate spacer GS2, the division structure DB, and the dam structure DAM. A third interlayer insulating layer 140 may be provided on the second interlayer insulating layer 130. At least one of the second and third interlayer insulating layers 130 and 140 may include a silicon oxide layer.

A first metal layer M1 may be provided in the second interlayer insulating layer 130. In an embodiment, the first metal layer M1 may include the first power line M1_R1, the second power line M1_R2, and the third power line M1_R3, which may be provided on the cell region CPP. Alternatively or additionally, the first metal layer M1 may include first interconnection lines M1_I, which may be provided on the cell region CPP, the dummy region NCPP, and the border region DAMR.

For example, the first and second power lines M1_R1 and M1_R2 may be provided on the third and fourth borders BD3 and BD4 of the first single height cell SHC1, respectively. Alternatively or additionally, the first power line M1_R1 may be extended along the third border BD3 and in the second direction D2. In some embodiments, the second power line M1_R2 may be extended along the fourth border BD4 and in the second direction D2.

The first metal layer M1 may further include first vias VI1. The first vias VI1 may be respectively provided below the interconnection lines M1_R1, M1_R2, M1_R3, and M1_I of the first metal layer M1. The active contact AC1 and the interconnection line of the first metal layer M1 may be electrically connected to each other through the first via VI1. Alternatively or additionally, the gate contact GC and the interconnection line of the first metal layer M1 may be electrically connected to each other through the first via VI1. In some embodiments, the dummy contact AC2 and the interconnection line of the first metal layer M1 may be electrically connected to each other through the first via VI1.

The interconnection line of the first metal layer M1 and the first via VI1 thereunder may be formed by separate processes. For example, the interconnection line and the first via VI1 of the first metal layer M1 may be independently formed by respective single damascene processes. The semiconductor device, according to the present disclosure, may be fabricated using a sub-20 nm process.

A second metal layer M2 may be provided in the third interlayer insulating layer 140. The second metal layer M2 may include a plurality of second interconnection lines M2_I. Each of the second interconnection lines M2_I of the second metal layer M2 may be a line- or bar-shaped pattern extending in the first direction D1. That is, the second interconnection lines M2_I may be extended in the first direction D1 and may be parallel to each other.

The second metal layer M2 may further include second vias VI2, which may be respectively provided below the second interconnection lines M2_I. The interconnection lines of the first and second metal layers M1 and M2 may be electrically connected to each other through the second via VI2. The interconnection line of the second metal layer M2 and the second via VI2 thereunder may be formed together by a dual damascene process.

The interconnection lines of the first metal layer M1 may be formed of and/or include a conductive material that is the same as or different from that of the second metal layer M2. For example, the interconnection lines of the first metal layer M1 and the second metal layer M2 may be formed of and/or include at least one of metallic materials, such as, but not limited to, aluminum, copper, tungsten, molybdenum, and cobalt. In some embodiments, a plurality of metal layers (e.g., M3, M4, M5, and the like, not shown) may be additionally stacked on the third interlayer insulating layer 140. Each of the stacked metal layers may include interconnection lines, which may be used as routing paths between cells.

Figure 9E:
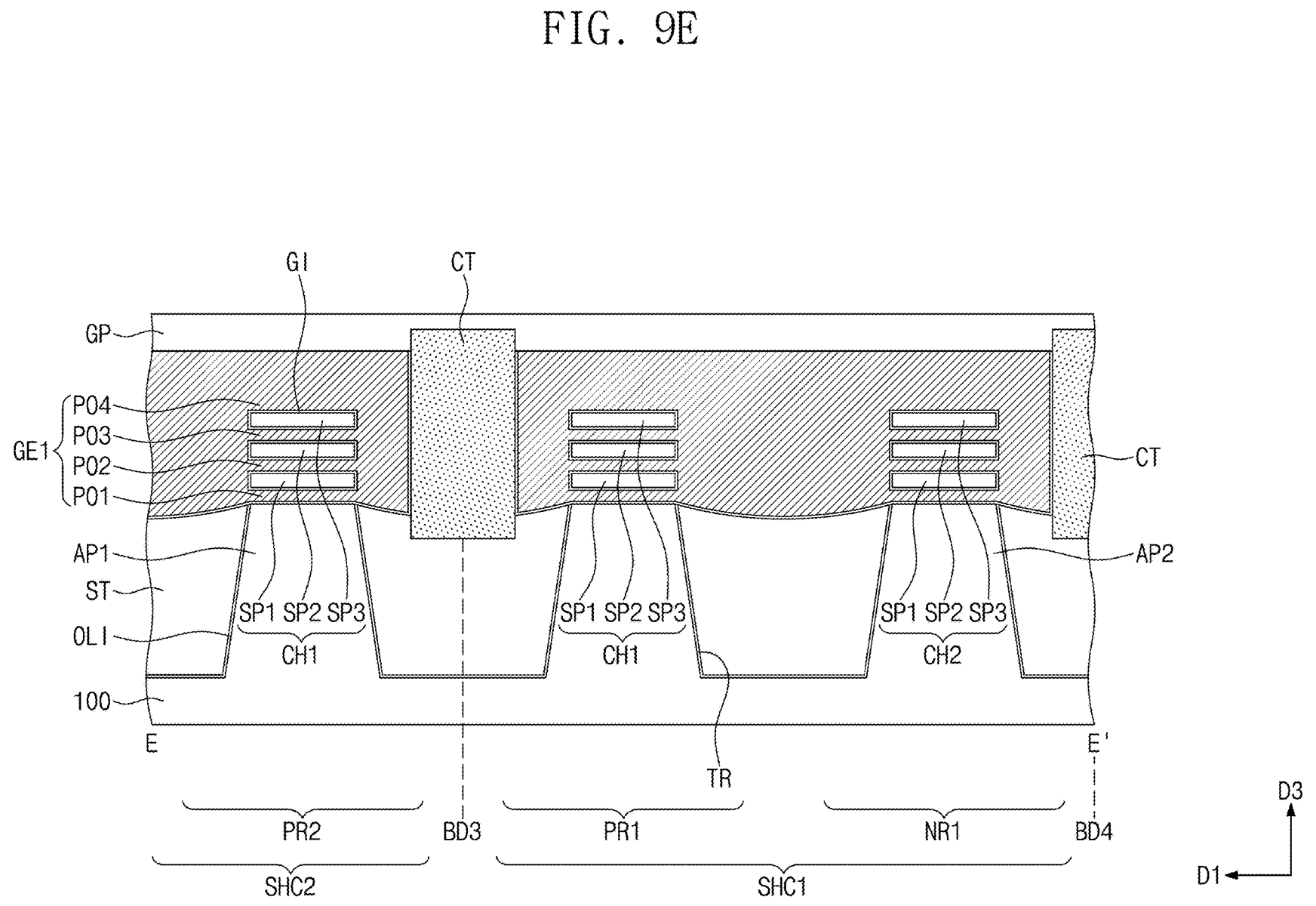
Figure 9F:
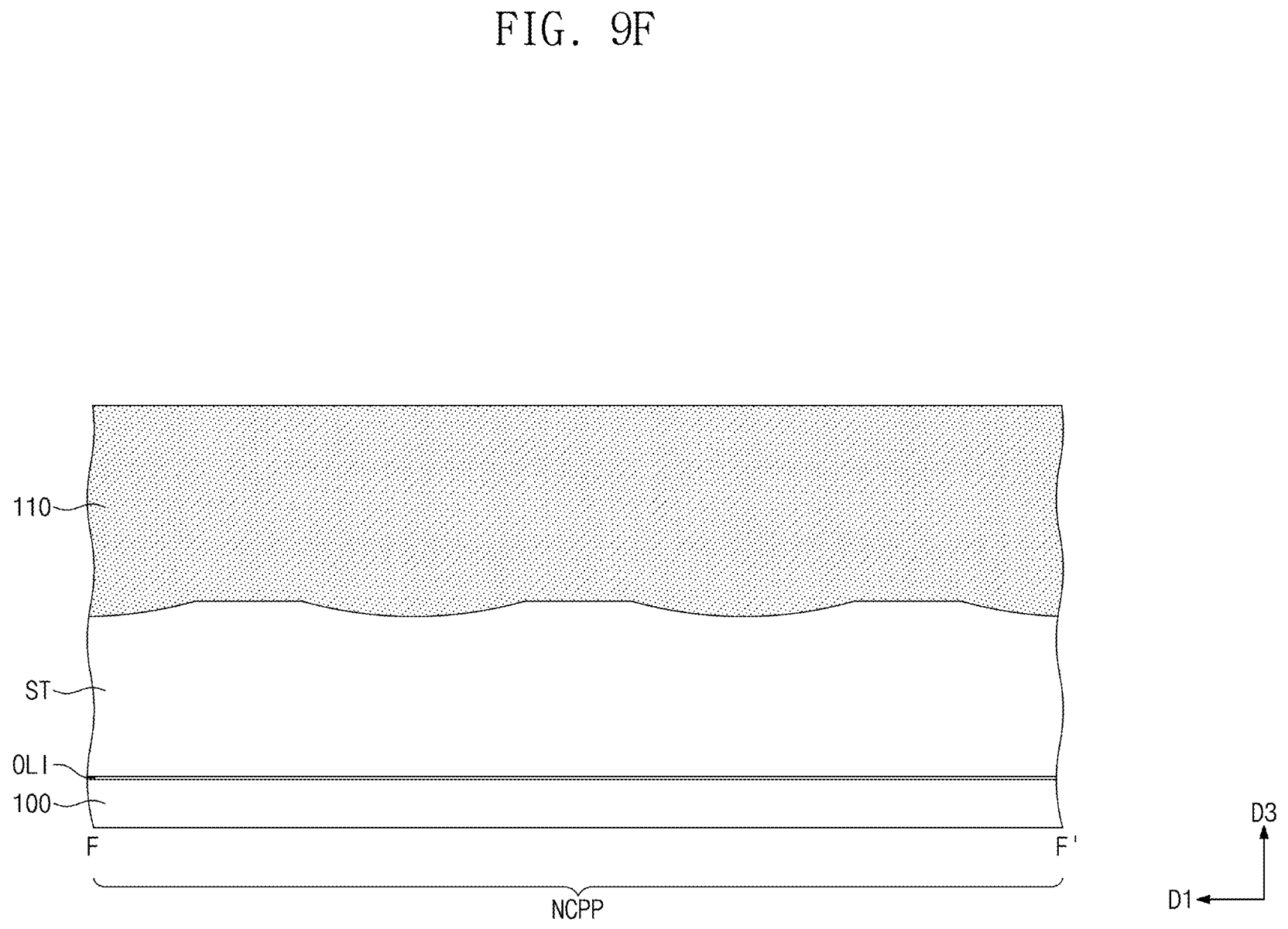
Figure 12D:
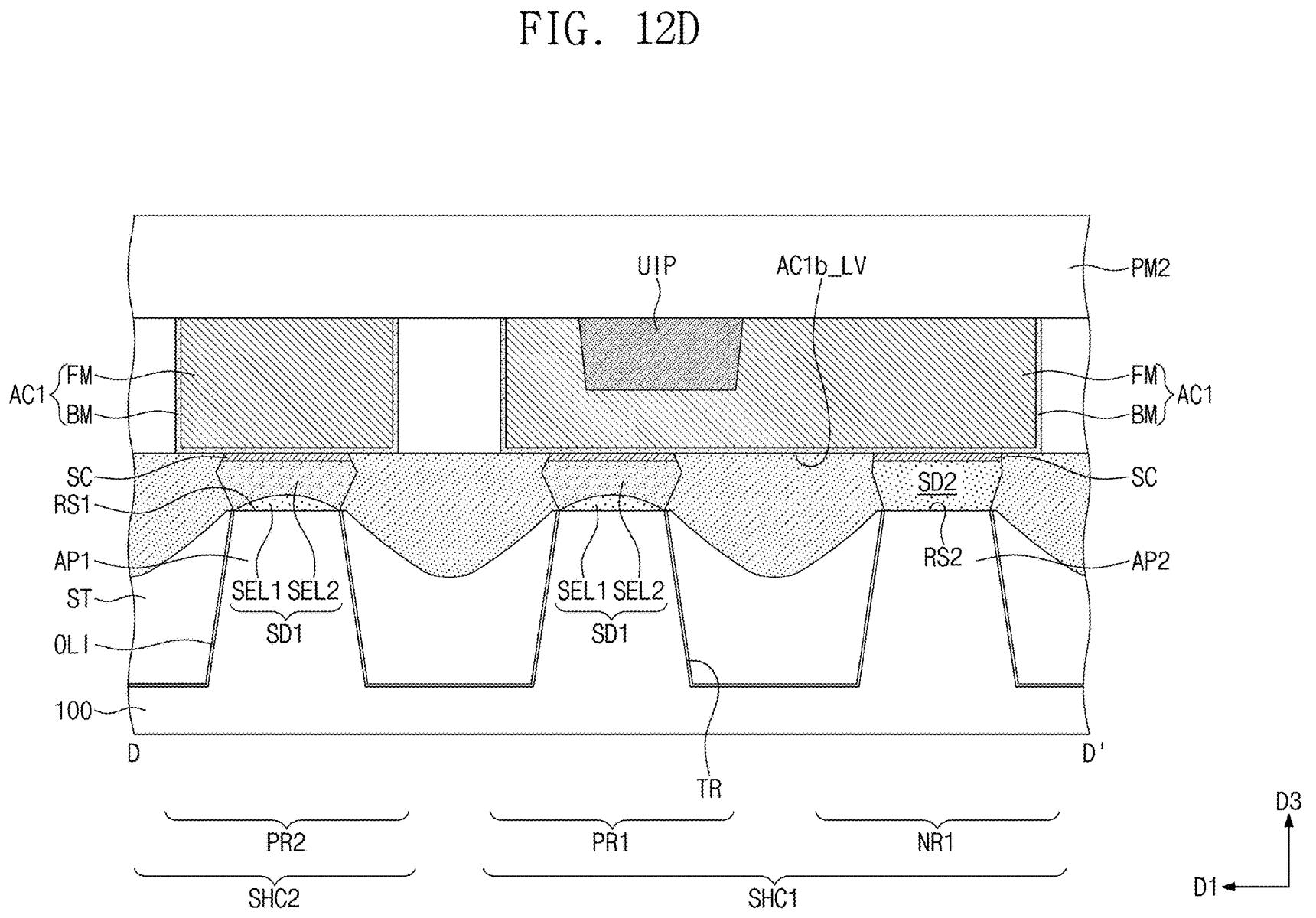
Figure 12E:
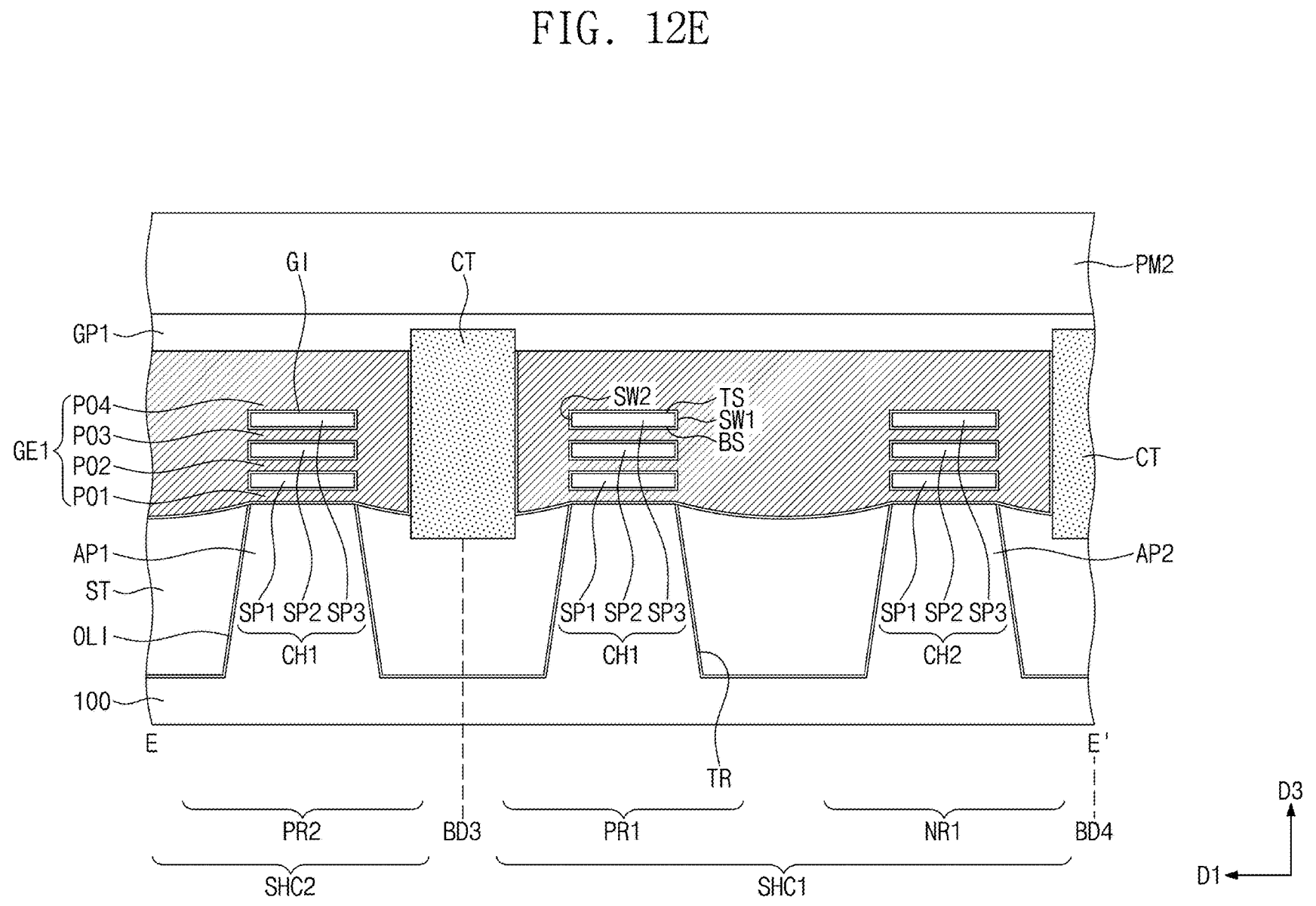

FIGS. 7A to 12G are sectional views illustrating a method of fabricating a semiconductor device, according to an embodiment. In detail, FIGS. 7A, 8A, 9A, 10A, 11A, and 12A are sectional views corresponding to the line A-A' of FIG. 4. FIGS. 8B, 9B, 10B, 11B, and 12B are sectional views corresponding to the line B-B' of FIG. 4. FIGS. 8C, 9C, 10C, 11C, and 12C are sectional views corresponding to the line C-C' of FIG. 4. FIGS. 8D, 9D, 11D, and 12D are sectional views corresponding to the line D-D' of FIG. 4. FIGS. 7B, 8E, 9E, 11E, and 12E are sectional views corresponding to the line E-E' of FIG. 4. FIGS. 9F, 11F, and 12F are sectional views corresponding to the line F-F' of FIG. 4. FIGS. 7C, 8F, 9G, 11G, and 12G are sectional views corresponding to the line G-G' of FIG. 4.

Figure 7A:
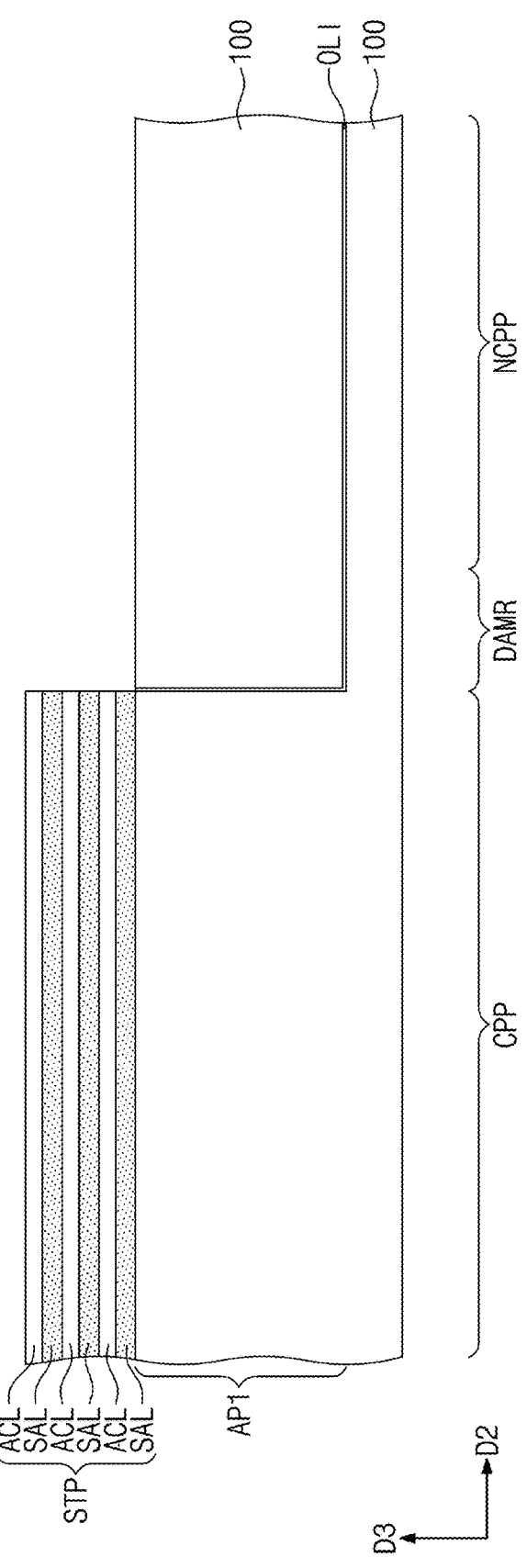
FIGS. 7A to 12G are sectional views illustrating a method of fabricating a semiconductor device, according to an embodiment.
Figure 7B:
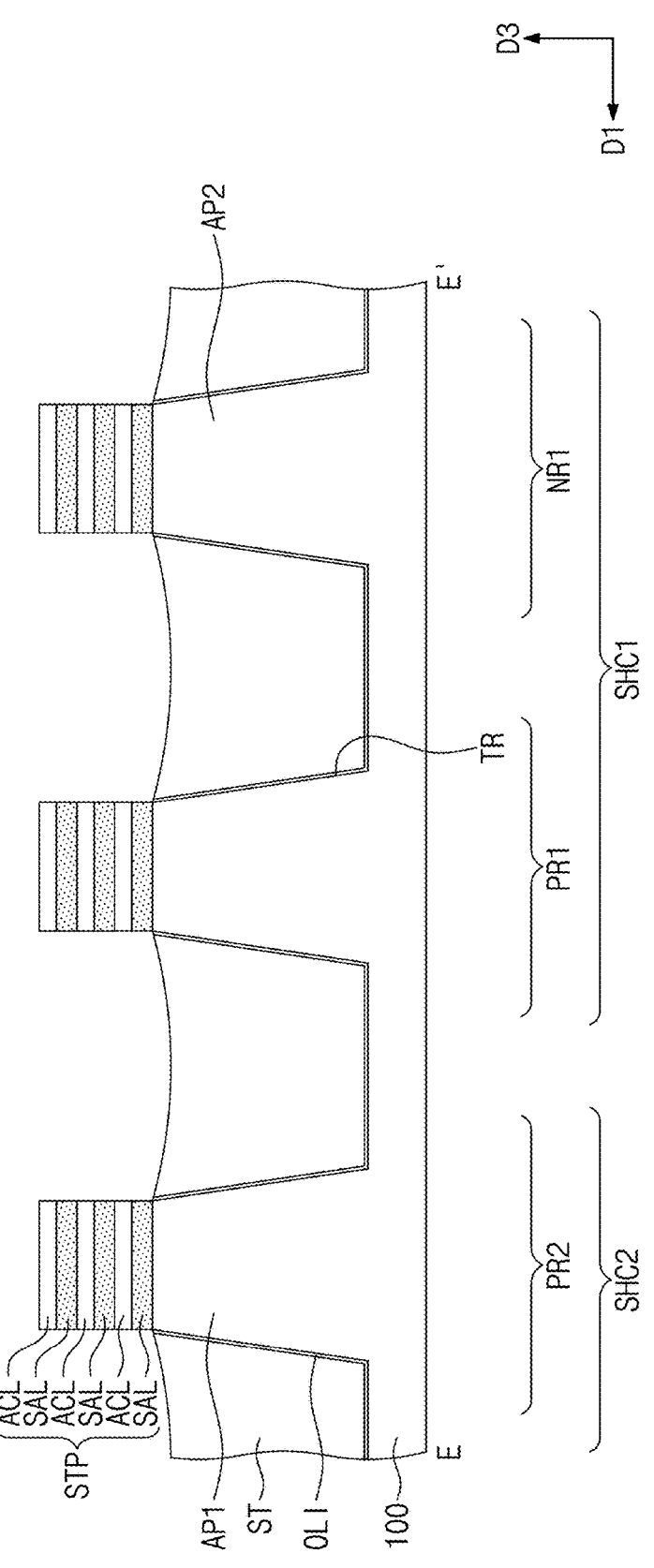
Figure 7C:
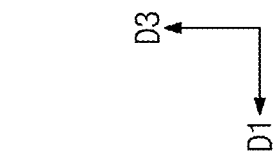
Figure 7C:
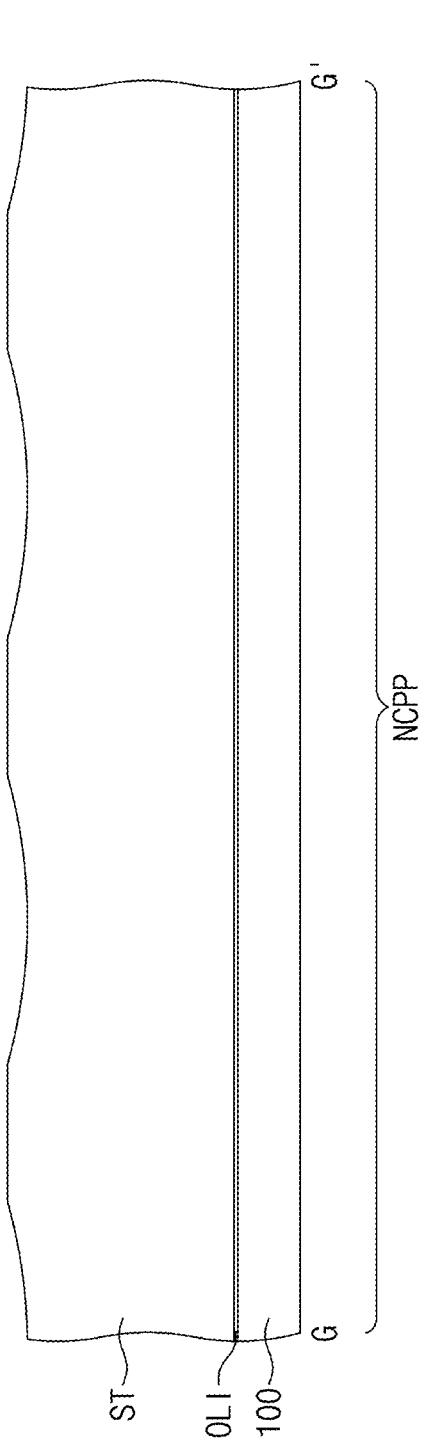

Referring to FIGS. 7A to 7C, the substrate 100 including the cell region CPP, the dummy region NCPP, and the border region DAMR may be provided. The substrate 100 may include the first PMOSFET region PR1 and the second PMOSFET region PR2, and the first NMOSFET region NR1 and the second NMOSFET region NR2, which may be provided on the cell region CPP. The sacrificial layers SAL and active layers ACL may be formed to be alternately stacked on the cell region CPP of the substrate 100. The sacrificial and active layers SAL and ACL may be formed of and/or include at least one of silicon (Si), germanium (Ge), or silicon germanium (SiGe), but the material of the active layers ACL may be different from that of the sacrificial layers SAL.

For example, the sacrificial layers SAL may be formed of and/or include silicon-germanium (SiGe), and the active layers ACL may be formed of and/or include silicon (Si). A germanium concentration of each of the sacrificial layers SAL may range from approximately 10 at % to approximately 30 at %.

Mask patterns may be respectively formed on the first PMOSFET region PR1 and the second PMOSFET region PR2, and the first NMOSFET region NR1 and the second NMOSFET region NR2 of the substrate 100. The mask pattern may be formed to expose the dummy region NCPP and the border region DAMR of the substrate 100. The mask pattern may be a line- or bar-shaped pattern that is extended in the second direction D2.

A patterning process using the mask patterns as an etch mask may be performed to form the trench TR defining the first active pattern AP1 and the second active pattern AP2. The first active pattern AP1 may be formed on each of the first PMOSFET region PR1 and the second PMOSFET region PR2. The second active pattern AP2 may be formed on each of the first NMOSFET region NR1 and the second NMOSFET region NR2. In the dummy region NCPP and the border region DAMR, the substrate 100 may have a top surface that is defined by the bottom surface of the trench TR.

A stacking pattern STP may be formed on each of the first active pattern AP1 and the second active pattern AP2. The stacking pattern STP may include the sacrificial layers SAL and the active layers ACL, which may be alternatingly stacked. The stacking pattern STP may be formed along with the first active pattern AP1 and the second active pattern AP2, during the patterning process.

The liner layer OLI may be formed in the trench TR and on the cell region CPP of the substrate 100. The liner layer OLI may be extended to the dummy region NCPP and the border region DAMR of the substrate 100. The liner layer OLI may be formed by an oxidation process of oxidizing the substrate 100.

The device isolation layer ST may be formed on the liner layer OLI to fill the trench TR. Alternatively or additionally, the device isolation layer ST may be formed on the dummy region NCPP and the border region DAMR. For example, an insulating layer may be formed on the substrate 100 to cover the first active pattern AP1, the second active pattern AP2, and the stacking patterns STP. In some embodiments, the device isolation layer ST may be formed by recessing the insulating layer to expose the stacking patterns STP.

The device isolation layer ST may be formed of and/or include an insulating material (e.g., silicon oxide). The stacking patterns STP may be exposed to the outside of the device isolation layer ST and may protrude above the device isolation layer ST. That is, the stacking patterns STP may be protruding patterns, which may be extended to a level higher the device isolation layer ST.

Referring to FIGS. 8A to 8F, sacrificial patterns PP may be formed on the substrate 100 to cross the stacking patterns STP. Alternatively or additionally, the sacrificial patterns PP may be formed on the dummy region NCPP. Each of the sacrificial patterns PP may be a line- or bar-shaped pattern that is extended in the first direction D1. The sacrificial patterns PP may be arranged, at a specific pitch, in the second direction D2.

For example, the formation of the sacrificial patterns PP may include forming a sacrificial layer on the substrate 100, forming hard mask patterns MP on the sacrificial layer, and patterning the sacrificial layer using the hard mask patterns MP as an etch mask. The sacrificial layer may be formed of and/or include polysilicon.

The first gate spacer GS1 may be formed on the cell region CPP and on the sacrificial patterns PP. The second gate spacer GS2 may be formed on the dummy region NCPP and on the sacrificial patterns PP.

The first recesses RS1 may be formed in the stacking pattern STP on the first active pattern AP1. The second recesses RS2 may be formed in the stacking pattern STP on the second active pattern AP2. Portions of the device isolation layer ST, which may be located at both sides of each of the first active pattern AP1 and the second active pattern AP2, may be further recessed, during the formation of the first and second recesses RS1 and RS2.

Figure 8A:
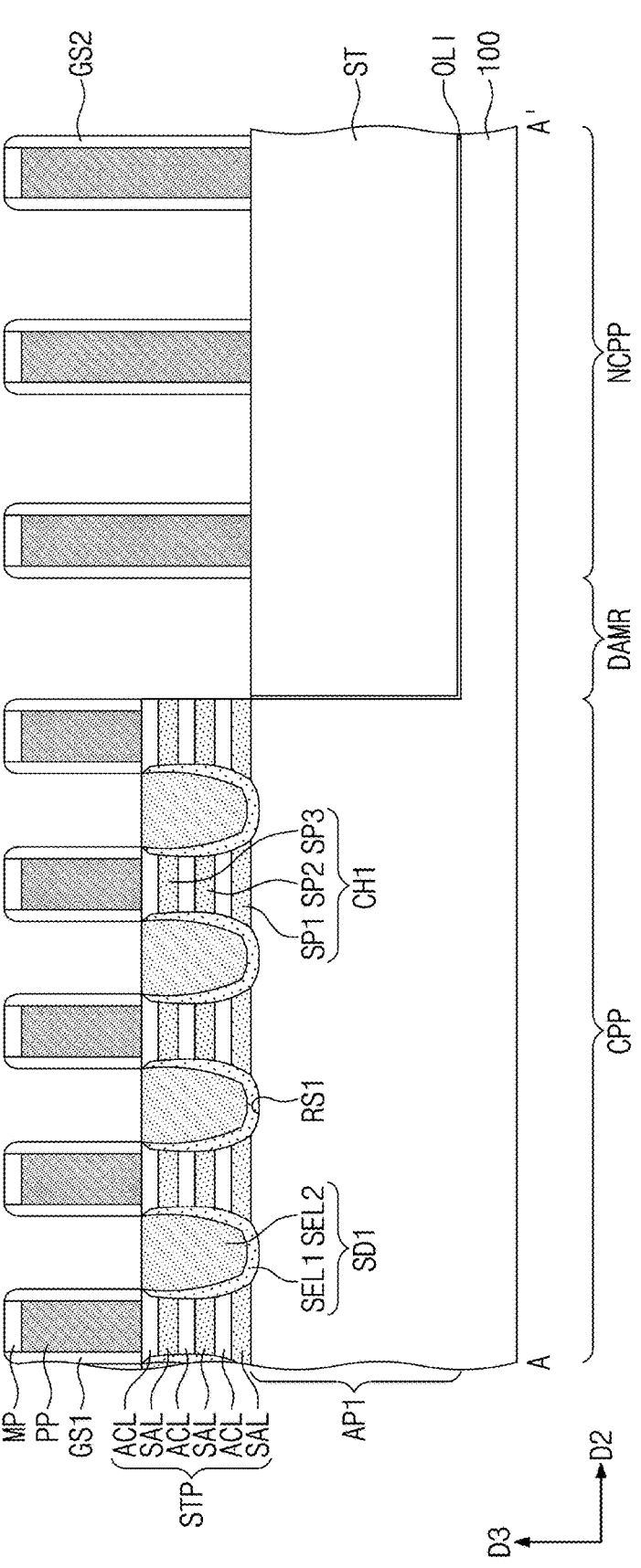
Figure 8B:
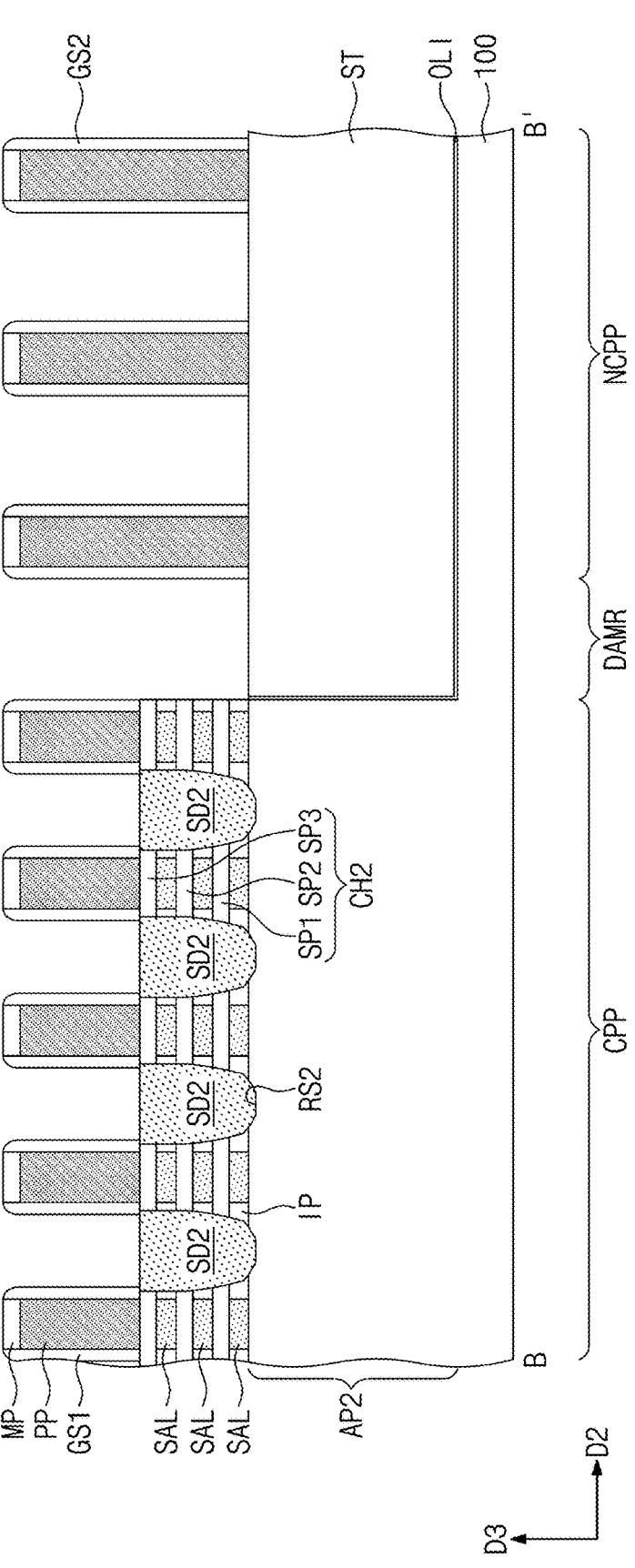
Figure 8C:
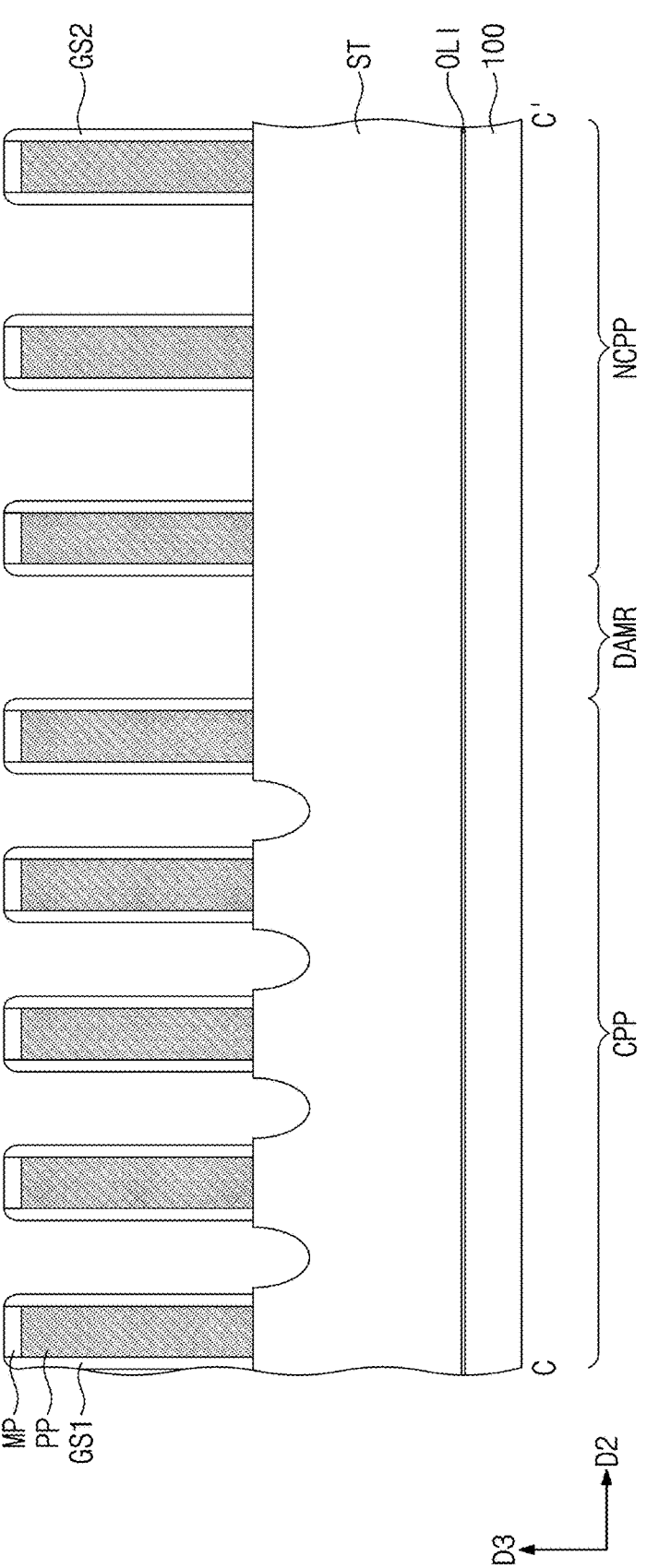
Figure 8D:
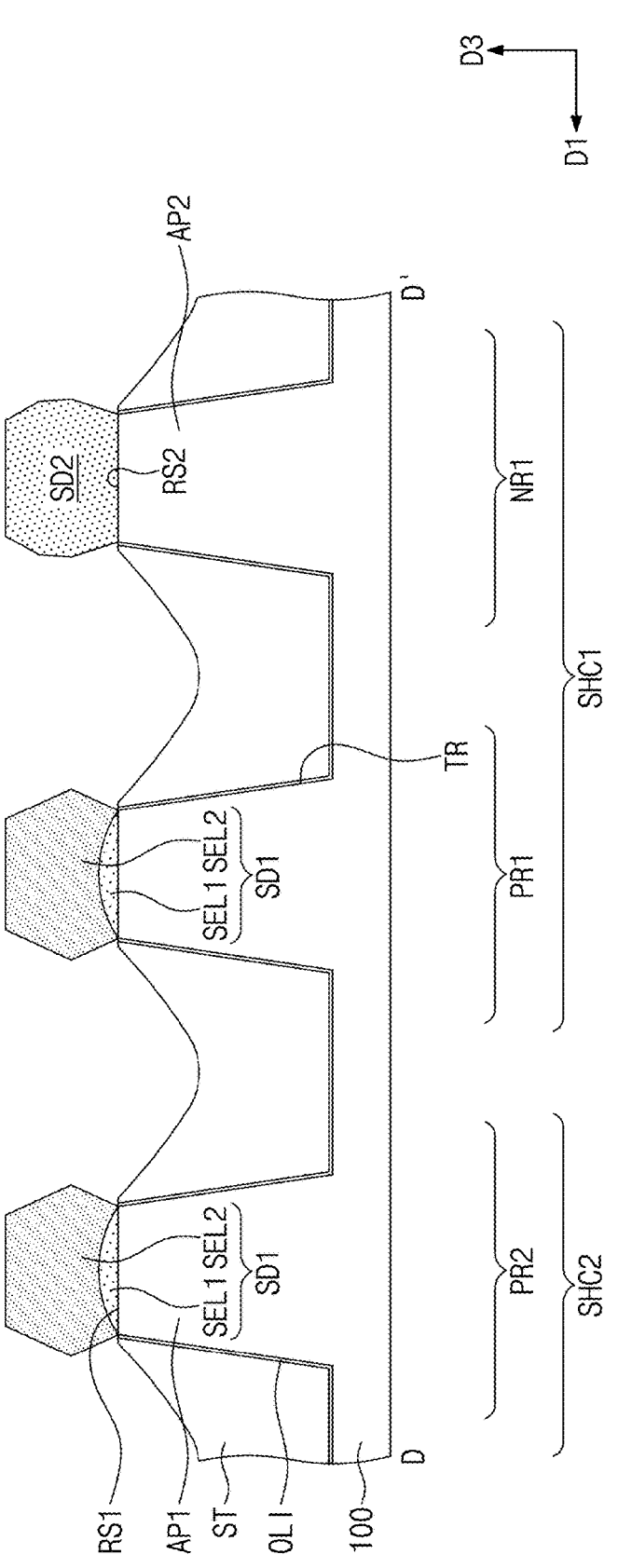
Figure 8E:
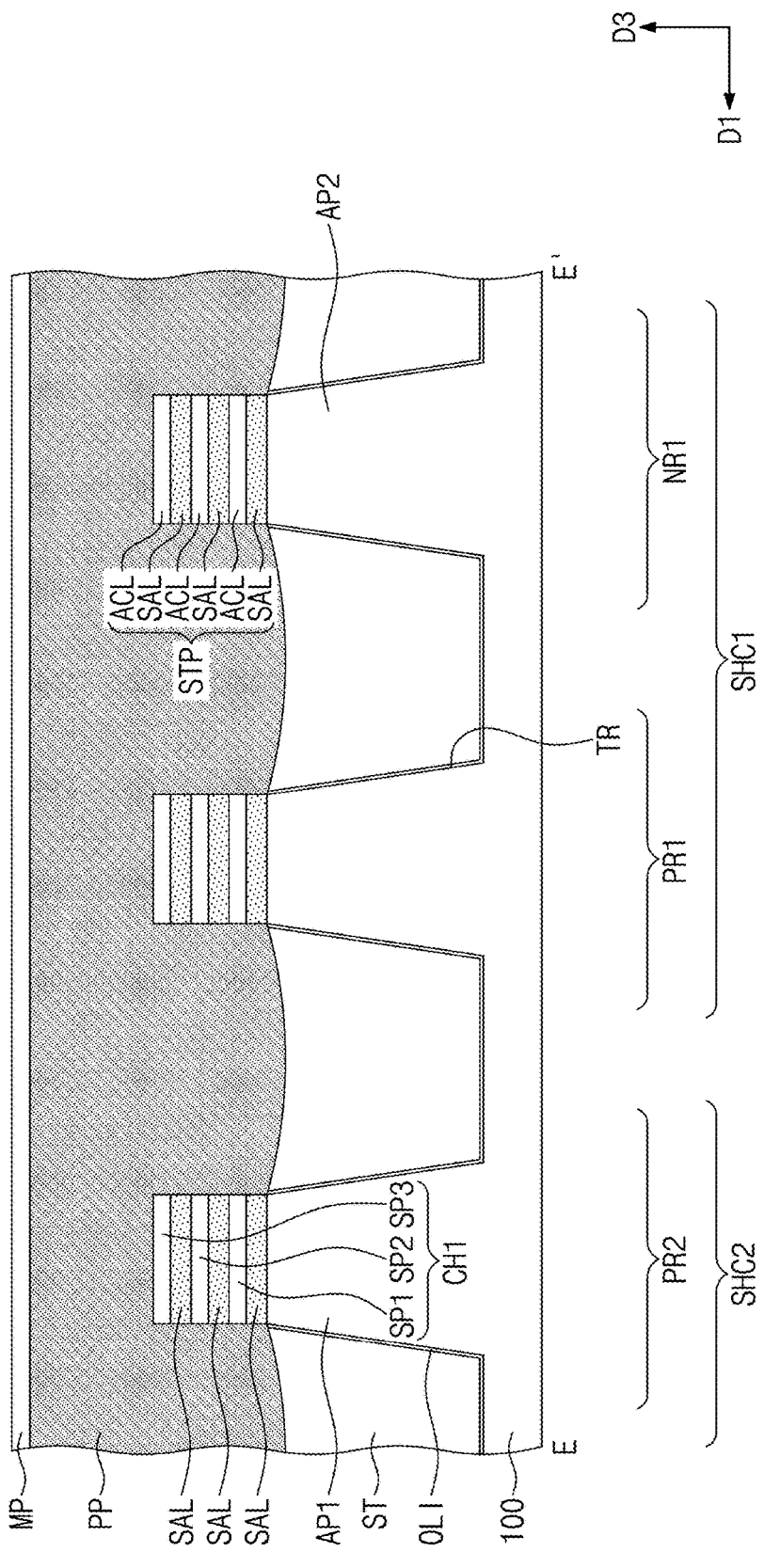
Figure 8F:
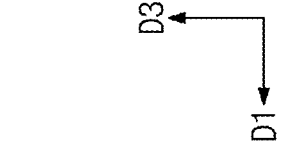
Figure 8F:
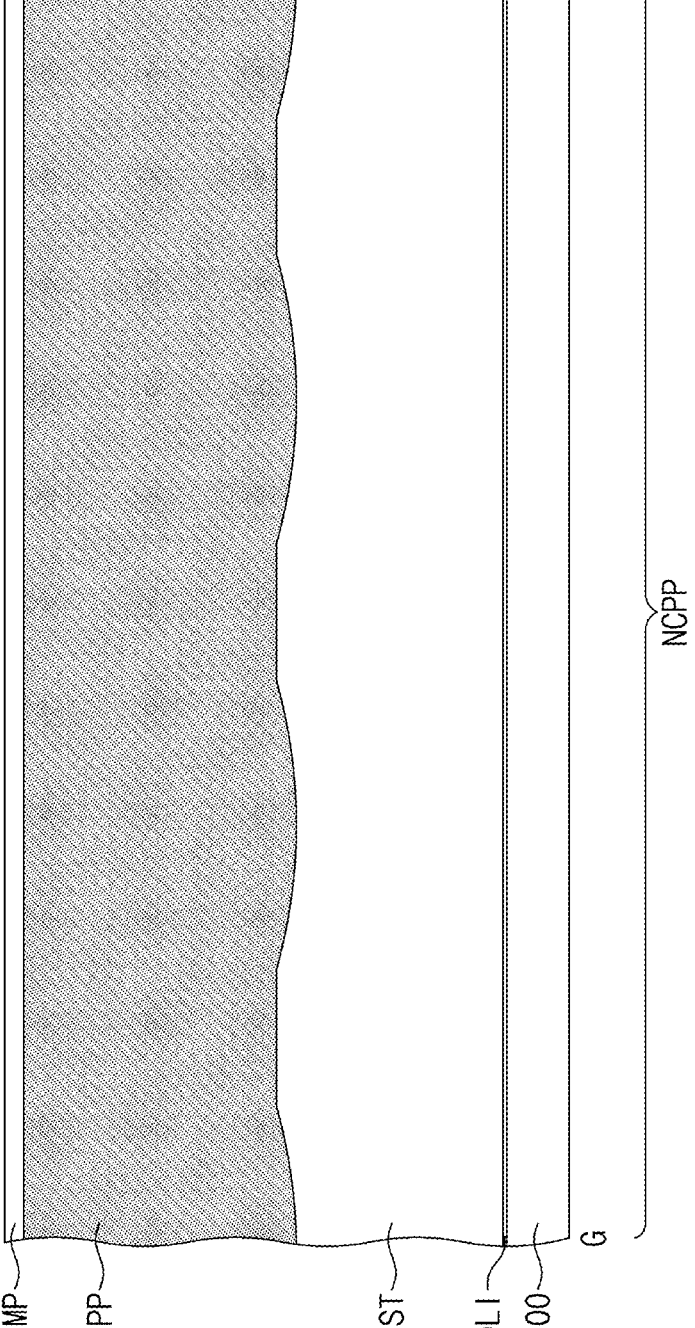
Figure 9A:
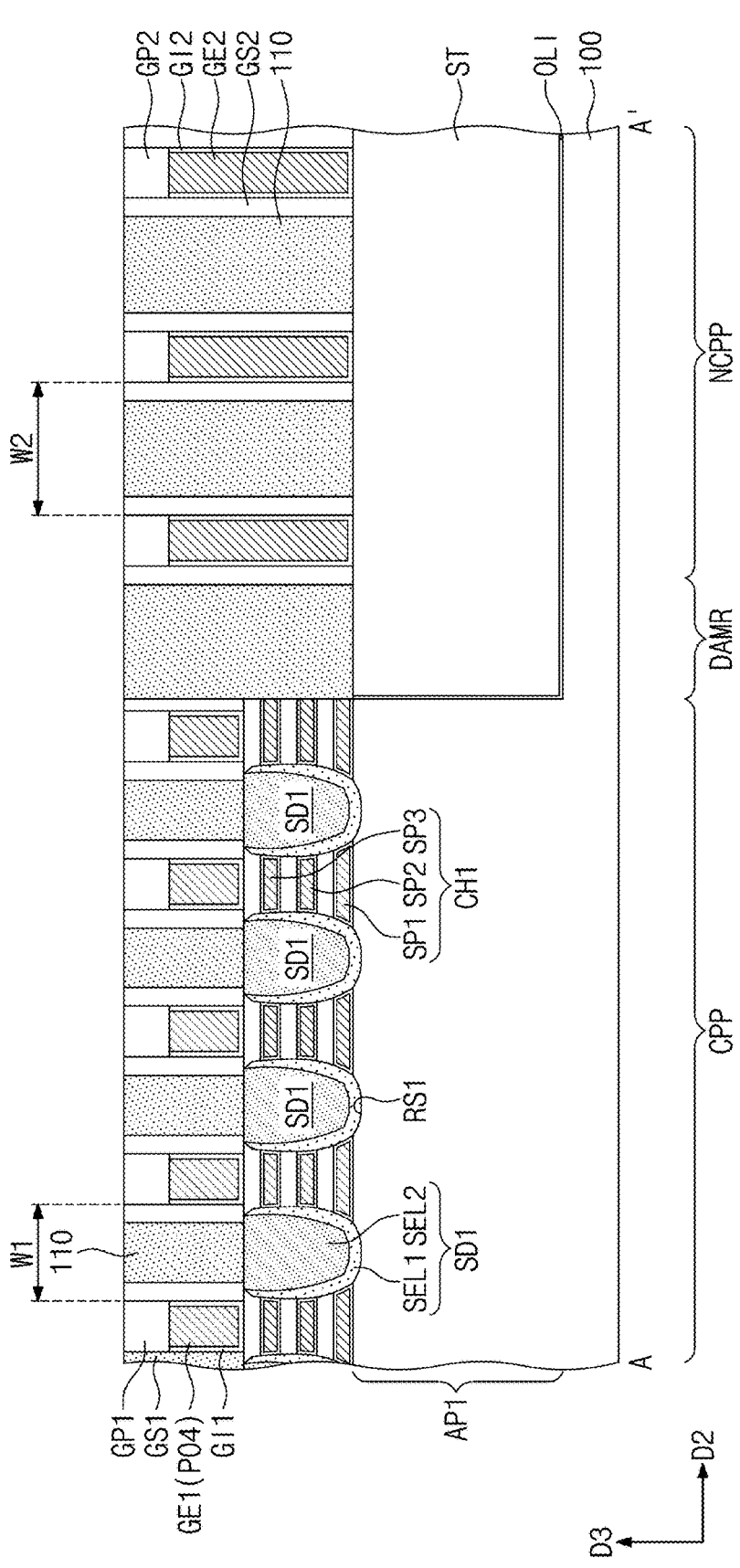
Figure 9B:
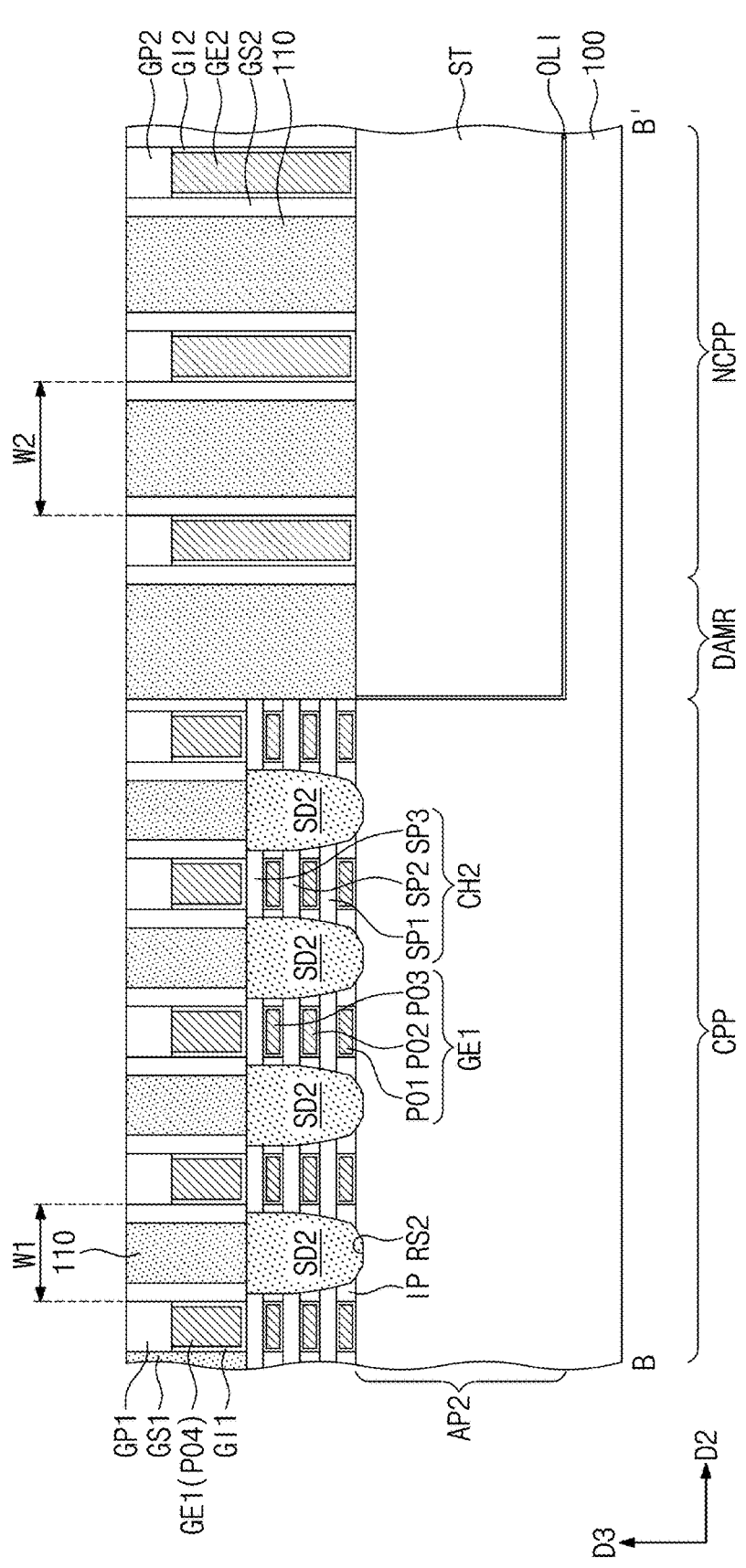
Figure 9C:
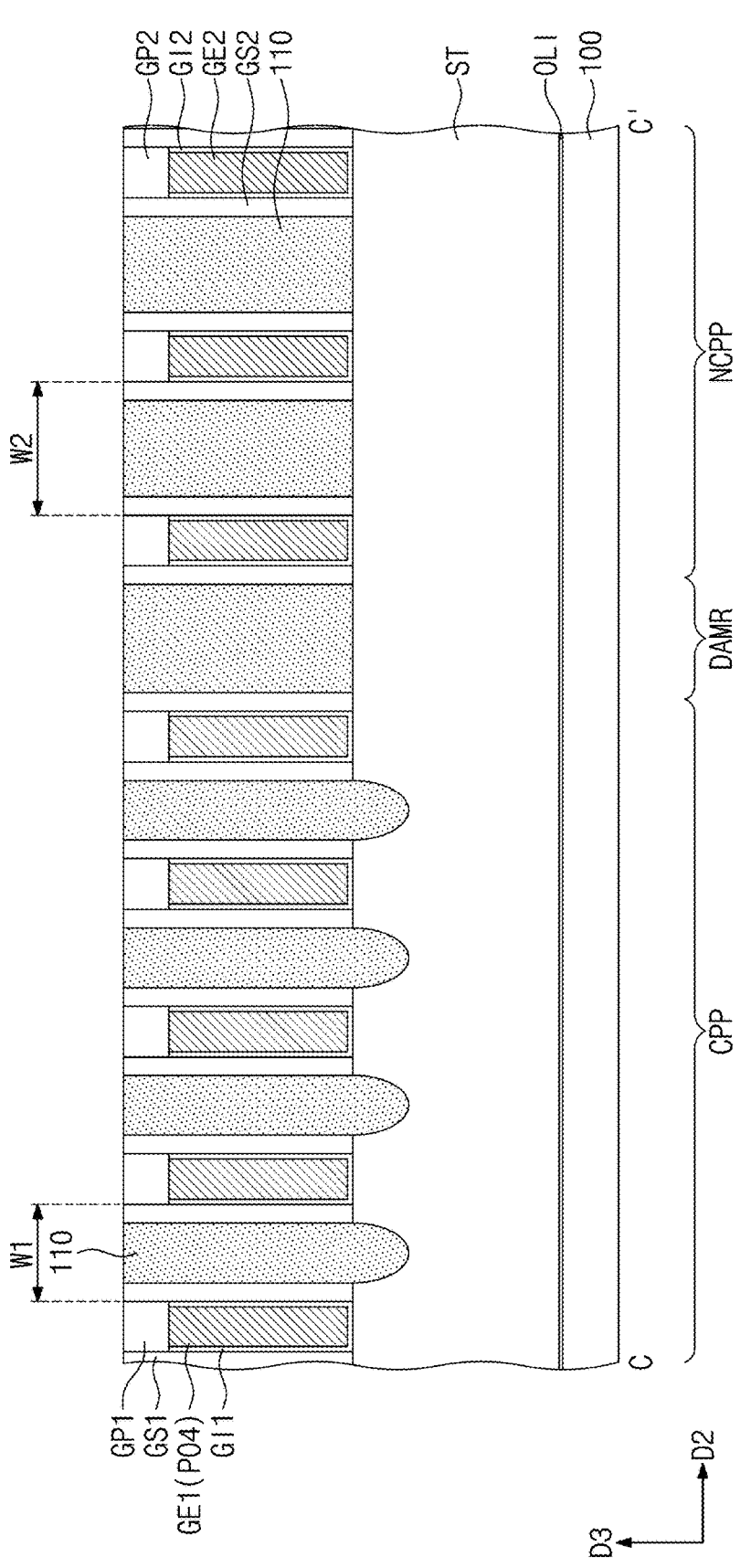
Figure 9D:
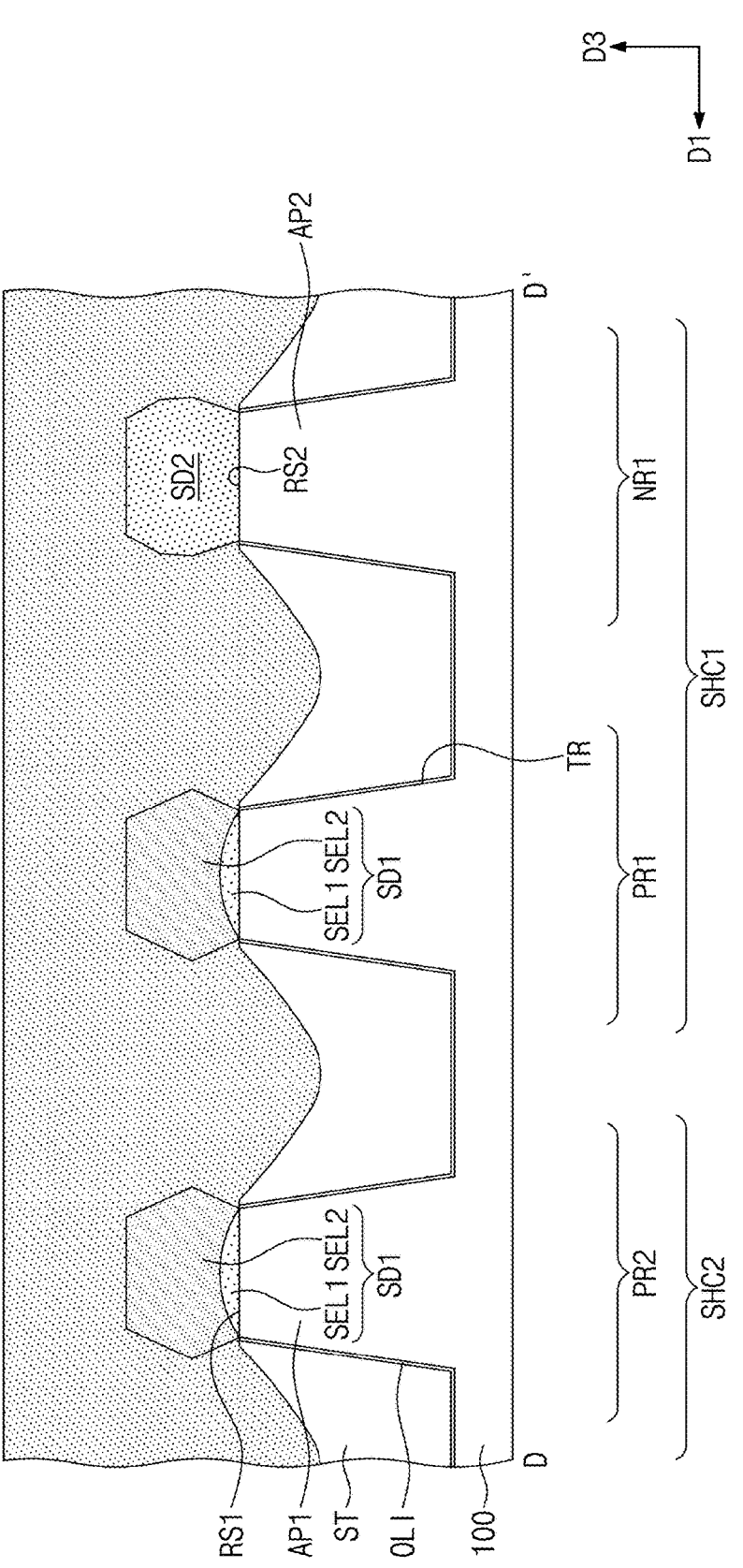
Figure 9G:
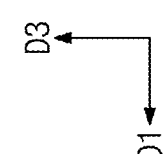
Figure 9G:
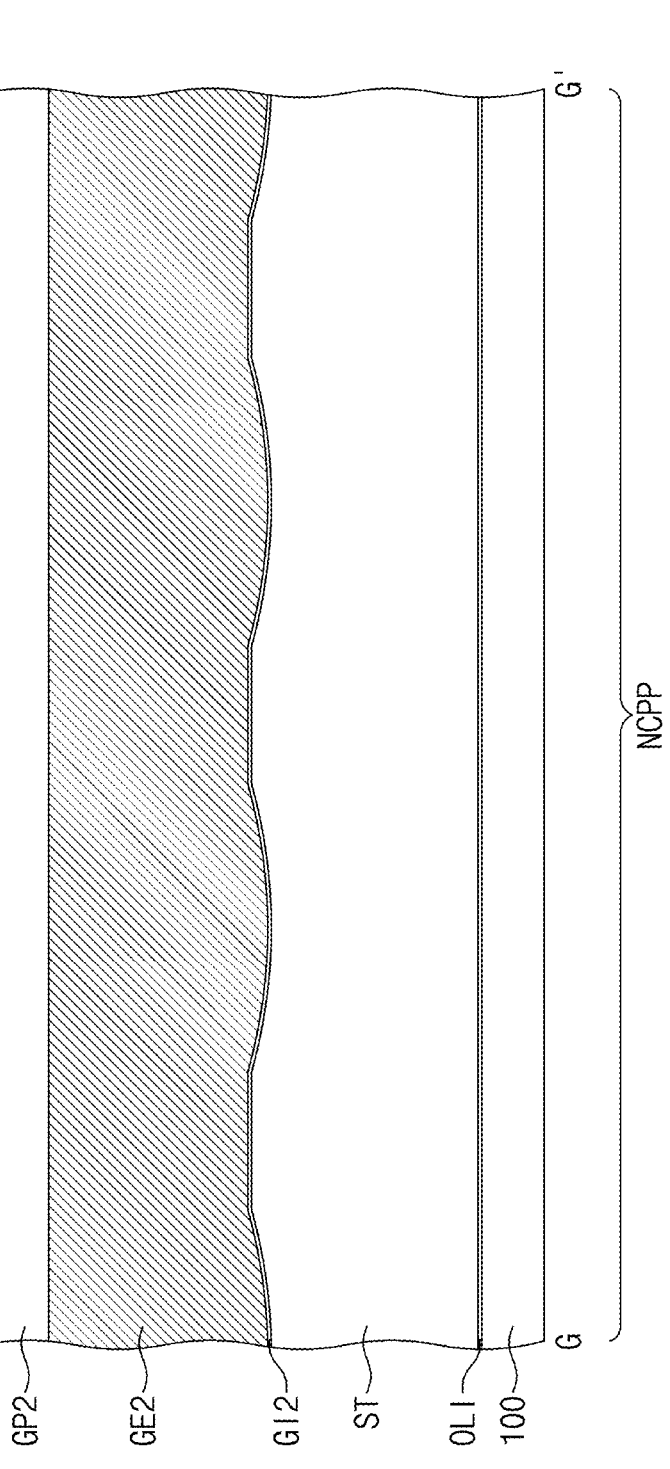

For example, the first recesses RS1 may be formed in the first PMOSFET region PR1 and the second PMOSFET region PR2 of the cell region CPP of the substrate 100. The first recess RS1 may be formed on the cell region CPP and between each pair of the sacrificial patterns PP. During the formation of the first recesses RS1, exposed portions of the device isolation layer ST may be recessed, as shown in FIG. 8C.

The first to third semiconductor patterns SP1, SP2, and SP3, which may be sequentially stacked between adjacent ones of the first recesses RS1, may be formed from the active layers ACL. The first to third semiconductor patterns SP1, SP2, and SP3 between adjacent ones of the first recesses RS1 may constitute the first channel pattern CH1.

The first source/drain patterns SD1 may be formed in the first recesses RS1, respectively. For example, the first semiconductor layer SEL1 may be formed by performing a first SEG process using an inner surface of the first recess RS1 as a seed layer. The first semiconductor layer SEL1 may be grown using the first to third semiconductor patterns SP1, SP2, and SP3 and the substrate 100, which may be exposed through the first recesses RS1, as a seed. In an embodiment, the first SEG process may include a chemical vapor deposition (CVD) process and/or a molecular beam epitaxy (MBE) process.

The second semiconductor layer SEL2 may be formed by performing a second SEG process on the first semiconductor layer SEL1 In some embodiments, the second semiconductor layer SEL2 may be formed to completely fill the first recess RS1.

The first semiconductor layer SEL1 and the second semiconductor layer SEL2 may constitute the first source/drain patterns SD1. The first semiconductor layer SEL1 and the second semiconductor layer SEL2 may be doped with impurities in situ during the first SEG process and/or the second SEG process. Alternatively or additionally, impurities may be injected into the first source/drain patterns SD1, after the formation of the first source/drain patterns SD1. The first source/drain patterns SD1 may be doped to have a first conductivity type (e.g., a p-type).

The second recesses RS1 may be formed in the first NMOSFET region NR1 and the second NMOSFET region NR2 of the cell region CPP of the substrate 100. The second recesses RS2 may be formed by the same method as the first recesses RS1 described above.

The first to third semiconductor patterns SP1, SP2, and SP3, which may be sequentially stacked between adjacent ones of the second recesses RS2, may be formed from the active layers ACL. The first to third semiconductor patterns SP1, SP2, and SP3 between adjacent ones of the second recesses RS2 may constitute the second channel pattern CH2.

The second source/drain patterns SD2 may be formed in the second recesses RS2, respectively. For example, the second source/drain patterns SD2 may be formed by performing a third SEG process, in which an inner surface of the second recess RS2 may be used as a seed layer. In an embodiment, the second source/drain patterns SD2 may be formed of and/or include the same semiconductor material (e.g., Si) as the substrate 100. The second source/drain patterns SD2 may be doped to have a second conductivity type (e.g., n-type). The inner spacers IP may be respectively formed between the second source/drain patterns SD2 and the sacrificial layers SAL.

Referring to FIGS. 9A to 9G, the first interlayer insulating layer 110 may be formed to cover the hard mask patterns MP and the first gate spacer GS1 and the second gate spacer GS2. The first interlayer insulating layer 130 may be formed on the border region DAMR. In an embodiment, the first interlayer insulating layer 110 may include a silicon oxide layer.

The first interlayer insulating layer 110 may be planarized to expose the top surfaces of the sacrificial patterns PP. The planarization of the first interlayer insulating layer 110 may be performed using an etch-back and/or chemical-mechanical polishing (CMP) process. All of the hard mask patterns MP may be removed during the planarization process. As a result, the first interlayer insulating layer 110 may be formed to have a top surface that is coplanar with the top surfaces of the sacrificial patterns PP and the top surface of the first gate spacer GS1.

A photolithography process may be performed to selectively open a region of the sacrificial pattern PP. For example, a region of the sacrificial pattern PP on the third and fourth borders BD3 and BD4 of the first single height cell SHC1 may be selectively opened. The opened region of the sacrificial pattern PP may be selectively etched and removed. The gate cutting pattern CT may be formed by filling a space, which may be formed by removing the sacrificial pattern PP, with an insulating material.

The exposed sacrificial patterns PP may be selectively removed. For example, an etching process may be performed in such a way that only the sacrificial layers SAL on the cell region CPP are selectively removed without etching of the first to third semiconductor patterns SP1, SP2, and SP3. The etching process may be chosen to exhibit a high etch rate for a material (e.g., SiGe) having a relatively high germanium concentration. For another example, the etching process may have a high etch rate for silicon-germanium whose germanium concentration is higher than approximately 10 at %. As a result of the etching process, the sacrificial patterns PP on the dummy region NCPP may also be removed.

The sacrificial layers SAL on the first PMOSFET region PR1 and the second PMOSFET region PR2 and the first NMOSFET region NR1 and the second NMOSFET region NR2 may be removed during the etching process. The etching process may be a wet etching process. An etchant material, which may be used in the etching process, may be chosen to quickly remove the sacrificial layer SAL having a relatively high germanium concentration. In some embodiments, since the first semiconductor layer SEL1 may have a relatively low germanium concentration, the first source/drain patterns SD1 on the first PMOSFET region PR1 and the second PMOSFET region PR2 may be protected from the etching process. Residue patterns RPP1 to RPP3 formed in the above processes may not be removed during the etching process, because the residue patterns RPP1 to RPP3 may also also include only polysilicon without germanium.

Since the sacrificial layers SAL are selectively removed, the stacked first to third semiconductor patterns SP1, SP2, and SP3 may be left on each of the first active pattern AP1 and the second active pattern AP2 on the cell region CPP.

The first gate insulating layer GI1 may be formed to cover the exposed surfaces of the first to third semiconductor patterns SP1, SP2, and SP3 on the cell region CPP. The second gate insulating layer GI2 may be formed to cover the exposed surface of the device isolation layer ST and the side surface of the second gate spacer GS2 on the dummy region NCPP. The cell gate electrode GE1 may be formed on the first gate insulating layer GI1. The dummy gate electrode GE2 may be formed on the second gate insulating layer GI2.

In an embodiment, the cell and dummy gate electrodes GE1 and GE2 may be recessed to have reduced heights. For example, an upper portion of the gate cutting pattern CT may be slightly recessed, when the cell gate electrode GE1 is recessed. Alternatively or additionally, the first and second gate capping pattern GP1 and GP2 may be formed in the recessed portions of the cell and dummy gate electrodes GE1 and GE2, respectively.

Figure 10A:
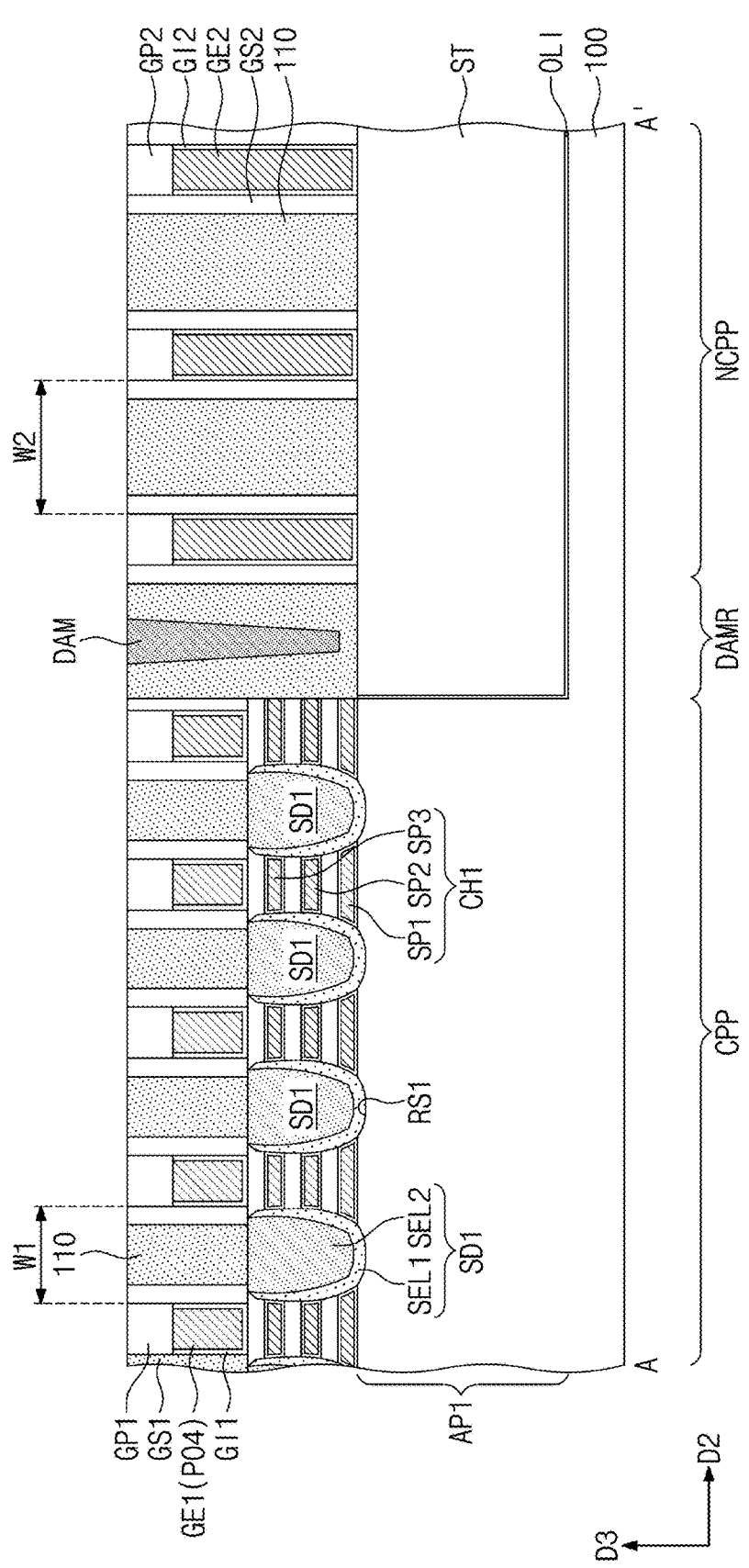
Figure 10B:
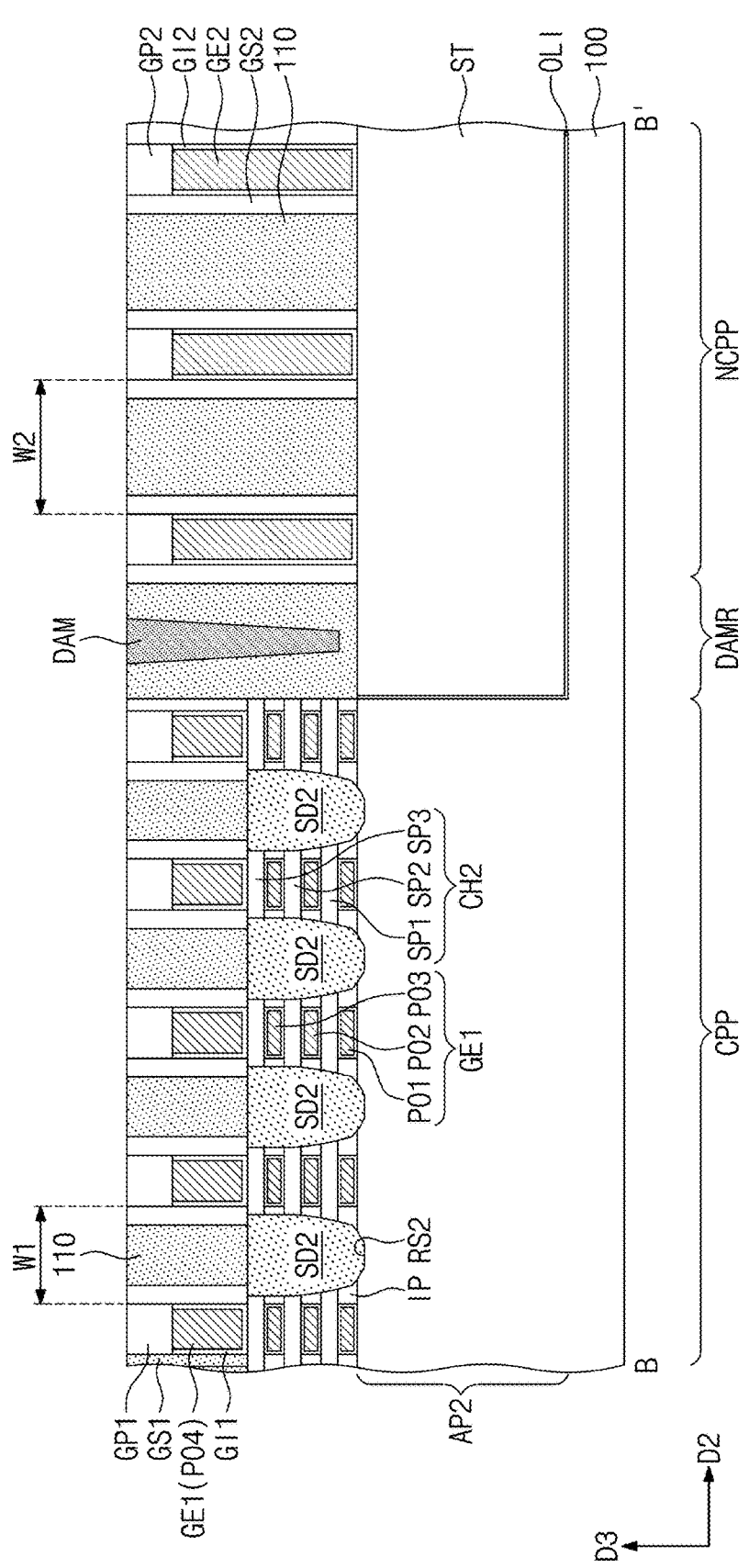
Figure 10C:
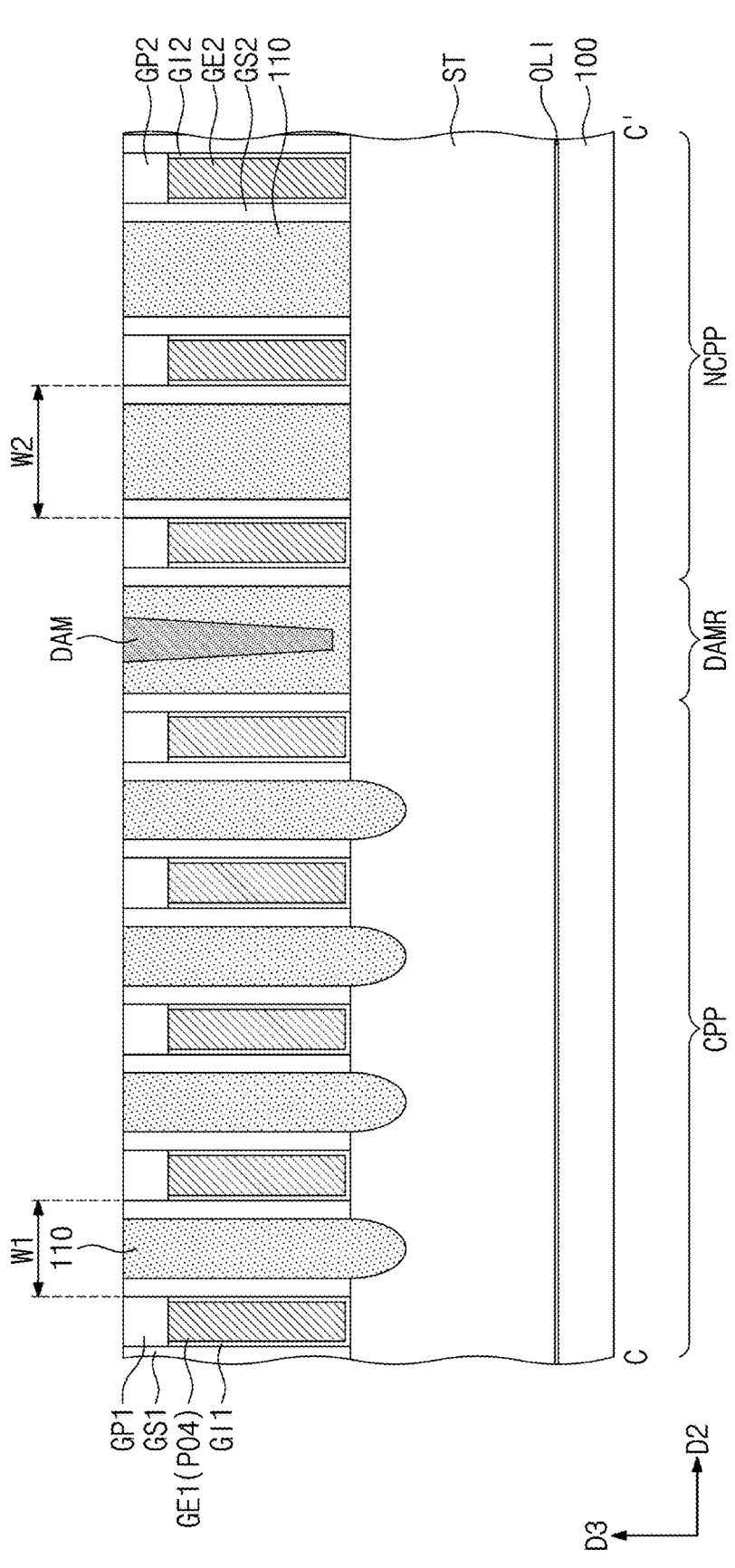

Referring to FIGS. 10A to 10C, the dam structure DAM may be formed on the device isolation layer ST in the border region DAMR. For example, a mask pattern may be formed to expose a region, in which the dam structure DAM will be formed. Next, a dry etching process may be performed on the region exposed by the mask pattern. Then, the dam structure DAM may be deposited using a chemical vapor deposition method and/or an atomic layer deposition method. Thereafter, a planarization process may be performed on the dam structure DAM. The planarization process on the dam structure DAM may be performed using an etch-back process and/or the CMP process.

The mask pattern may be fully removed during the planarization process. The planarization process may be performed until the first interlayer insulating layer 110 is exposed, and as a result, the dam structure DAM may be formed to have a top surface coplanar with the top surface of the first interlayer insulating layer 110. The dam structure DAM may be formed of and/or include a material having an etch selectivity with respect to the first interlayer insulating layer 110. For example, the dam structure DAM may be formed of and/or include at least one of SiON, SiCN, SiCON, and SiN.

Referring to FIGS. 11A to 11G, the active contact AC1 and the upper insulating pattern UIP may be formed on the cell region CPP.

For example, a photomask layer may be formed on the first interlayer insulating layer 110. Then, an exposing and developing process may be performed to form a first photomask pattern PM1 covering the dummy region NCPP. The first photomask pattern PM1 may be formed of and/or include a photoresist material. Thereafter, a wet etching process may be performed on the cell region CPP. The wet etching process may be performed using an etchant material, which may be chosen to etch the first interlayer insulating layer 110 at a high etch rate, compared with the first gate capping pattern GP1, the first gate spacer GS1, and the dam structure DAM. For example, the wet etching process may be performed using hydrofluoric acid (HF) solution.

Figure 11A:
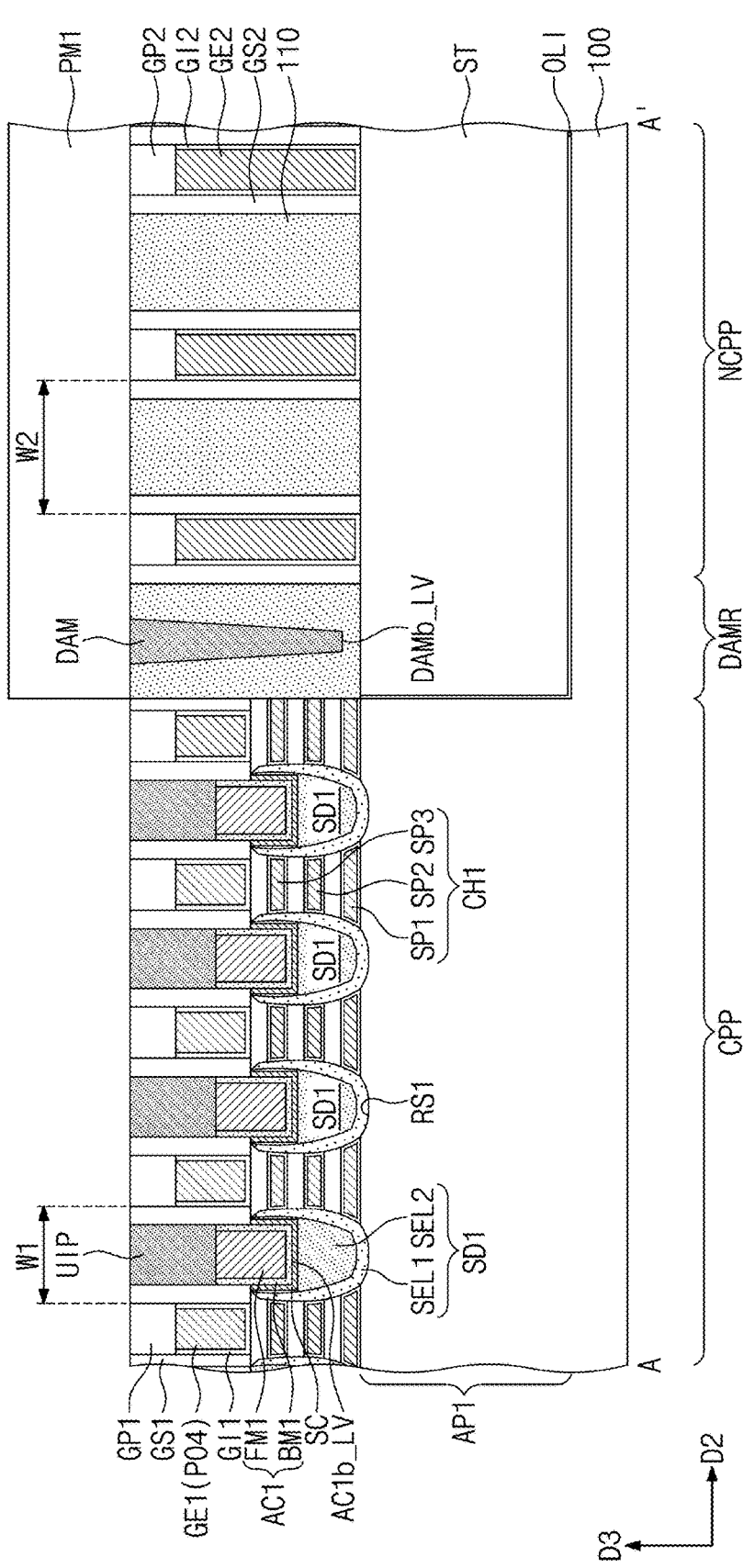
Figure 11B:
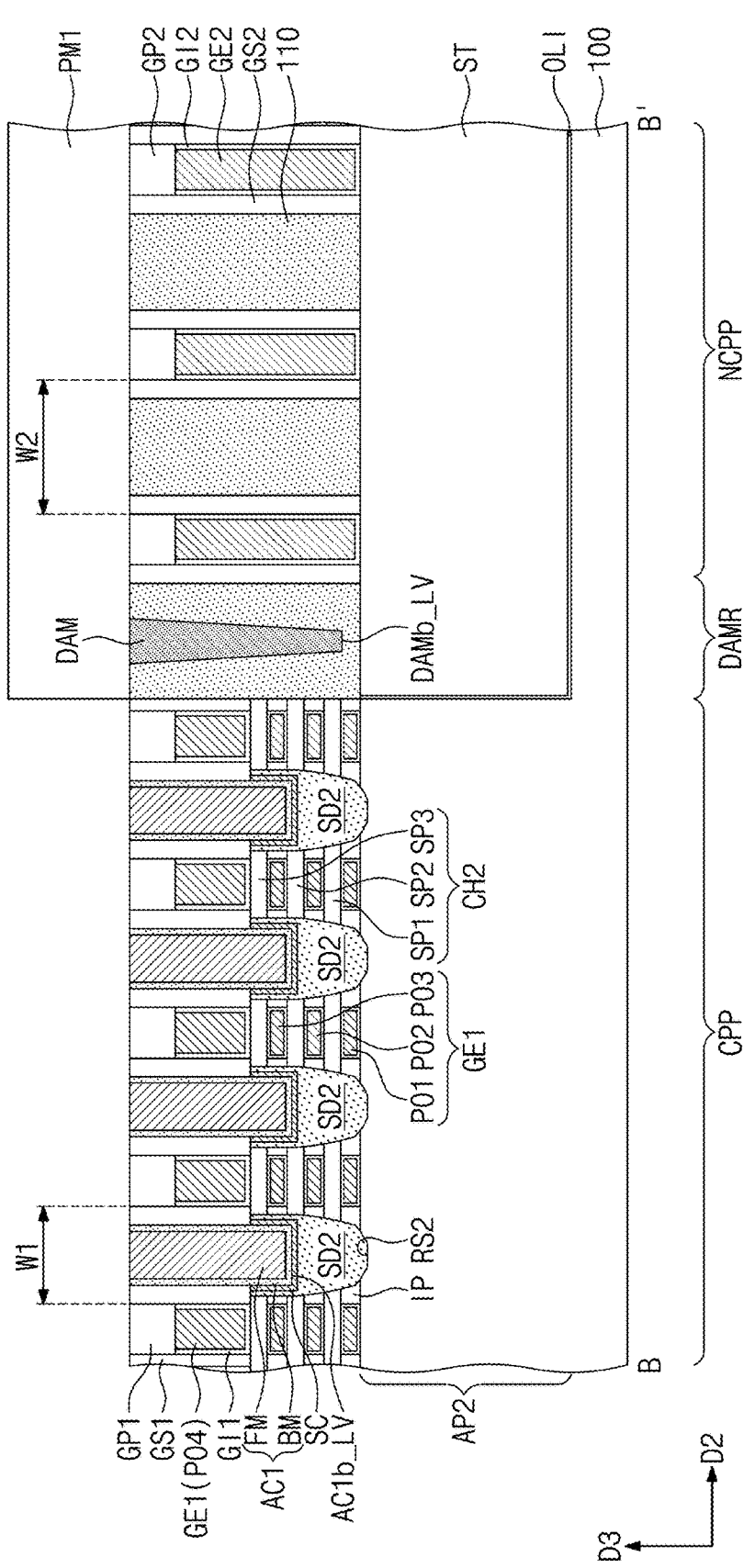
Figure 11C:
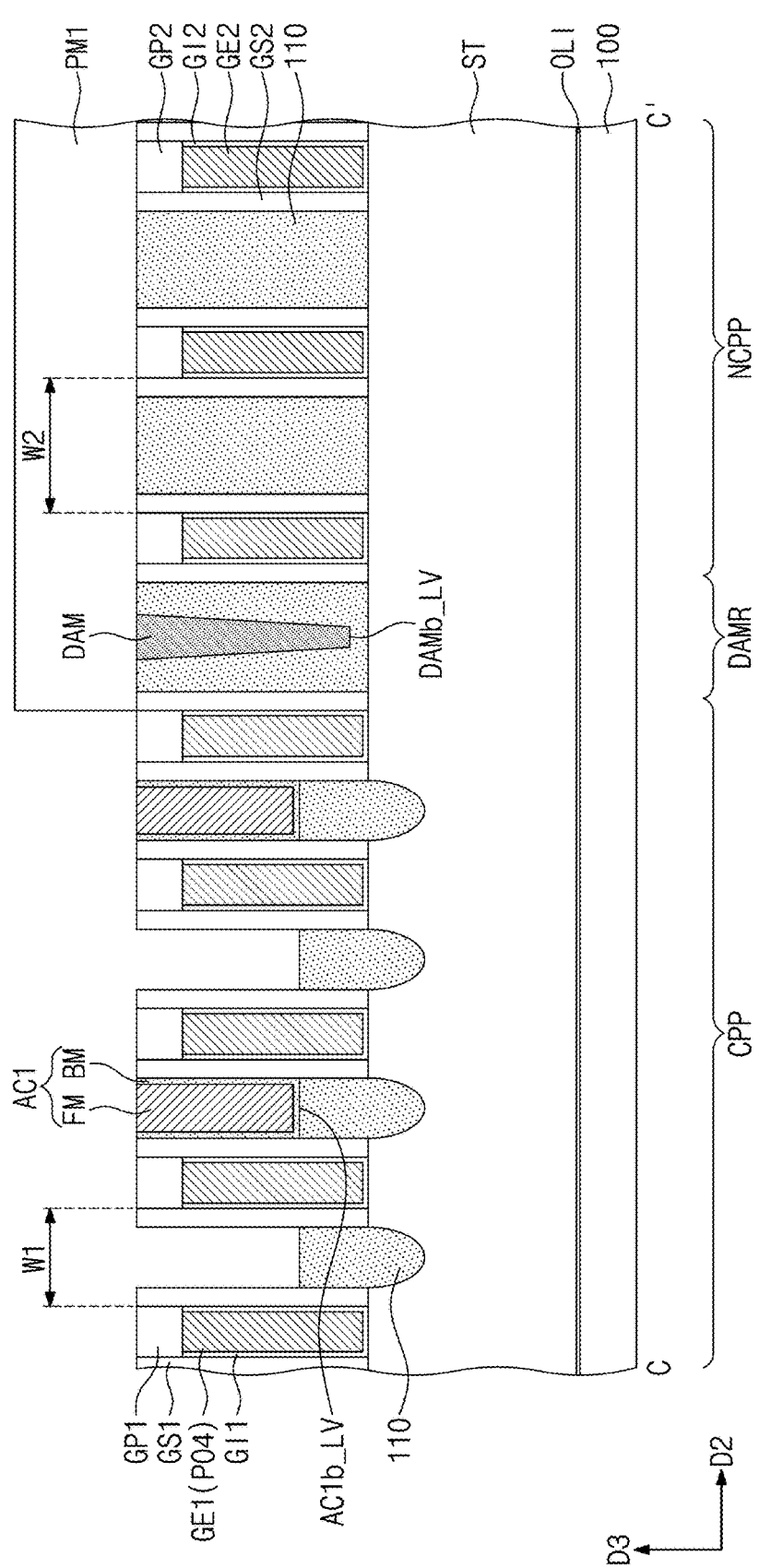
Figure 11D:
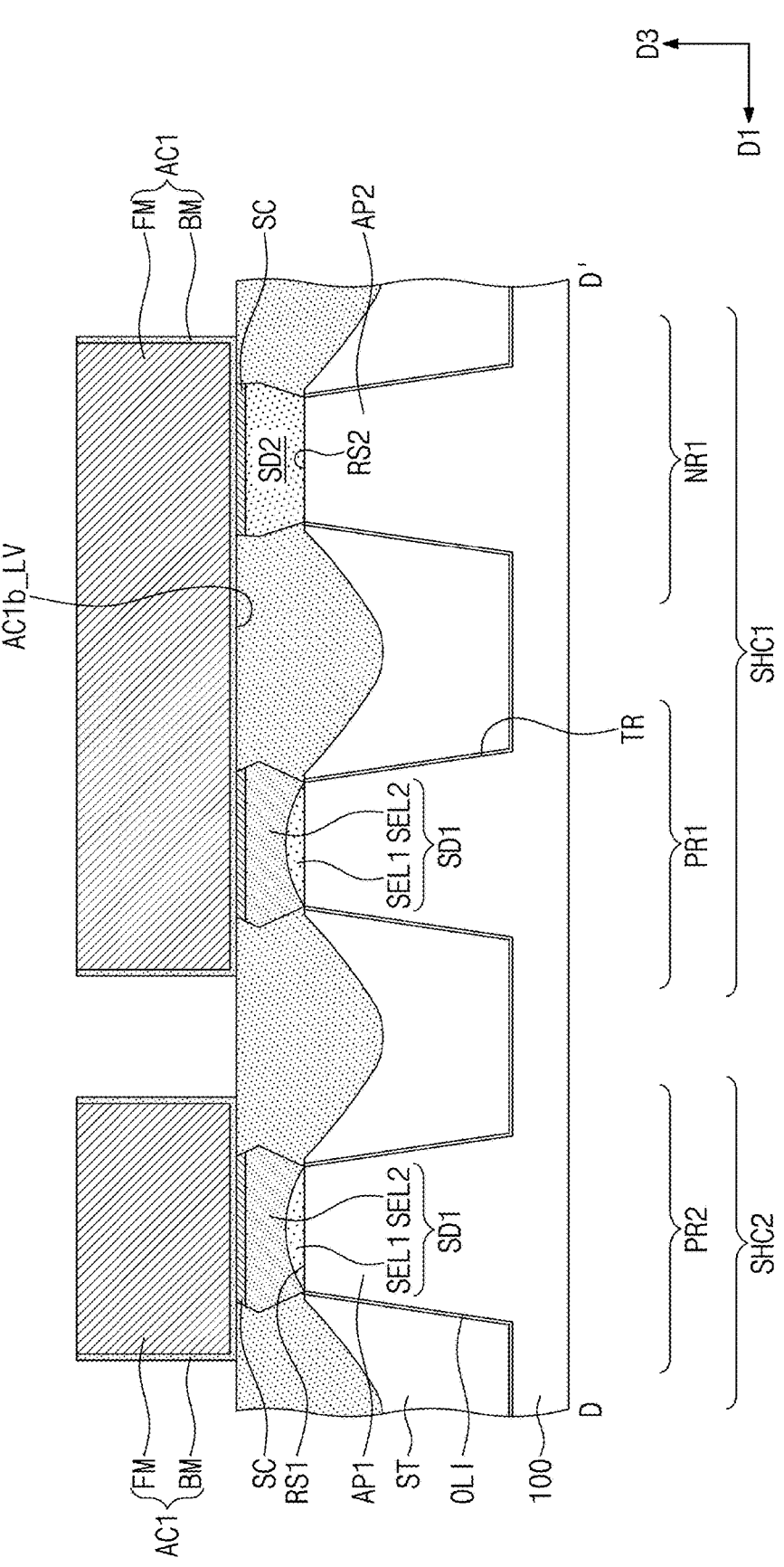
Figure 11E:
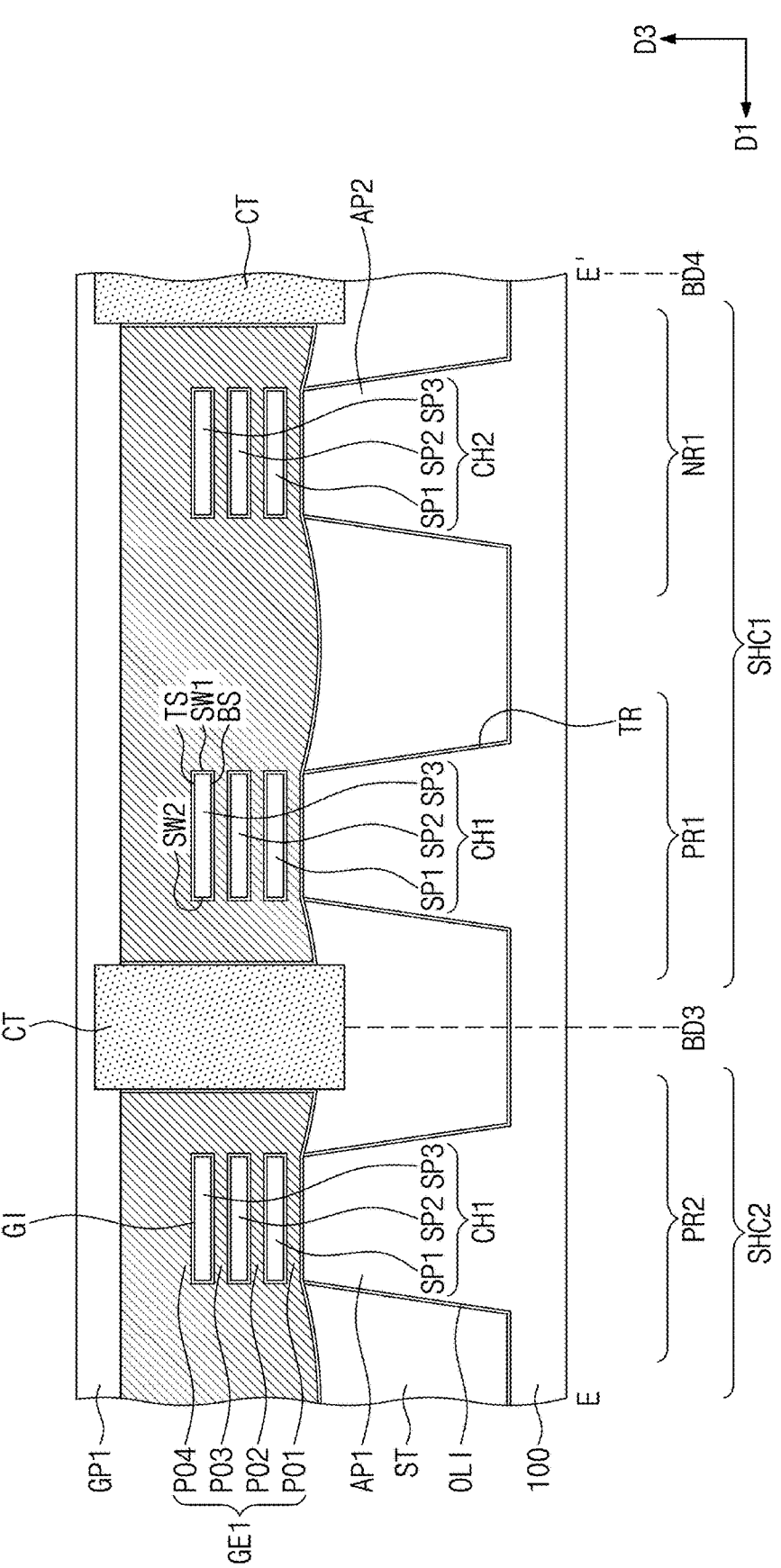
Figure 11F:
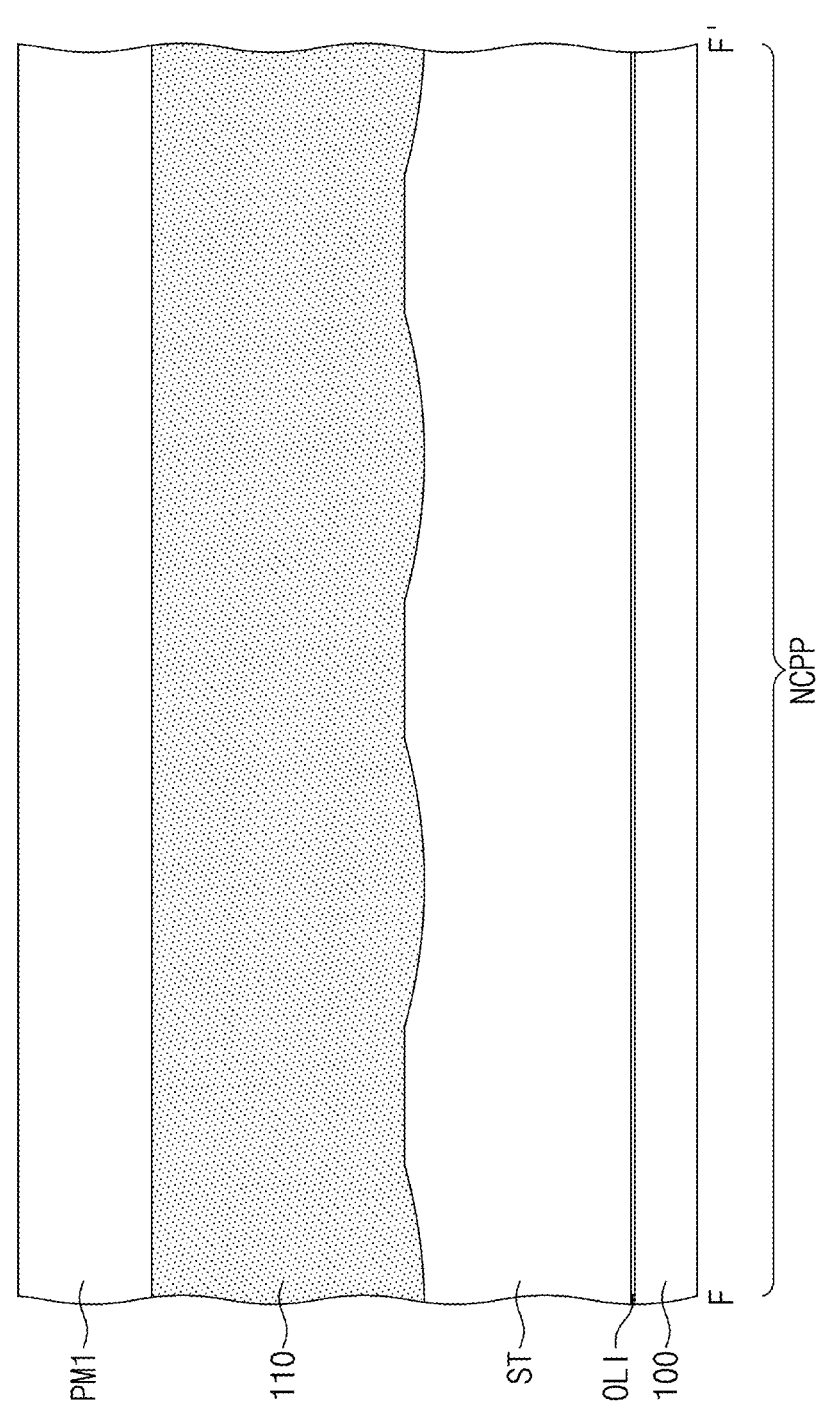
Figure 11G:
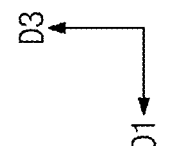
Figure 11G:
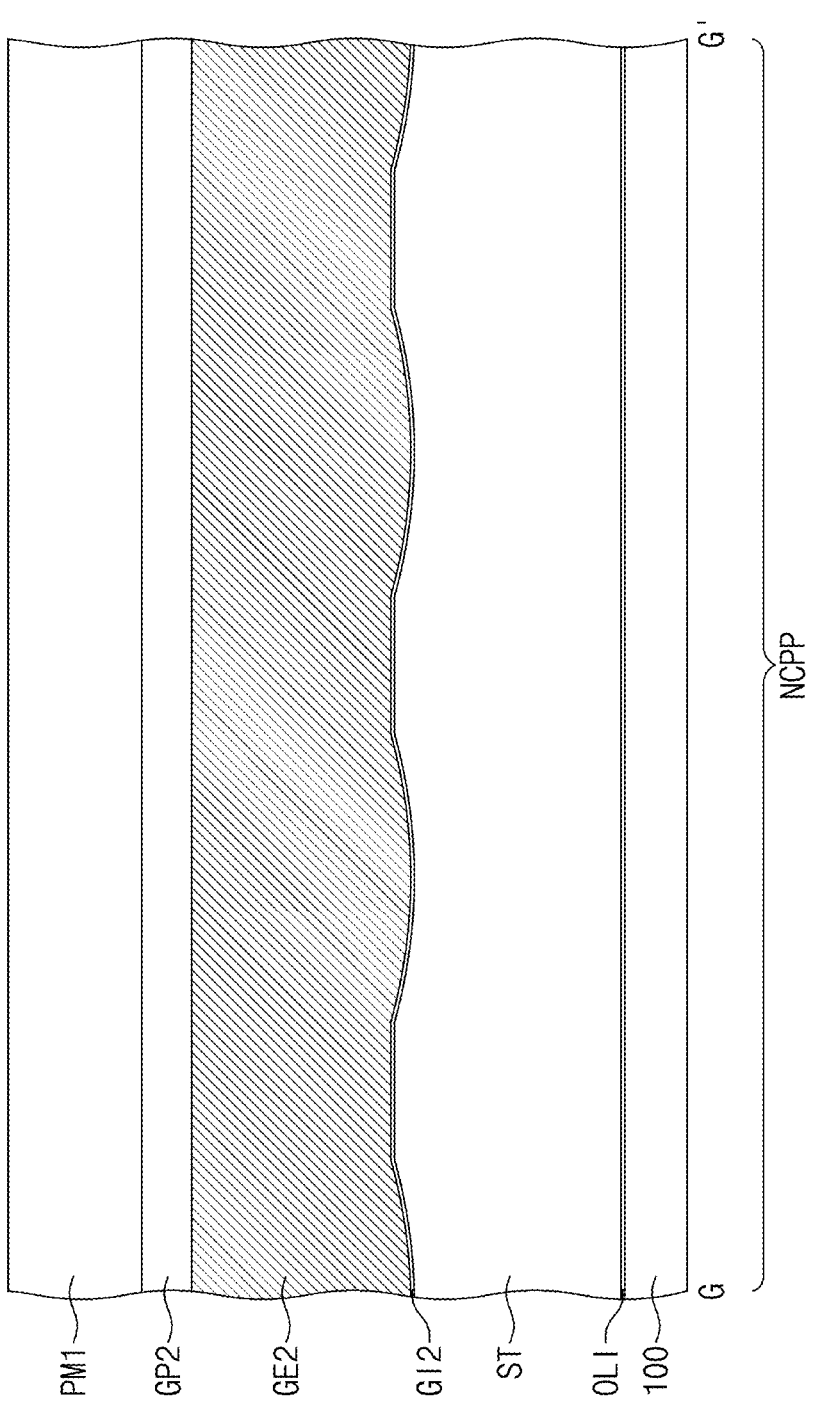
Figure 12A:
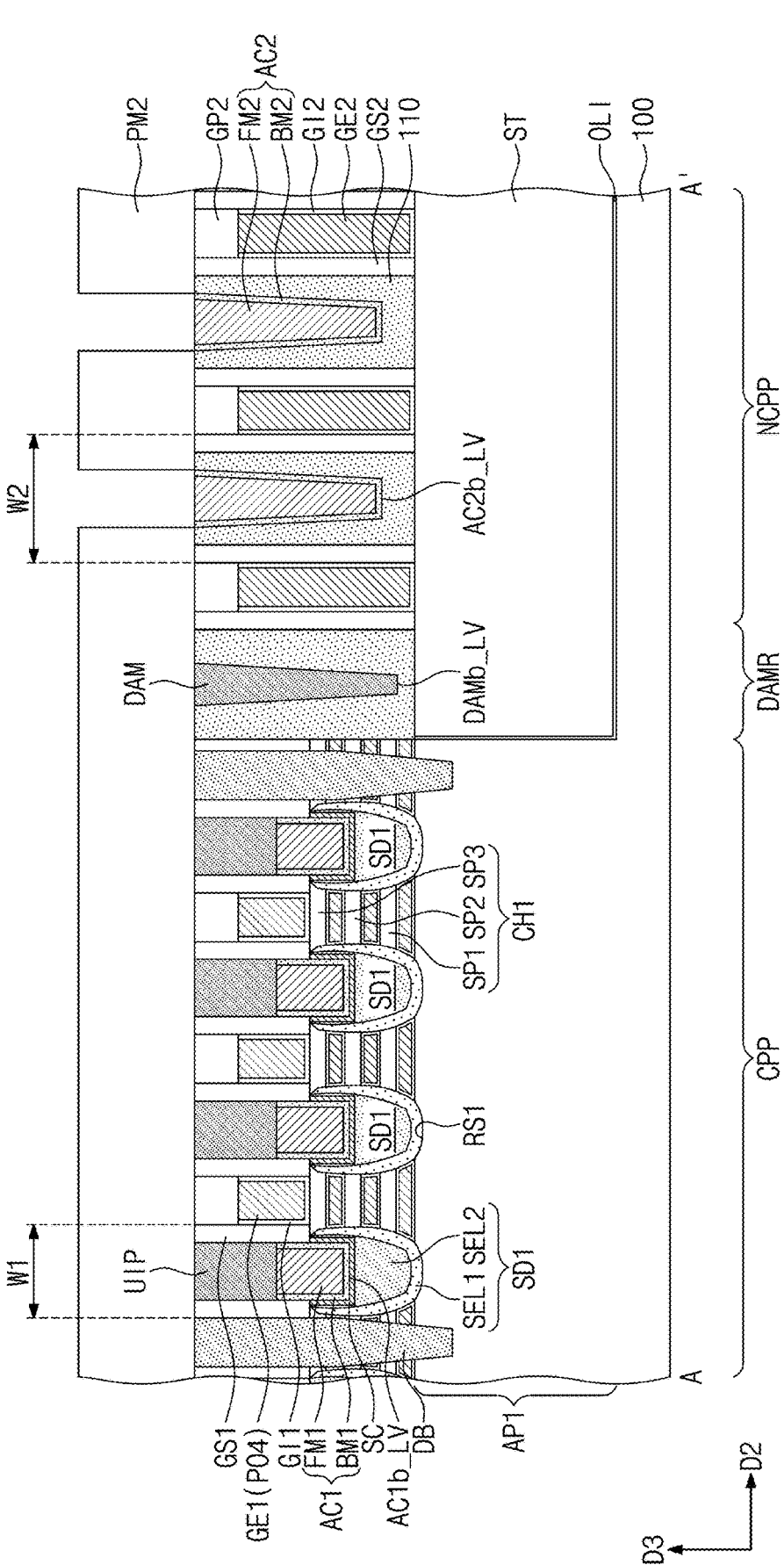
Figure 12B:
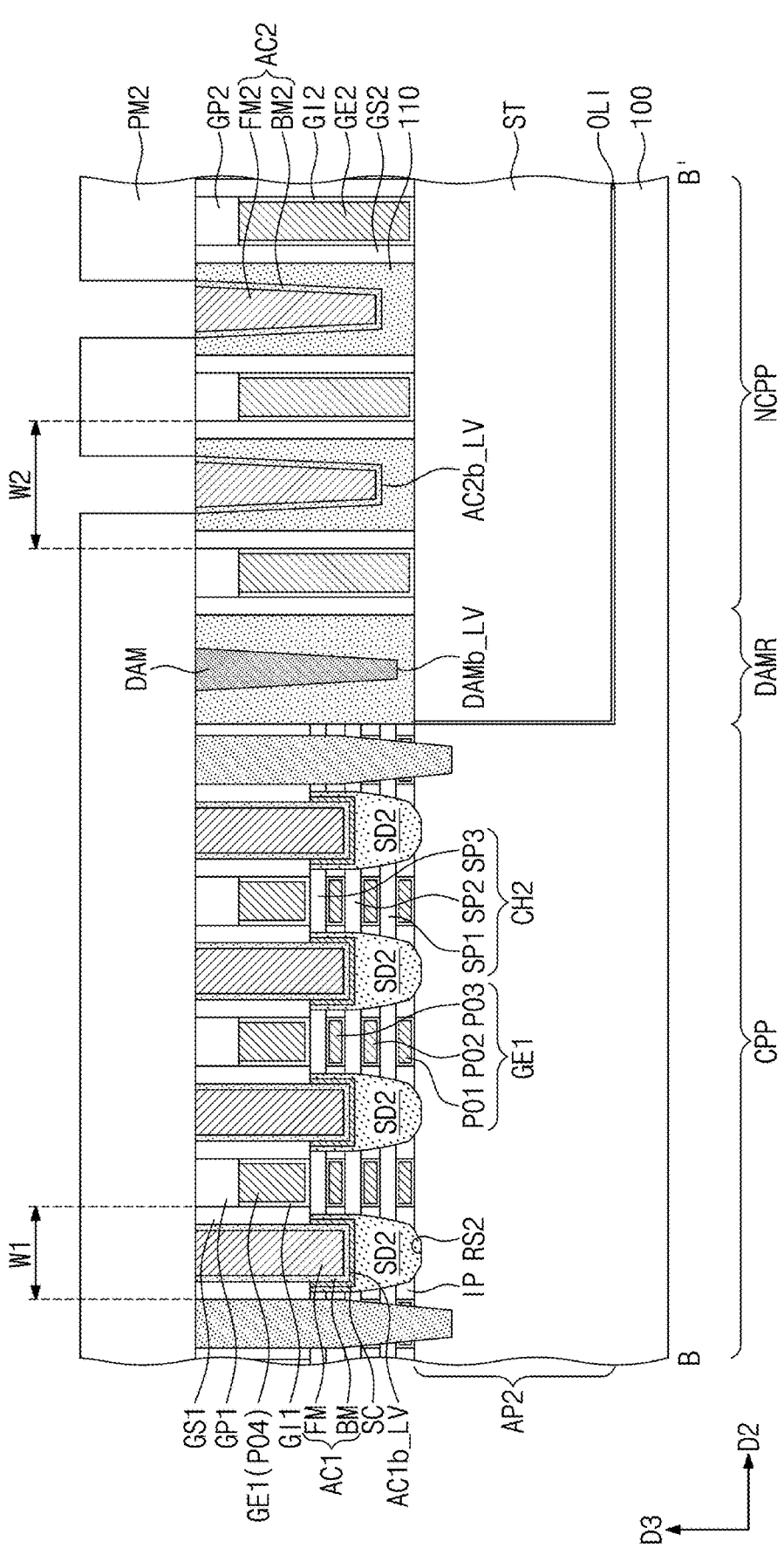
Figure 12C:
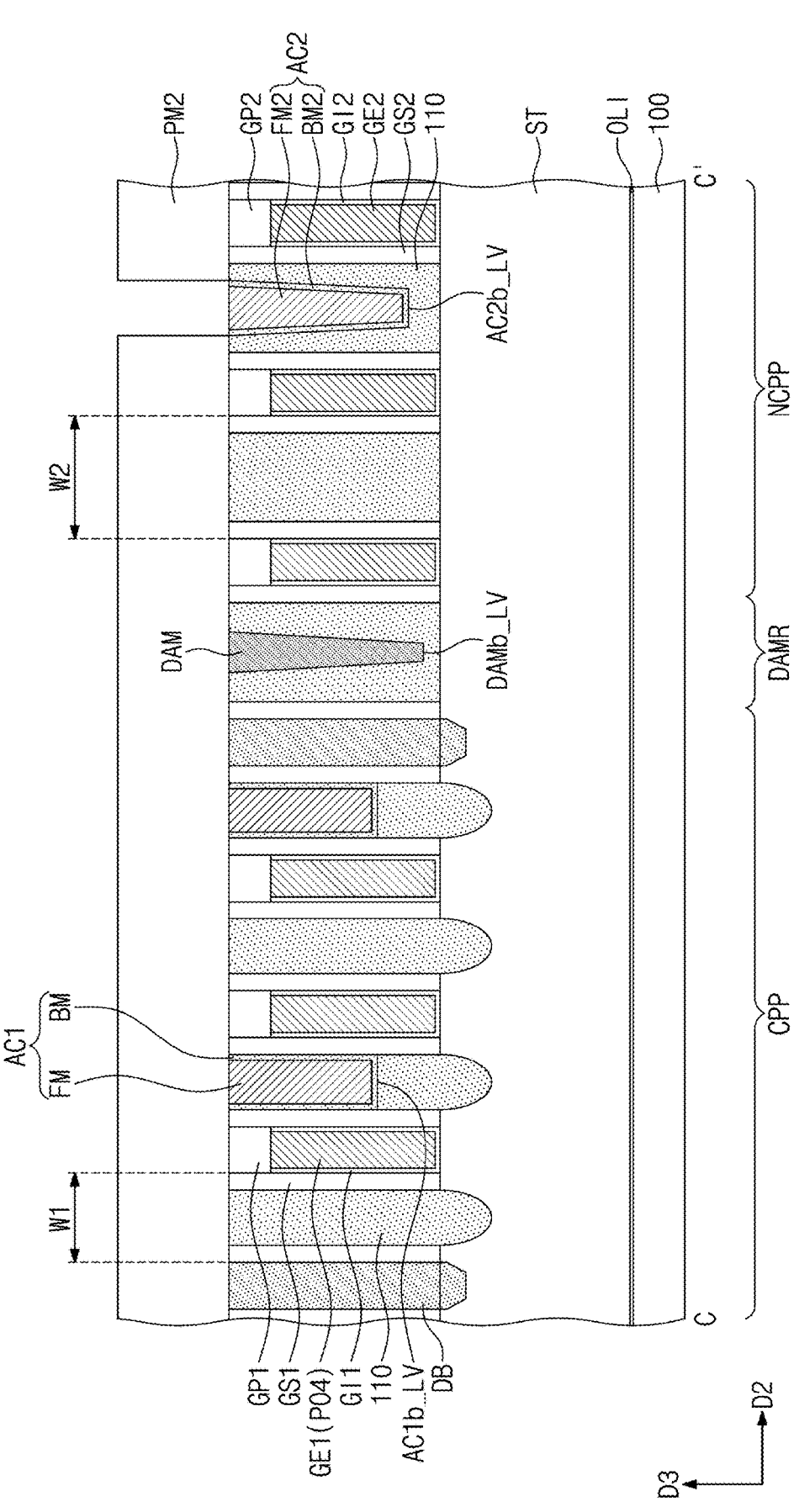
Figure 12F:
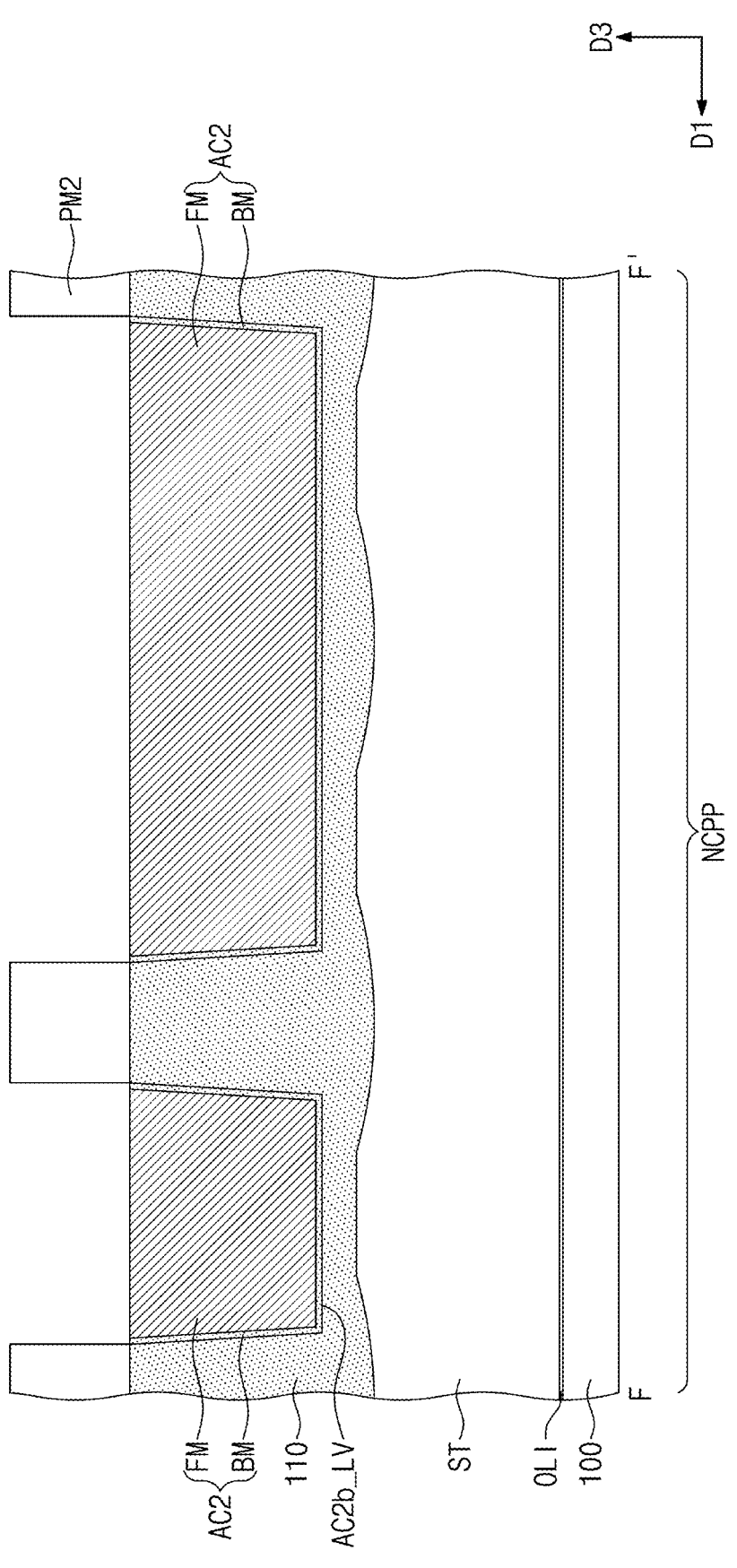
Figure 12G:
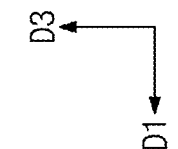
Figure 12G:
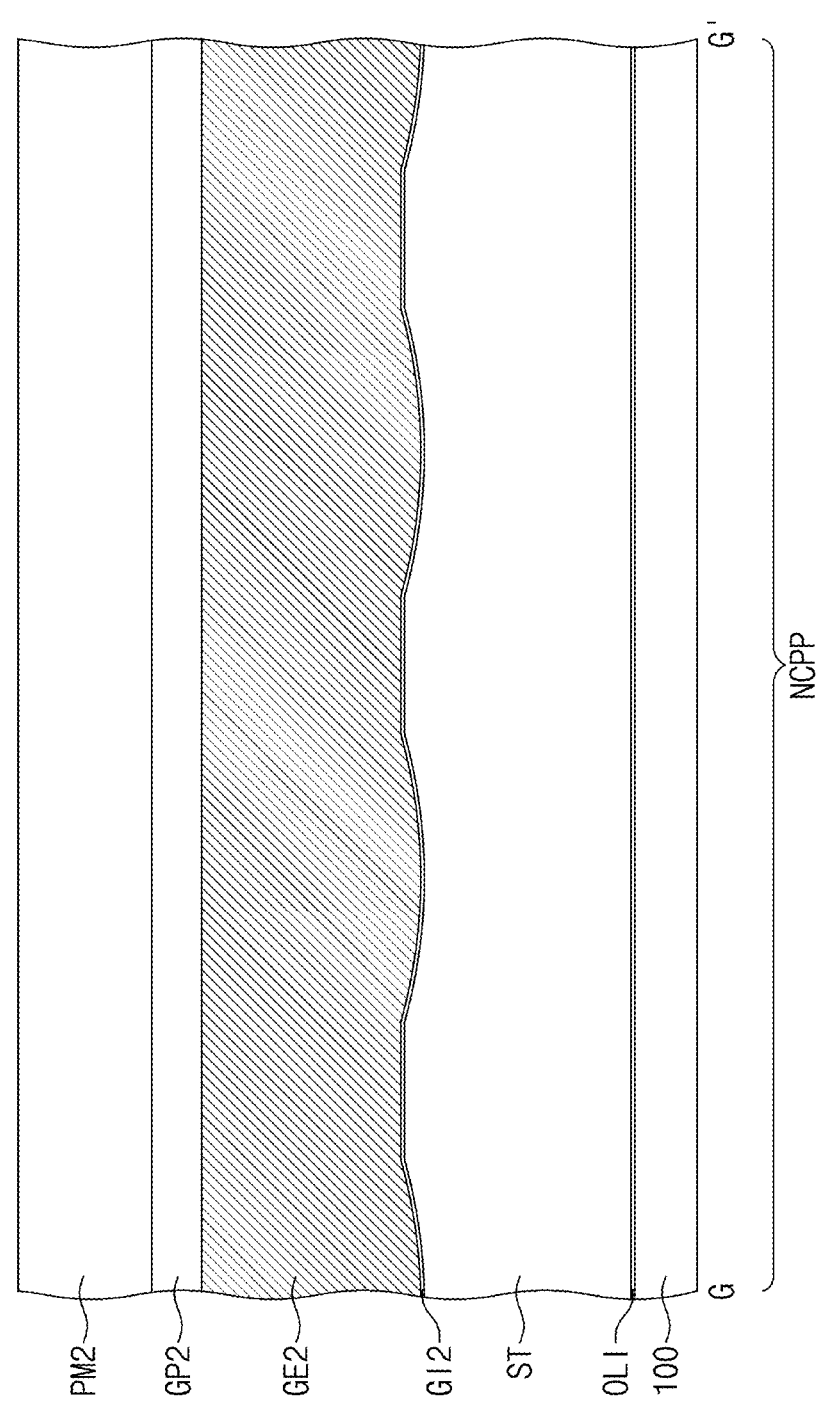

During the wet etching process, the first interlayer insulating layer 110, which may be located at both sides of each of the cell gate electrodes GE1 on the cell region CPP, may be partially etched. As shown in FIG. 11C, the first interlayer insulating layer 110 may be etched until a top surface of the first interlayer insulating layer 110 is located at a level AC1b_LV that is a bottom level of the active contact AC1 to be formed in a subsequent step. Here, due to the first photomask pattern PM1 and the dam structure DAM, the first interlayer insulating layer 110 on the dummy region NCPP and the border region DAMR may not be etched by the wet etching process.

The active contacts AC1, which may be electrically connected to the first source/drain patterns SD1 and the second source/drain patterns SD2, may be formed in the etched portions of the first interlayer insulating layer 110. In an embodiment, before the formation of the active contact AC1, the first source/drain patterns SD1 and the second source/drain patterns SD2 may be partially etched. Then, the silicide patterns SC may be formed on the first source/drain patterns SD1 and the second source/drain patterns SD2. The silicide patterns SC and the active contact AC1 may be electrically connected to each other. In some embodiments, the active contact AC1 may be formed through the wet etching process, and as a result, a thickness of the active contact AC1 in the second direction D2 may be uniform, regardless of a vertical position in the third direction D3.

Referring to FIGS. 12A to 12G, an insulating layer, which may be used as a part of the first interlayer insulating layer 110, may be formed on the cell region CPP to fill the etched portion of the first interlayer insulating layer 110. Then, a pair of division structures DB may be formed at both sides of each of the first and second single height cells SHC1 and SHC2. The division structure DB may penetrate a first interlayer insulating layer 110 and the gate electrode GE and may be extended into the active pattern AP1 or AP2. The division structure DB may be formed of and/or include at least one of insulating materials (e.g., silicon oxide and/or silicon nitride).

Thereafter, the first photomask pattern PM1 may be removed. Then, a second photomask pattern PM2 may be formed to expose a region, in which the dummy contact AC2 will be formed. A dry etching process may be performed using the second photomask pattern PM2 as a photomask. The dummy contact AC2 may be formed in a region, which may be etched by the dry etching process. In some embodiments, the dummy contact AC2 may be formed through the dry etching process, and as a result, a thickness of the dummy contact AC2 in the second direction D2 may increase as a distance in an upward direction (e.g., the third direction D3) increases. However, the present disclosure is not limited to this example. For example, in an embodiment, the dummy contact AC2 may be formed through a wet etching process, like the active contact AC1. In such an embodiment, the thickness of the dummy contact AC2 in the second direction D2 may be uniform.

Referring back to FIGS. 5A to 5G, the second photomask pattern PM2 may be removed. Thereafter, by using a new photomask, the gate contacts GC may be formed to penetrate the first and second gate capping patterns GP1 and GP2 and to be electrically connected to the cell and dummy gate electrodes GE1 and GE2.

The second interlayer insulating layer 130 may be formed on the active contacts AC1 and the gate contacts GC. Alternatively or additionally, the first metal layer M1 may be formed in the second interlayer insulating layer 130. In some embodiments, the third interlayer insulating layer 140 may be formed on the second interlayer insulating layer 130. In optional or additional embodiments, the second metal layer M2 may be formed in the third interlayer insulating layer 140.

Figure 13A:
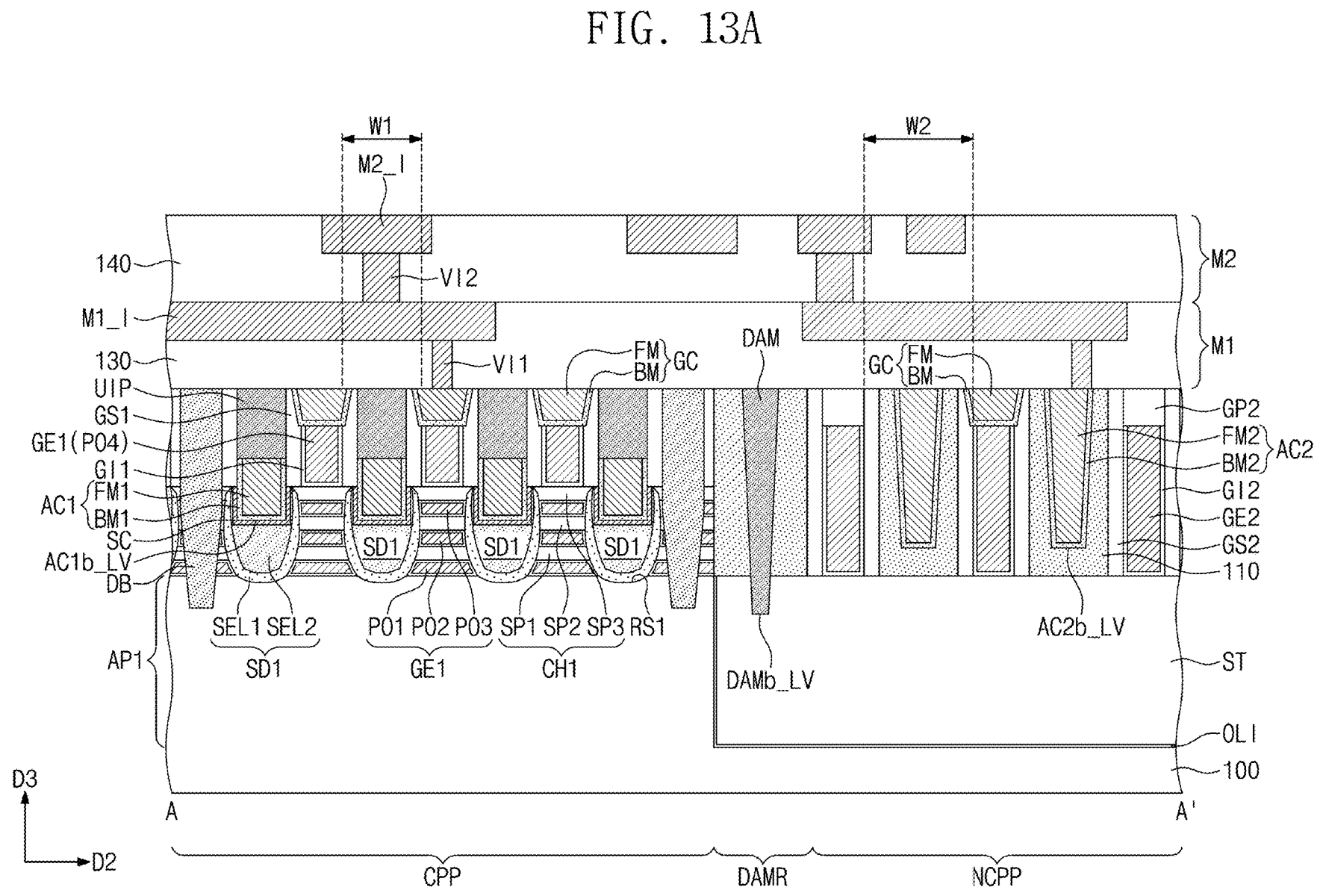
Figure 13B:
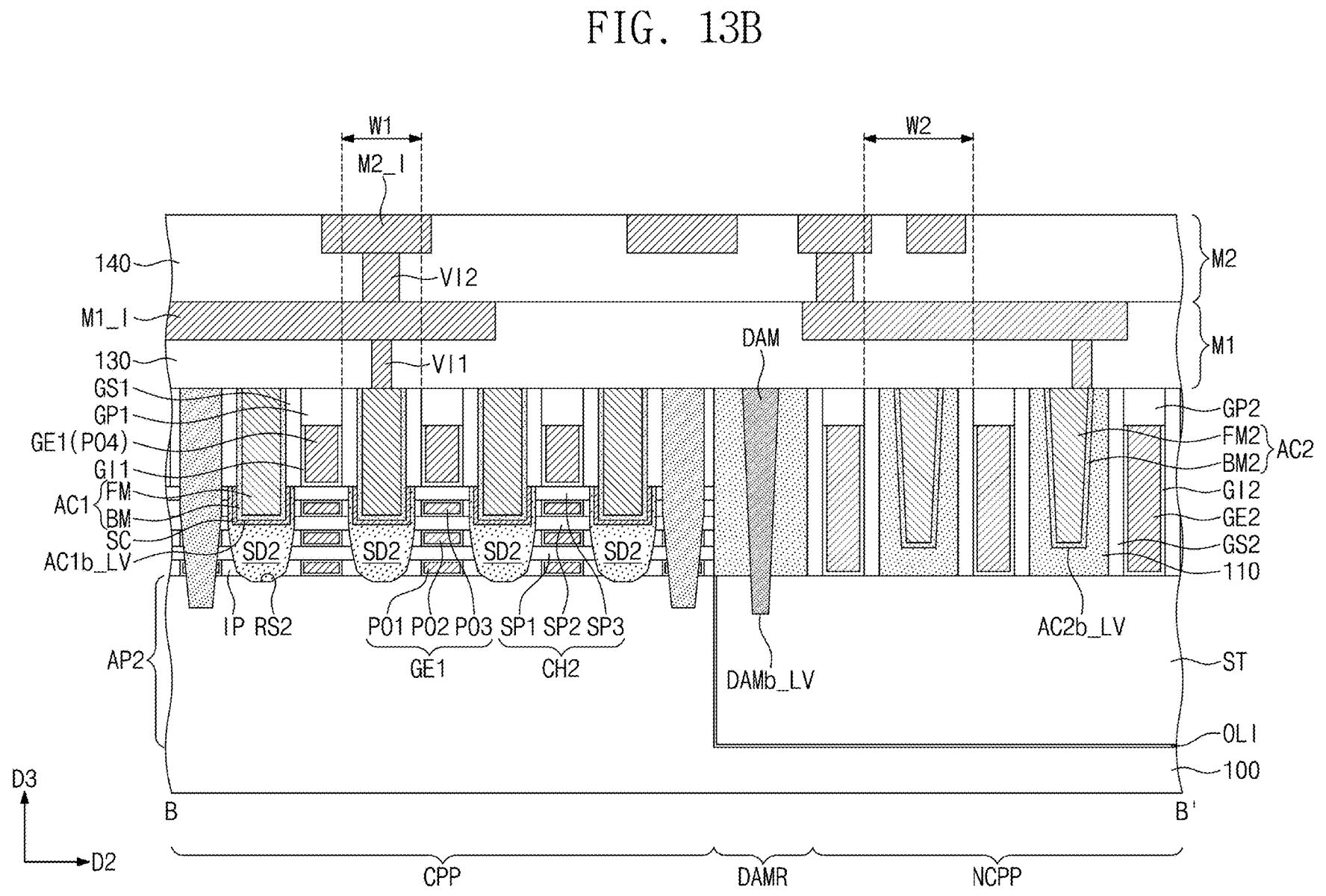
Figure 13C:
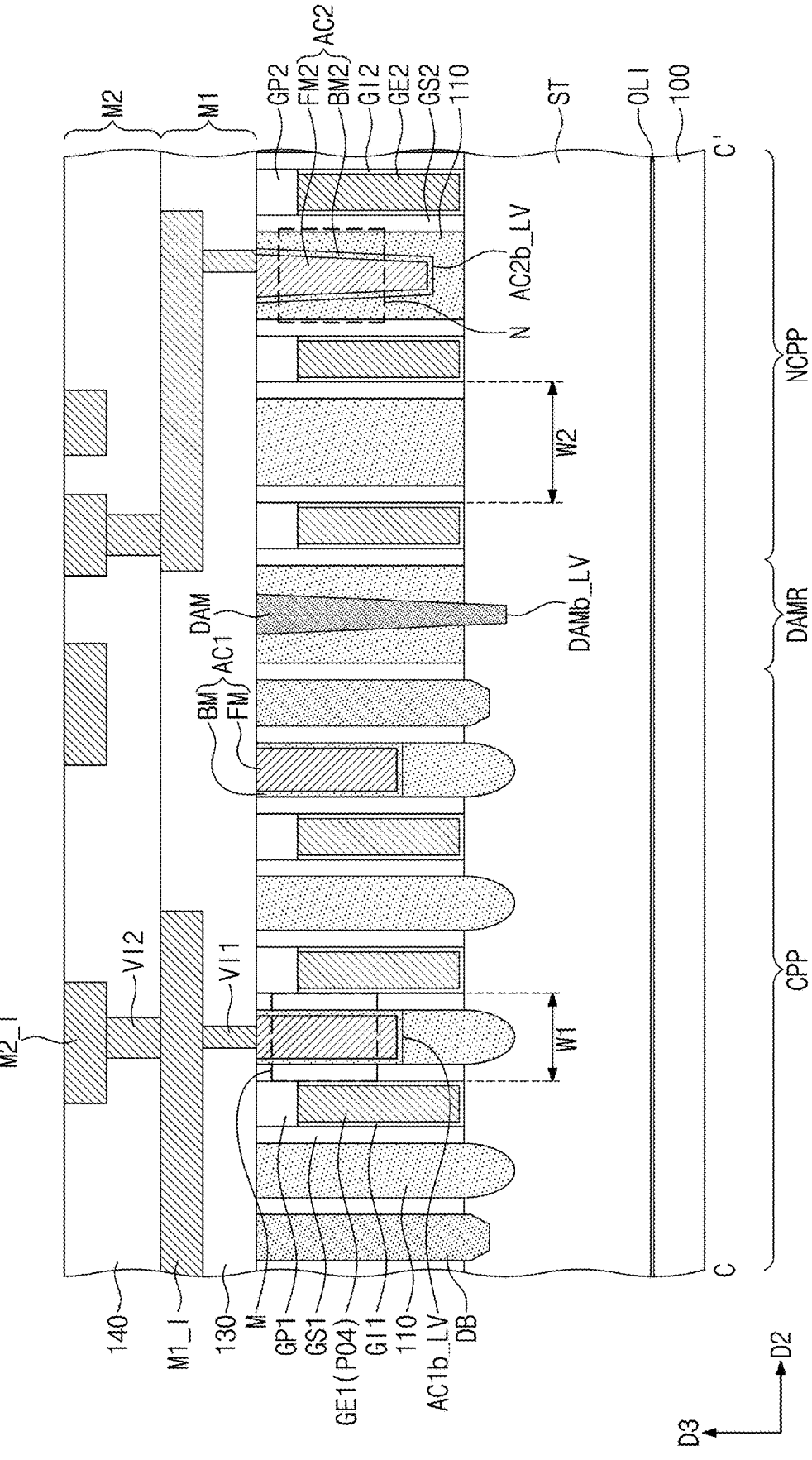

FIGS. 13A to 13C are sectional views, which are taken along the lines A-A', B-B', and C-C' of FIG. 4 to illustrate a semiconductor device, according to an embodiment. In the following description, an element previously described with reference to FIGS. 4 and 5A to 5G may be identified by the same reference number without repeating an overlapping description thereof.

Referring to FIGS. 4 and 13A to 13C, the dam structure DAM may be extended into the device isolation layer ST. The level DAMb_LV of the bottom surface of the dam structure DAM may be lower than the level of the top surface of the device isolation layer ST. The level DAMb_LV of the bottom surface of the dam structure DAM may be lower than the levels AC1b_LV and AC2b_LV of the bottom surfaces of the active and dummy contacts AC1 and AC2.

FIGS. 14A to 14E are sectional views, which are taken along the lines A-A', B-B', C-C', D-D', and E-E' of FIG. 4 to illustrate a semiconductor device, according to an embodiment. In the following description, an element previously described with reference to FIGS. 4 and 5A to 5G may be identified by the same reference number without repeating an overlapping description thereof.

Referring to FIGS. 4 and 14A to 14E, the device isolation layer ST may be provided in the cell region CPP to define the first active pattern AP1 and the second active pattern AP2 in an upper portion of the substrate 100. The first active pattern AP1 may be defined on each of the first PMOSFET region PR1 and the second PMOSFET region PR2, and the second active pattern AP2 may be defined on each of the first NMOSFET region NR1 and the second NMOSFET region NR2.

Figure 14A:
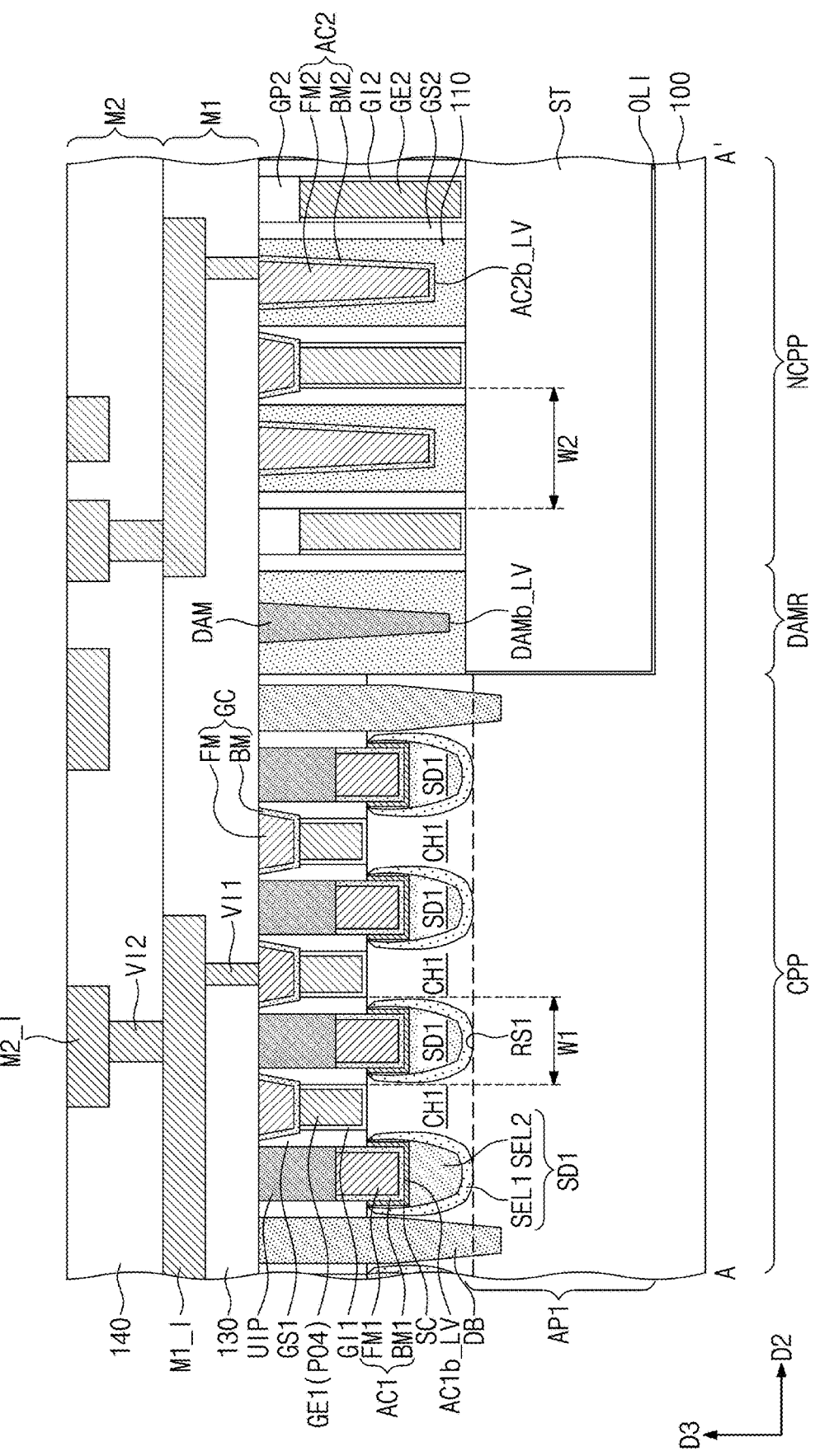
FIGS. 14A to 14E are sectional views, which are taken along the lines A-A', B-B', C-C', D-D', and E-E' of FIG. 4 to illustrate a semiconductor device, according to an embodiment.
Figure 14B:
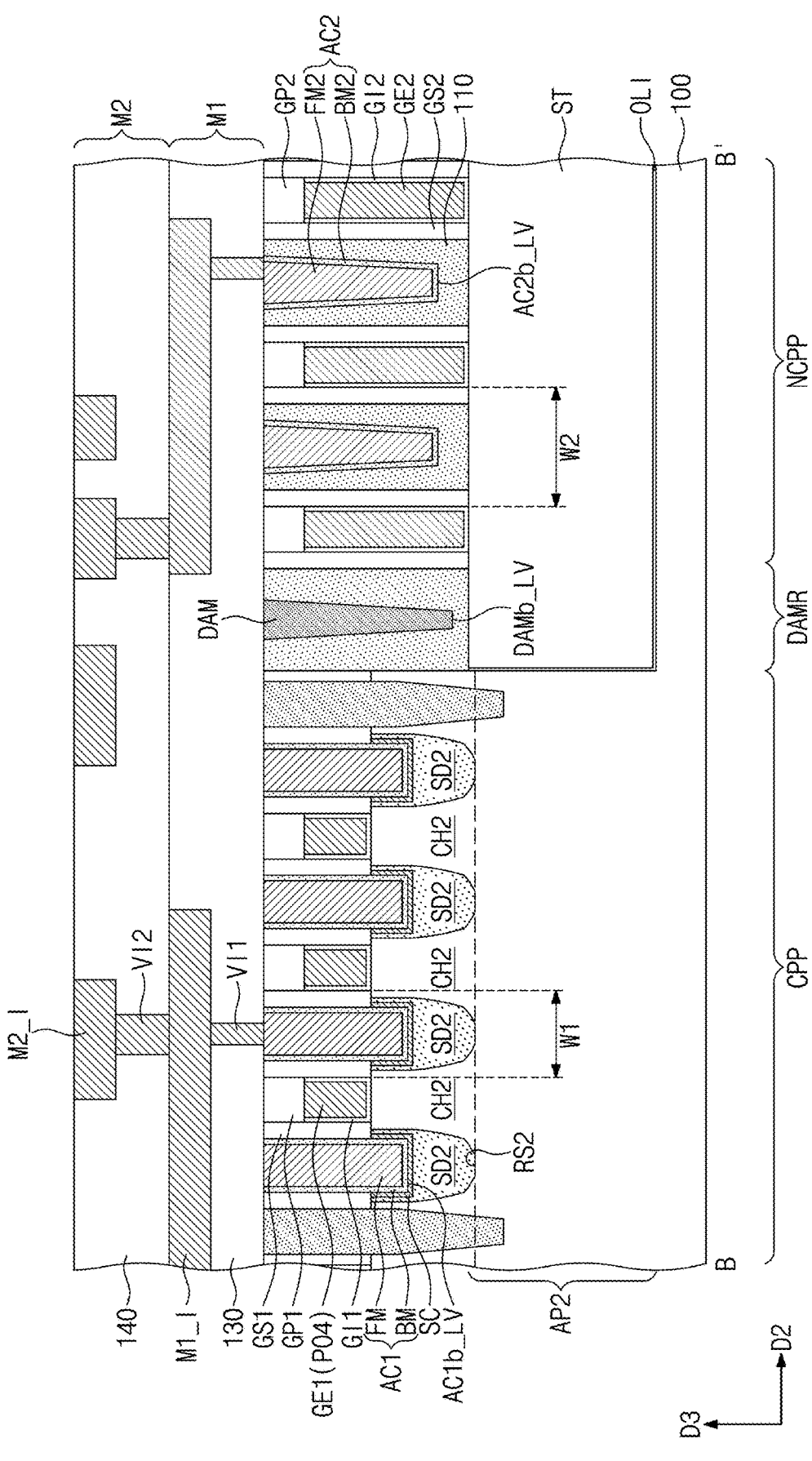
Figure 14C:
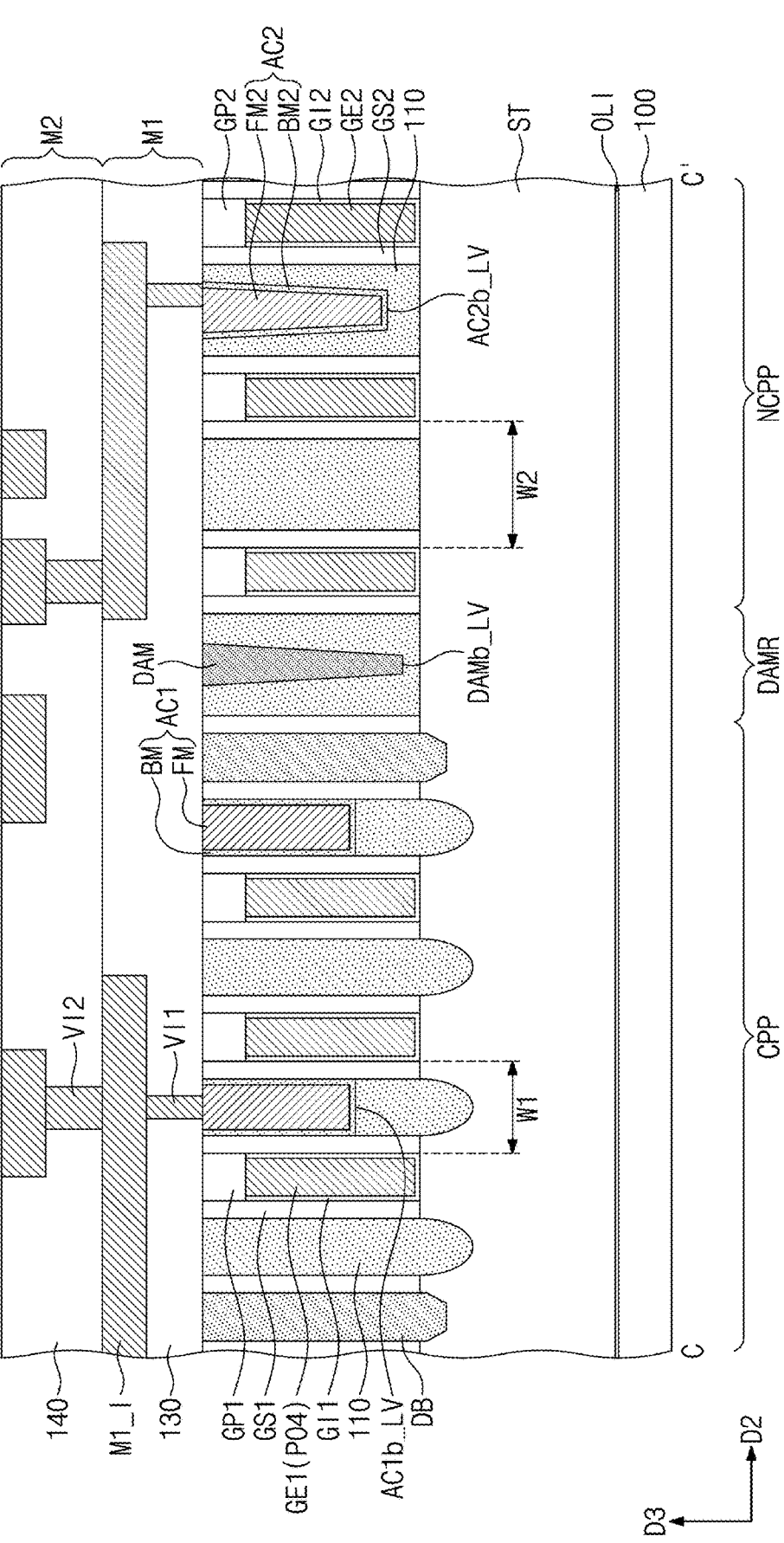
Figure 14D:
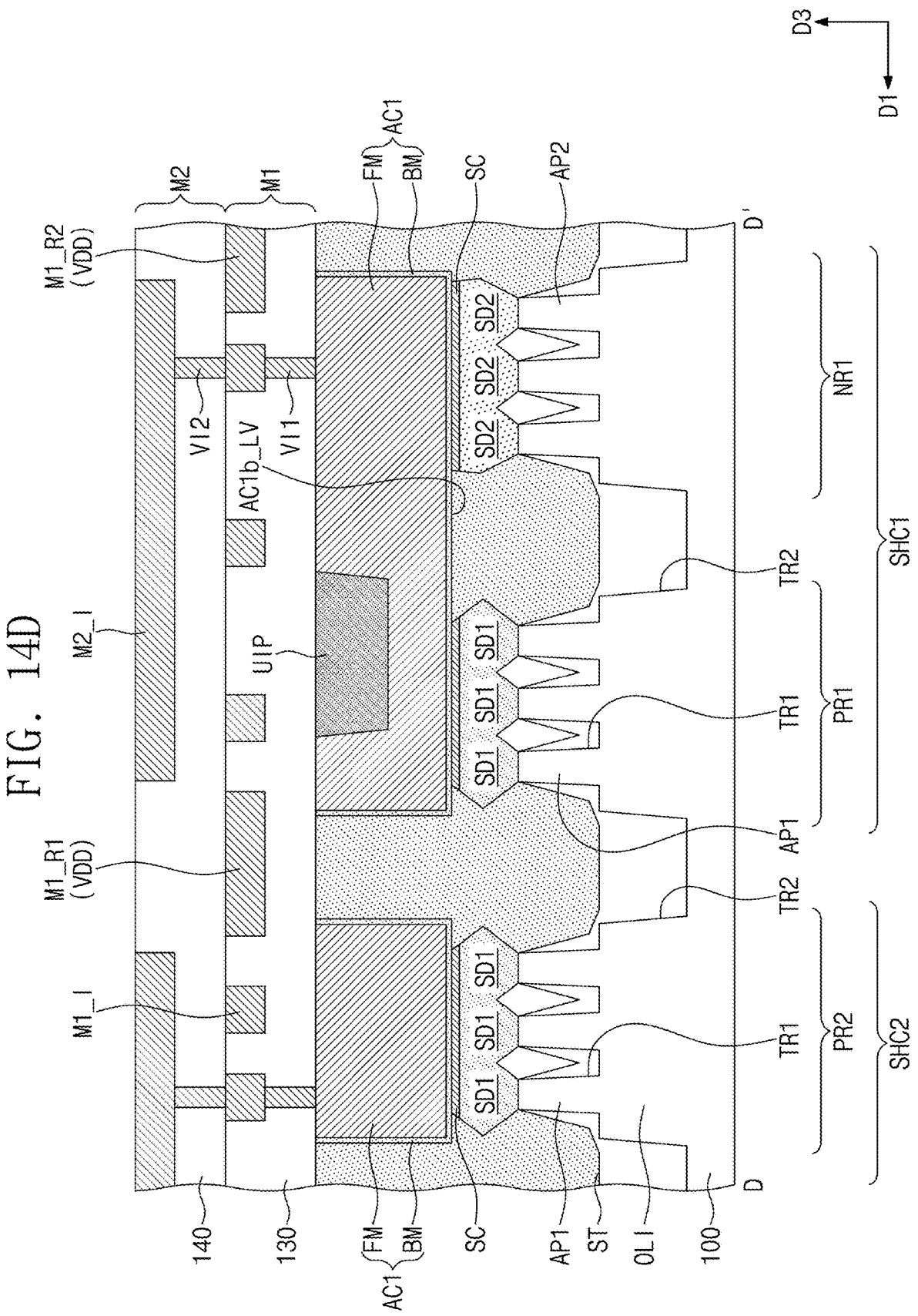
Figure 14E:
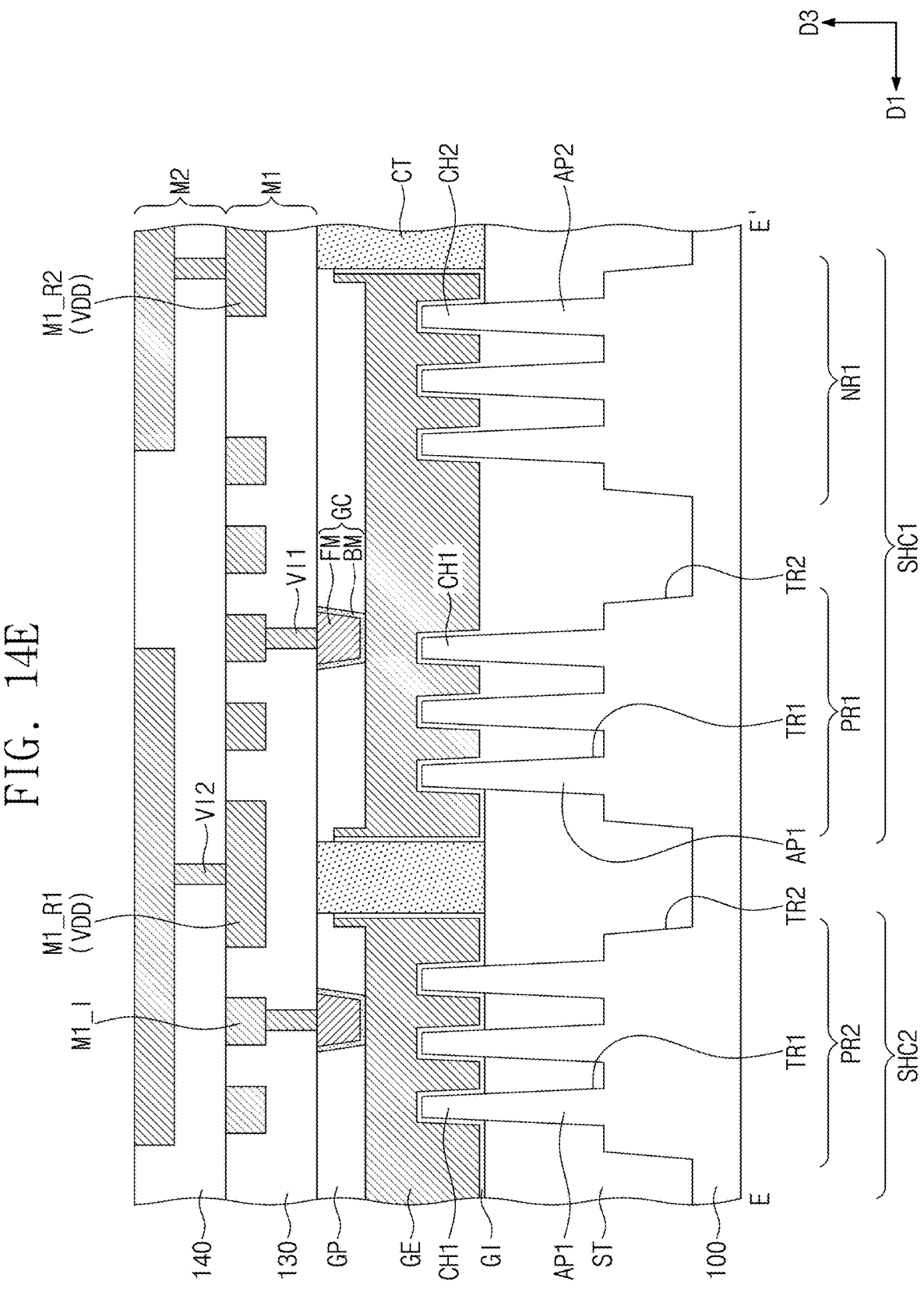

The device isolation layer ST may cover a side surface of a lower portion of each of the first active pattern AP1 and the second active pattern AP2. An upper portion of each of the first active pattern AP1 and the second active pattern AP2 may be a protruding pattern, which is vertically extended above the device isolation layer ST, as shown in FIG. 14E.

In some embodiments, the first source/drain patterns SD1 may be provided on the first active pattern AP1. Alternatively or additionally, the first channel pattern CH1 may be provided between the first source/drain patterns SD1. In optional or additional embodiments, the second source/drain patterns SD2 may be provided on the second active pattern AP2. Alternatively or additionally, the second channel pattern CH2 may be provided between the second source/drain patterns SD2.

Referring back to FIG. 14E, each of the first channel pattern CH1 and the second channel pattern CH2 may not include the stacked first to third semiconductor patterns SP1, SP2, and SP3 previously described with reference to FIGS. 5A to 5G. In some embodiments, each of the first channel pattern CH1 and the second channel pattern CH2 may be shaped like a single semiconductor pillar that protrudes above the device isolation layer ST.

The cell gate electrode GE1 may be provided on a top surface and opposite side surfaces of each of the first channel pattern CH1 and the second channel pattern CH2. That is, the transistor according to the present embodiment may be a three-dimensional field-effect transistor (e.g., fin-shaped FET (FinFET)), in which the cell gate electrode GE1 may be provided to surround the first channel pattern CH1 and/or the second channel pattern CH2 three-dimensionally.

The first interlayer insulating layer 110 may be provided to fully cover the substrate 100. The active contacts AC1 may be provided to penetrate the first interlayer insulating layer 110 and may be connected to the first source/drain patterns SD1 and the second source/drain patterns SD2, respectively. The gate contact GC may be provided to penetrate the first gate capping pattern GP1 and may be connected to the cell gate electrode GE1. The active contacts AC1 and the gate contacts GC may be configured to have substantially the same features as those in the embodiments previously described with reference to FIGS. 4 and 5A to 5E.

The second interlayer insulating layer 130 may be provided on the first interlayer insulating layer 110. The third interlayer insulating layer 140 may be provided on the second interlayer insulating layer 130. The first metal layer M1 may be provided in the second interlayer insulating layer 130. The second metal layer M2 may be provided in the third interlayer insulating layer 140. The first and second metal layers M1 and M2 may be configured to have substantially the same features as those in the embodiments previously described with reference to FIGS. 4 and 5A to 5G. Similarly, a structure, which may be provided on the dummy region NCPP and the border region DAMR, may be configured to have substantially the same features as those in the embodiments previously described with reference to FIGS. 4 and 5A to 5G.

According to an embodiment, a semiconductor device may include a dam structure, which may be disposed in a border region between cell and dummy regions of a substrate. A level of a bottom surface of the dam structure may be lower than a level of a bottom surface of an active contact on the cell region and a level of a bottom surface of a dummy contact on the dummy region. Accordingly, it may be possible to form the active contact in the cell region, in which a pitch between gate electrodes may be comparatively small, through a wet etching process, and thereby to reduce a process difficulty in the fabrication process. That is, it may be possible to form fine patterns of the semiconductor device and thereby to improve reliability and electric characteristics of the semiconductor device.

While example embodiments of the present disclosure have been particularly shown and described, it is to be understood by one of ordinary skill in the art that variations in form and detail may be made therein without departing from the spirit and scope of the attached claims.

27

What is claimed is:

1. A semiconductor device, comprising:
a substrate comprising a cell region, a dummy region spaced apart from the cell region in a first direction, and a border region between the cell region and the dummy region;
an active pattern on the cell region of the substrate;
a device isolation layer on the substrate to define the active pattern, the device isolation layer extending in the first direction;
source/drain patterns on the active pattern and channel patterns between the source/drain patterns, each of the channel patterns comprising semiconductor patterns, each of the semiconductor patterns being stacked to be spaced apart from each other;
cell gate electrodes crossing the channel patterns in a second direction, the second direction intersecting the first direction;
active contacts disposed on the cell region and between the cell gate electrodes and coupled to the source/drain patterns;
dummy gate electrodes on the dummy region and on the device isolation layer;
dummy contacts on the dummy region and on a side surface of each of the dummy gate electrodes;
an interlayer insulating layer on the side surface of each of the dummy gate-electrodes; and electrodes;
a dam structure on the border region of the substrate; and
a liner layer extending from the cell region to the border region and the dummy region,
wherein the dam structure is inserted in the interlayer insulating layer,
wherein the dam structure extends in the second direction,
wherein a first portion of the liner layer on the cell region is interposed between the active pattern and the device isolation layer, and
wherein a second portion of the liner layer on the dummy region and the border region is interposed between the substrate and the device isolation layer.

2. The semiconductor device of claim 1, wherein:
a distance between adjacent ones of the cell gate electrodes is a first pitch,
a distance between adjacent ones of the dummy gate electrodes is a second pitch, and
the first pitch is larger than the second pitch.

3. The semiconductor device of claim 1, further comprising:
a first gate spacer on a side surface of each of the cell gate electrodes; and
a second gate spacer on a side surface of each of the dummy gate electrodes,
wherein a side surface of each of the active contacts is in contact with a side surface of the first gate spacer.

4. The semiconductor device of claim 3, wherein:
a side surface of the second gate spacer is in contact with the interlayer insulating layer, and
a side surface of each of the dummy contacts is in contact with the interlayer insulating layer.

5. The semiconductor device of claim 1, wherein a level of a bottom surface of the dam structure is lower than a level of a lowermost surface of each of the active contacts.

6. The semiconductor device of claim 5, wherein the level of the bottom surface of the dam structure is lower than a level of a lowermost surface of each of the dummy contacts.

7. The semiconductor device of claim 6, wherein the level of the lowermost surface of each of the dummy contacts is lower than or equal to the level of the lowermost surface of each of the active contacts.

8. The semiconductor device of claim 1, wherein a bottom surface of each of the active contacts is in contact with the interlayer insulating layer.

9. The semiconductor device of claim 1, wherein a first angle is formed between a first plane comprising a first side surface of a first contact of the active contacts and a second plane comprising a top surface of the substrate,
wherein a second angle is formed between a third plane comprising a second side surface of a second contact of the dummy contacts and the second plane comprising the top surface of the substrate, and
wherein the first angle is greater than the second angle.

10. The semiconductor device of claim 1, wherein a level of a bottom surface of the dam structure is higher than a level of a top surface of the device isolation layer.

11. The semiconductor device of claim 1, wherein the dam structure is extended into the device isolation layer.

12. The semiconductor device of claim 1, wherein a width of the dam structure in the first direction decreases as a distance from an upper portion of the dam structure increases in a direction toward a lower portion thereof.

13. A semiconductor device, comprising:
a substrate comprising a cell region, a border region, and a dummy region, which are sequentially provided in a first direction;
a device isolation layer on the substrate that extends in the first direction;
a pair of cell gate electrodes on the cell region and on the device isolation layer that extends in a second direction, the second direction crossing the first direction;
a pair of dummy gate electrodes on the dummy region and on the device isolation layer that extends in the second direction;
an active contact between the pair of cell gate electrodes;
a dummy contact between the pair of dummy gate electrodes;
a first gate spacer on a side surface of each of the pair of cell gate electrodes;
a second gate spacer on a side surface of each of the pair of dummy gate electrodes;
an interlayer insulating layer on the side surface of each of the pair of cell gate electrodes and the side surface of each of the pair of dummy gate electrodes;
a dam structure on the border region of the substrate; and
a liner layer extending from the cell region to the border region and the dummy region,
wherein the dam structure is inserted in the interlayer insulating layer,
wherein the interlayer insulating layer comprises silicon oxide,
wherein the dam structure comprises a material having an etch selectivity with respect to the interlayer insulating layer,
wherein a first portion of the liner layer on the cell region is interposed between the pair of cell gate electrodes and the device isolation layer, and
wherein a second portion of the liner layer on the dummy region and the border region is interposed between the substrate and the device isolation layer.

14. The semiconductor device of claim 13, wherein a side surface of the first gate spacer is in contact with a side surface of the active contact.

15. The semiconductor device of claim 13, wherein a top surface of the dam structure, a top surface of the active contact, and a top surface of the dummy contact are coplanar with each other.

16. The semiconductor device of claim 13, wherein the dam structure comprises at least one of silicon oxynitride (SiON), silicon carbon nitride (SiCN), silicon carbon oxynitride (SiCON), and silicon nitride (SiN).

17. The semiconductor device of claim 13, wherein a distance between the pair of cell gate electrodes is less than a distance between the pair of dummy gate electrodes.

18. A semiconductor device, comprising:

a substrate comprising a cell region, a dummy region spaced apart from the cell region in a first direction, and a border region interposed between the cell region and the dummy region;

an active pattern on the cell region of the substrate;

a device isolation layer defining the active pattern that extends in the first direction;

a pair of source/drain patterns on the active pattern and spaced apart from each other in the first direction;

a channel pattern between the pair of source/drain patterns;

a cell gate electrode on a top surface and opposite side surfaces of the channel pattern that extends in a second direction crossing the first direction;

a first gate spacer covering opposite side surfaces of the cell gate electrode;

an active contact electrically coupled to at least one of the pair of source/drain patterns;

a dummy gate electrode on the dummy region and on the device isolation layer;

a second gate spacer covering opposite side surfaces of the dummy gate electrode;

a dummy contact on a side surface of the dummy gate electrode;

an interlayer insulating layer interposed between the second gate spacer and the dummy contact;

a dam structure disposed on the border region and on the device isolation layer; and a liner layer extending from the cell region to the border region and the dummy region, wherein an upper portion of the active pattern vertically protrudes above the device isolation layer, wherein a level of a bottom surface of the dam structure is lower than a level of a bottom surface of the active contact, wherein a first portion of the liner layer on the cell region is interposed between the active pattern and the device isolation layer, and wherein a second portion of the liner layer on the dummy region and the border region is interposed between the substrate and the device isolation layer.

19. The semiconductor device of claim 18, wherein the interlayer insulating layer comprises silicon oxide, and the dam structure comprises a material having an etch selectivity with respect to the silicon oxide.

20. The semiconductor device of claim 18, wherein a side surface of the active contact is in contact with a side surface of the first gate spacer.

* * * * *